United States Patent [19]
Goetting

[11] Patent Number: 5,646,547
[45] Date of Patent: *Jul. 8, 1997

[54] LOGIC CELL WHICH CAN BE CONFIGURED AS A LATCH WITHOUT STATIC ONE'S PROBLEM

[75] Inventor: F. Erich Goetting, Cupertino, Calif.

[73] Assignee: Xilinx, Inc., San Jose, Calif.

[*] Notice: The term of this patent shall not extend beyond the expiration date of Pat. No. 5,219,254.

[21] Appl. No.: 548,654

[22] Filed: Oct. 26, 1995

Related U.S. Application Data

[63] Continuation of Ser. No. 234,764, Apr. 28, 1994, abandoned.

[51] Int. Cl.$^6$ ............................................. H03K 3/289
[52] U.S. Cl. ............................. 326/46; 326/37; 327/198; 327/199
[58] Field of Search .................. 307/272.2, 480, 307/465, 465.1; 326/37, 46, 21, 93, 96; 327/198–202, 205

[56] References Cited

U.S. PATENT DOCUMENTS

| | | | |
|---|---|---|---|
| 3,473,160 | 10/1969 | Wahlstrom | 340/801 |
| 4,628,217 | 12/1986 | Berndt | 307/272 |
| 4,786,824 | 11/1988 | Masuda | 307/290 |
| 4,849,653 | 7/1989 | Imai et al. | 307/290 |
| 4,912,348 | 3/1990 | Maki et al. | 307/465 |
| 4,933,575 | 6/1990 | Aso | 307/465 |
| 5,028,821 | 7/1991 | Kaplinsky | 307/465 |
| 5,107,137 | 4/1992 | Kinugasa et al. | 307/272.2 |
| 5,319,254 | 6/1994 | Goetting | 307/272.2 |

FOREIGN PATENT DOCUMENTS

| | | |
|---|---|---|
| A0219907 | 10/1986 | European Pat. Off. . |
| 0219907 | 4/1987 | European Pat. Off. . |

OTHER PUBLICATIONS

D. E. Smith et al, "Regain Lost I/O Ports with Erasable PLD's", Electronic Design, vol. 35, No. 7, Mar. 19, 1987, pp. 151–154.

Birkner, J.; Chang, A.; Chua, H.T.; Chao, A.; Gordon, K; Kleinman, B.; Kolze, P. and Wong, R.; "A Very High–Speed Field Programmable Gate Array Using Metal–to–Metal Antifuse Programmable Elements", QuickLogic Corporation, paper 1.7, Session 1, pp. 1–6, IEEE 1991 Custom Integrated Circuits Conf., May 12, 1991.

*Primary Examiner*—Edward P. Westin
*Assistant Examiner*—Jon Santamauro
*Attorney, Agent, or Firm*—Adam H. Tachner, Esq.; Edel M. Young

[57] ABSTRACT

A latch may be formed as a two-part structure, one part for data input and one part for feeding back the data to form the latch. A clock signal controls whether data from a data input terminal will be forwarded to the output or whether the output signal will be provided as input and forwarded, thus forming the latch. A problem called the static ones hazard, namely registering a logical 0 when data input is logical 1, can occur with a latch of this logic structure when the circuit is entering the latch mode. In accordance with the invention, this static ones hazard is avoided by controlling trip points in the gates of the cell and input buffers of the cell so that the cell implements a make-before-break transition.

3 Claims, 44 Drawing Sheets

LATCH WITH CLEAR

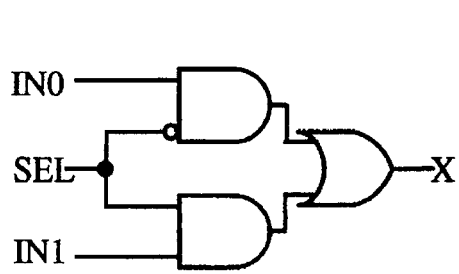
MULTIPLEXER
FIG. 5A
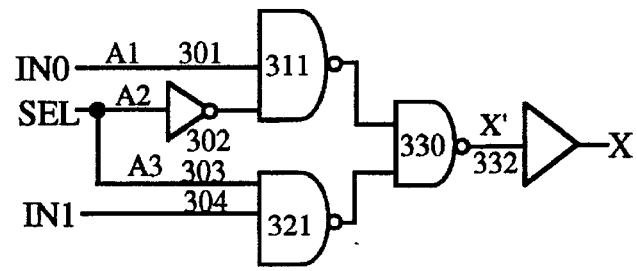
FIG. 5C
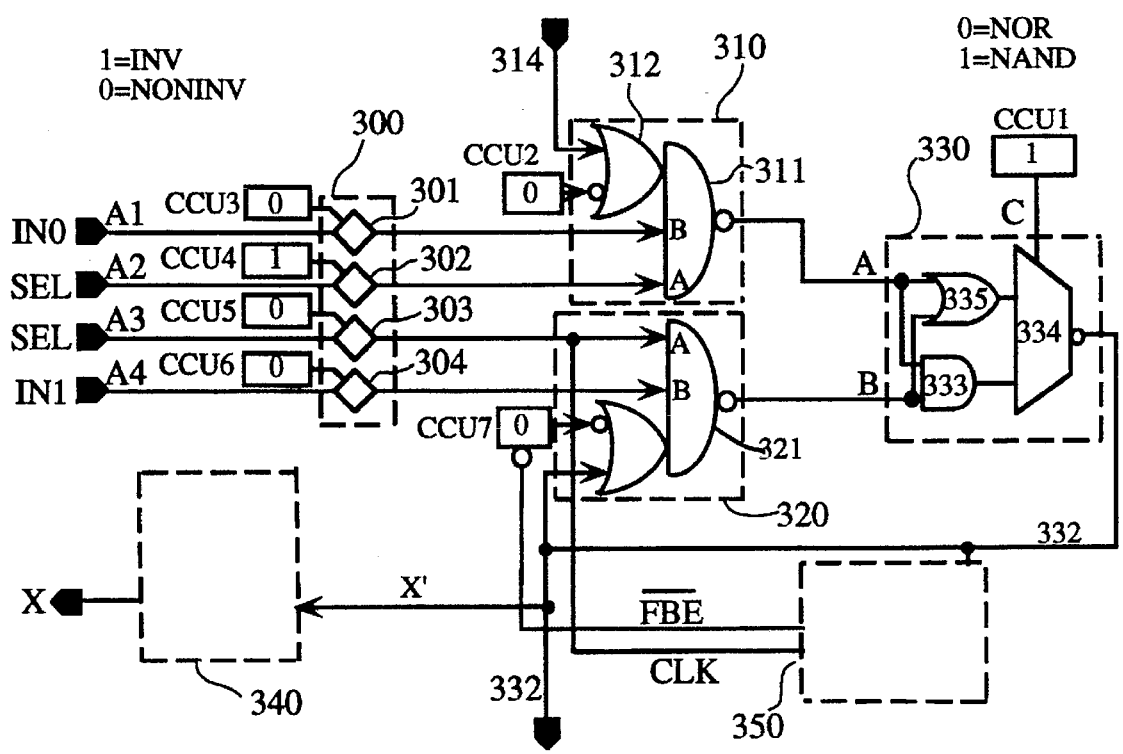
FIG. 5B    MULTIPLEXER

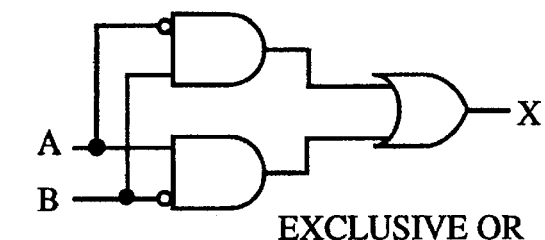
FIG. 6A EXCLUSIVE OR
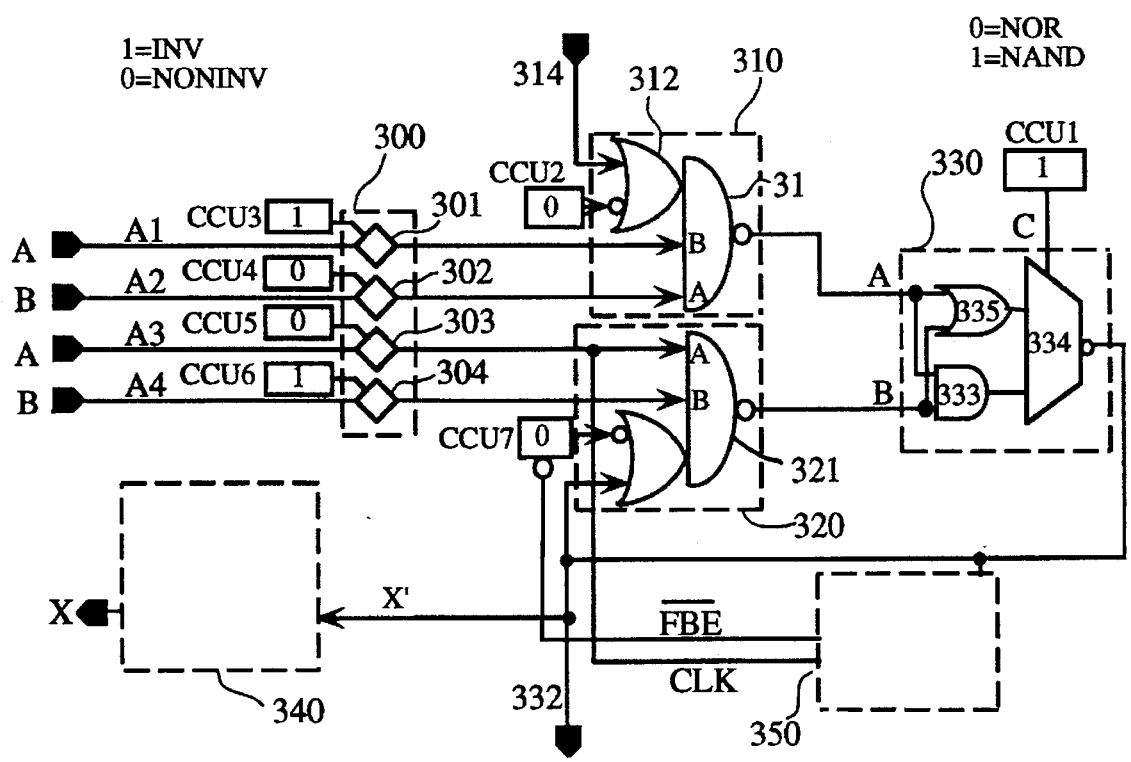
FIG. 6B EXCLUSIVE OR

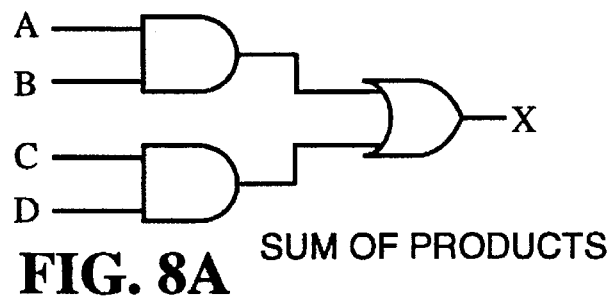
FIG. 8A SUM OF PRODUCTS
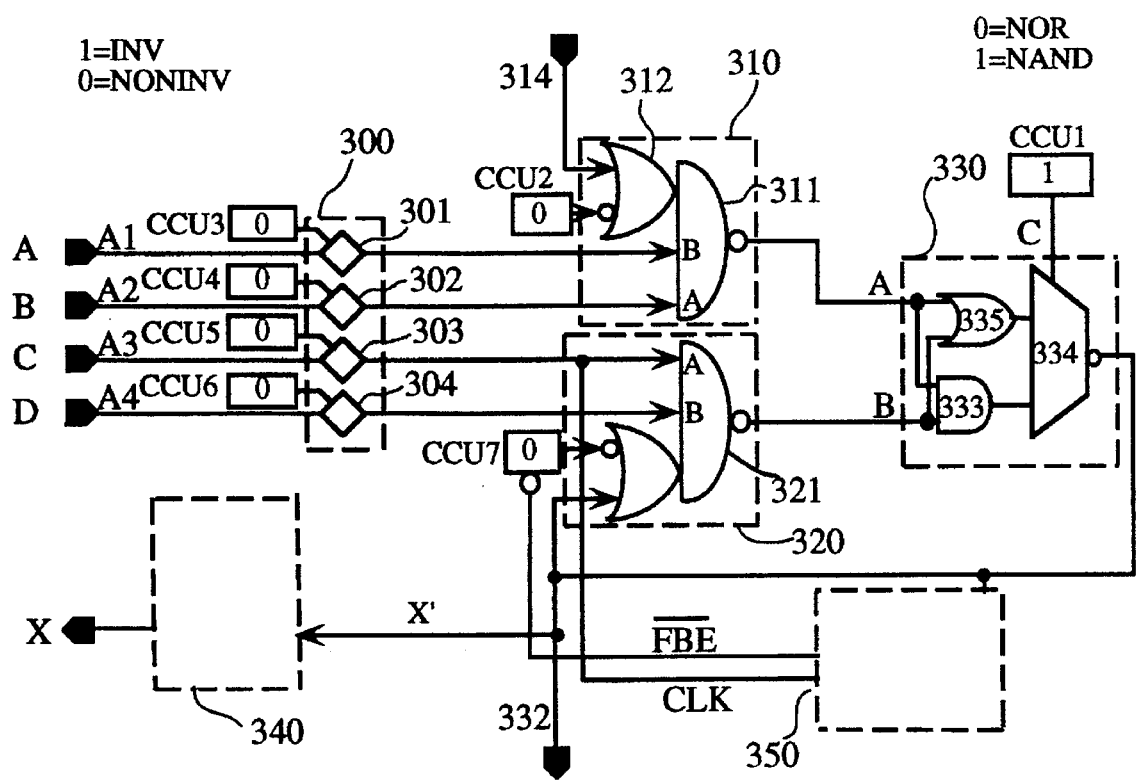
FIG. 8B

LATCH WITH CLEAR

FIG. 9D LATCH WITH CLEAR, OPPOSITE LATCHING SENSE

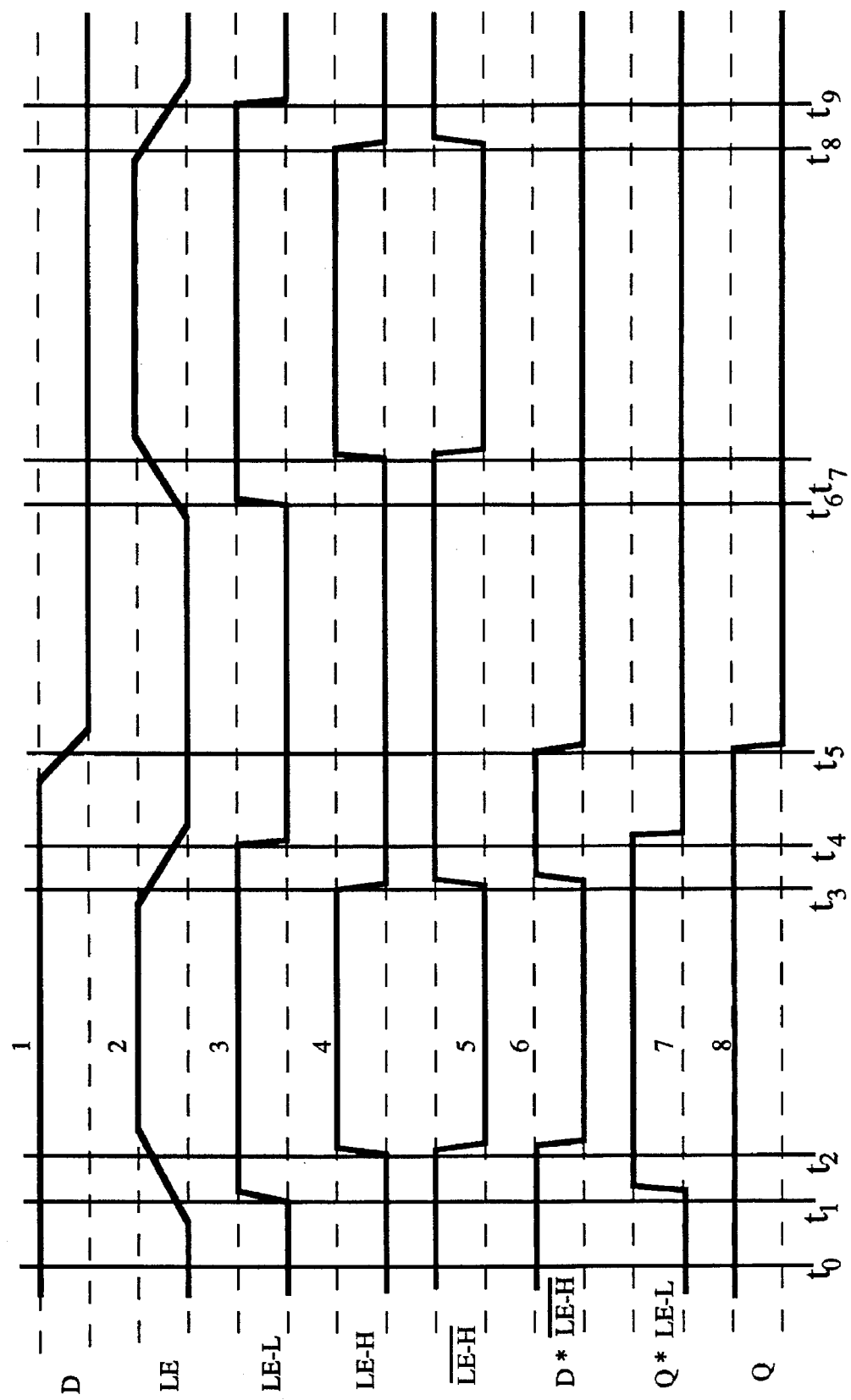

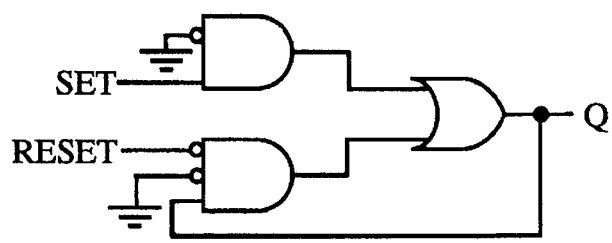
FIG. 10A SET / RESET LATCH
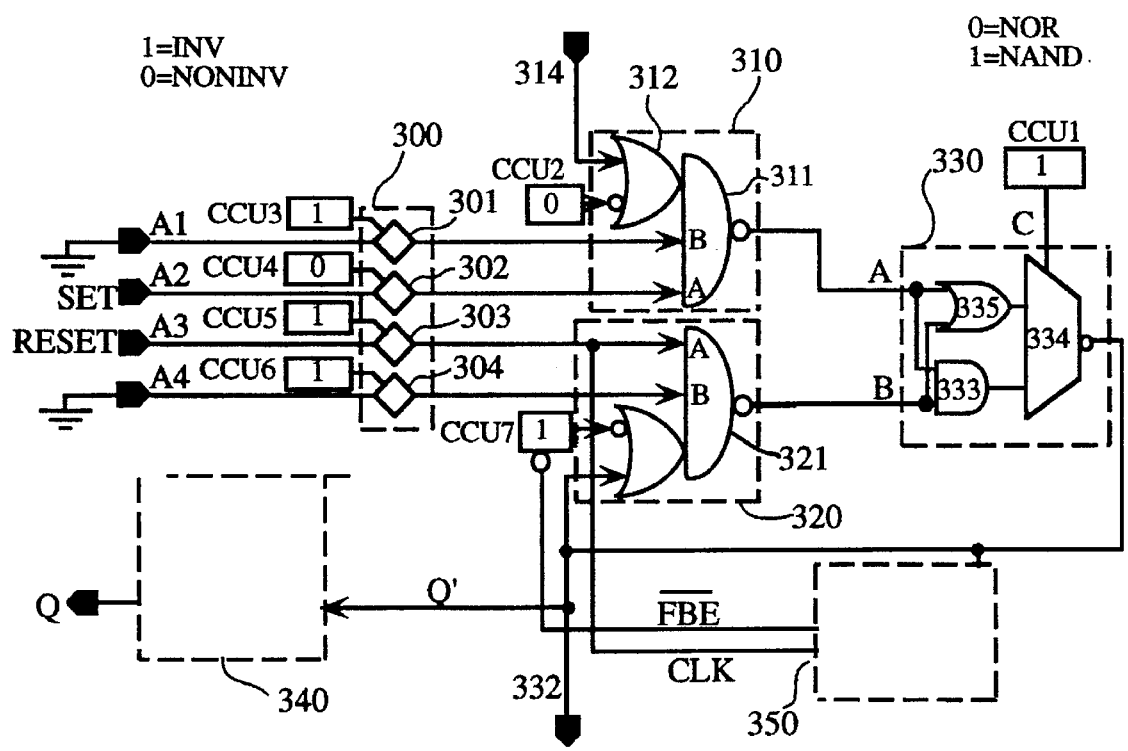
FIG. 10B

4-INPUT AND GATE
1 INVERTED INPUT

8-INPUT AND

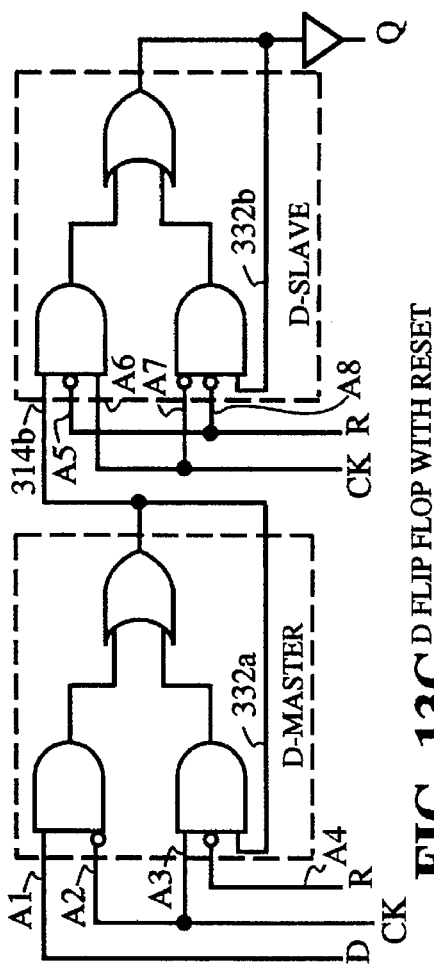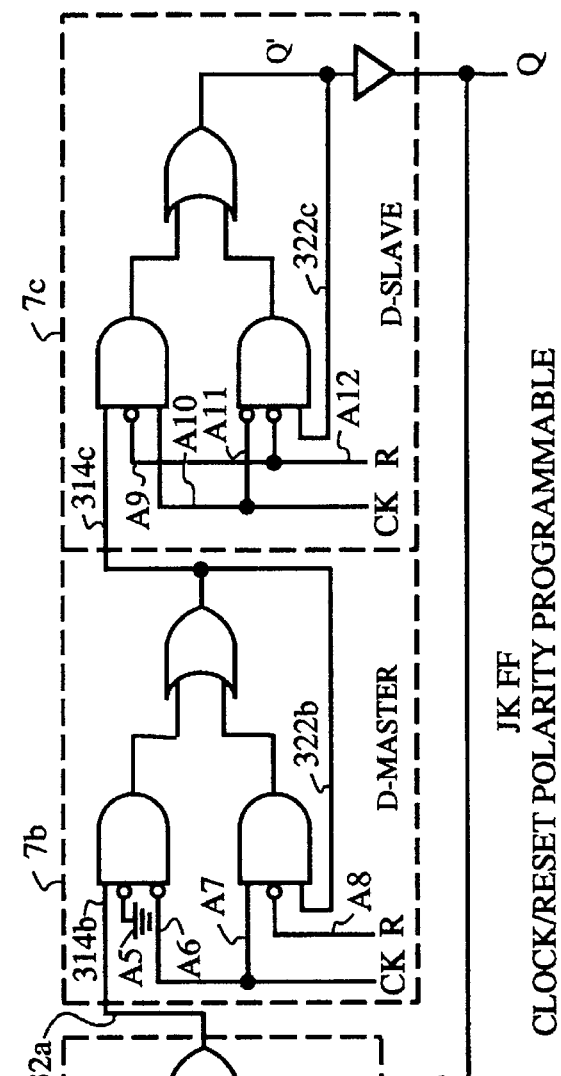
FIG. 13A
D FF
WITH RESET
FIG. 13C D FLIP FLOP WITH RESET
CLOCK/RESET POLARITY PROGRAMMABLE
FIG. 14A
JK FF
WITH RESET
FIG. 14C JK FF
CLOCK/RESET POLARITY PROGRAMMABLE

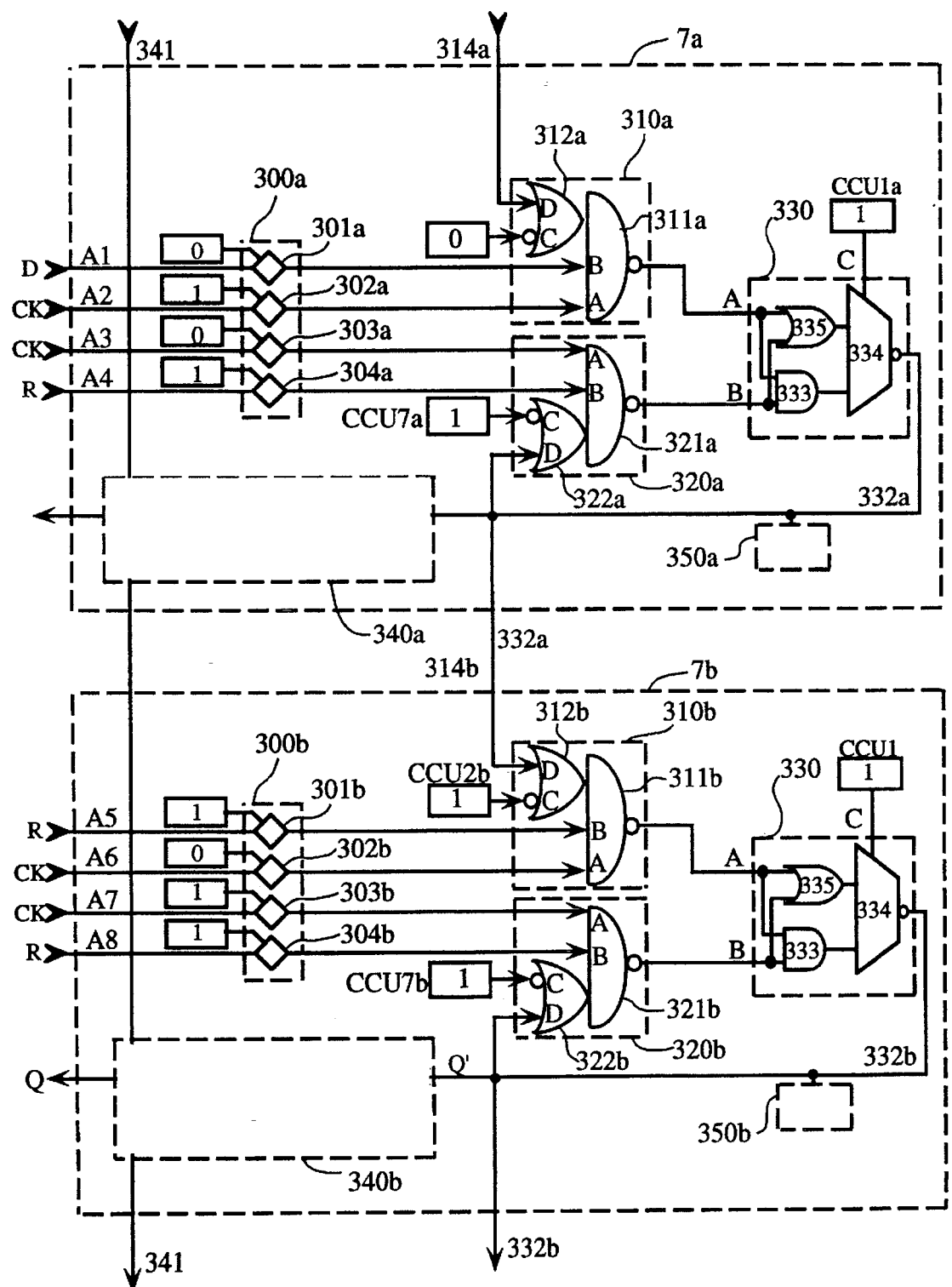
FIG. 13B  D FLIP FLOP WITH RESET

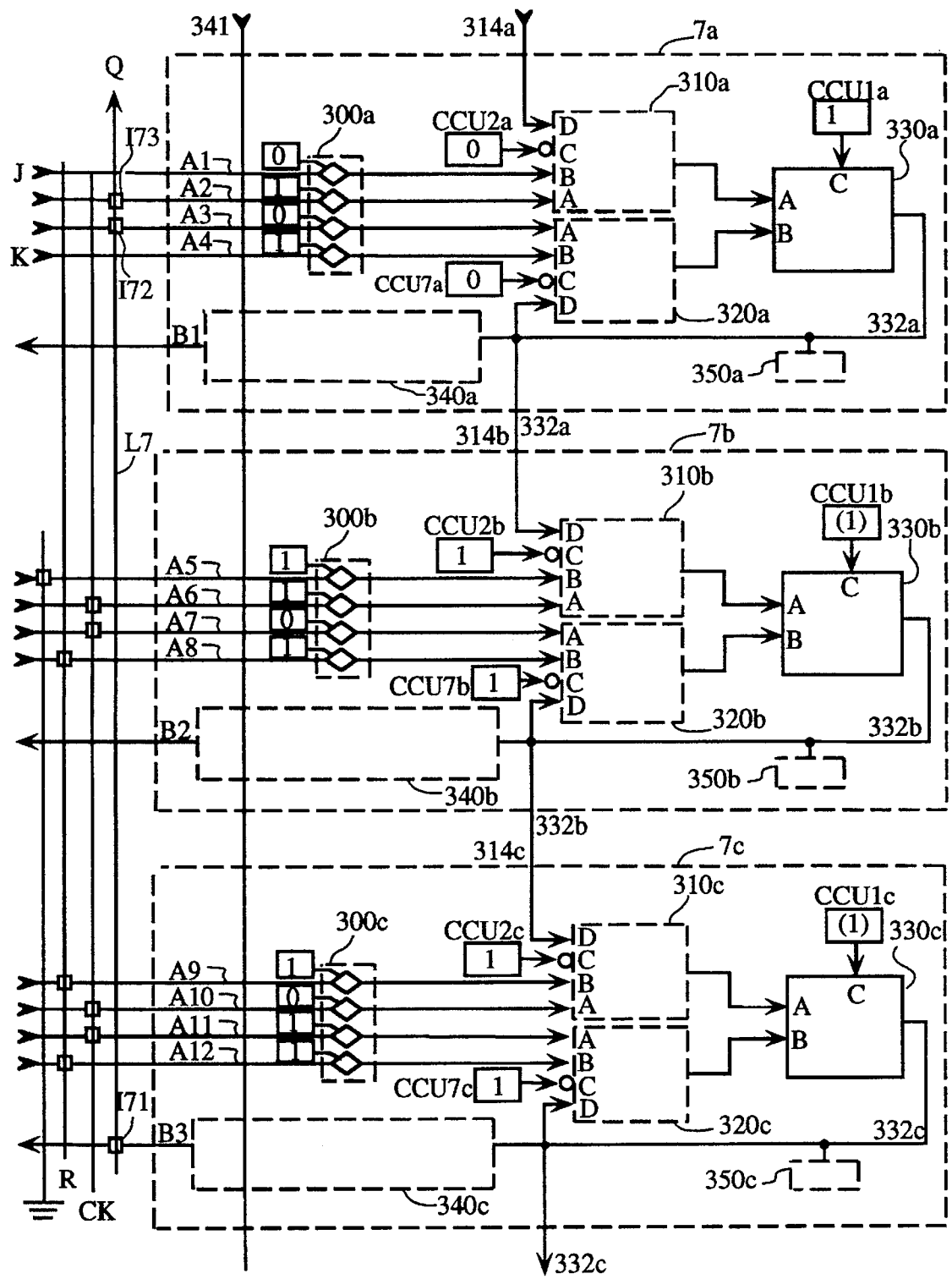
FIG. 14B JK FLIP FLOP

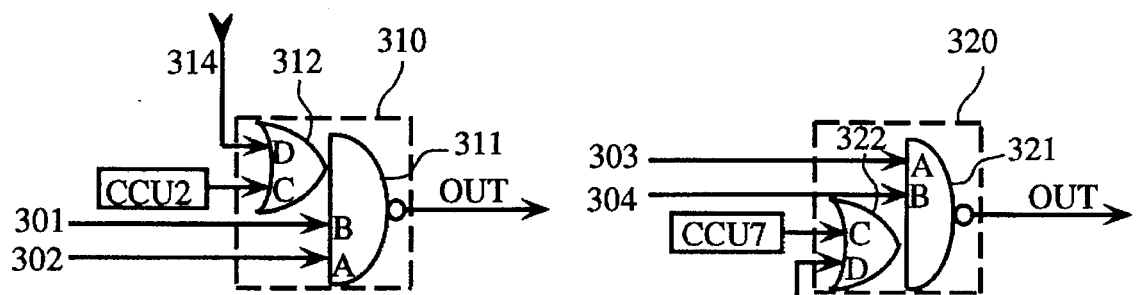
FIG. 16A
FIG. 16B
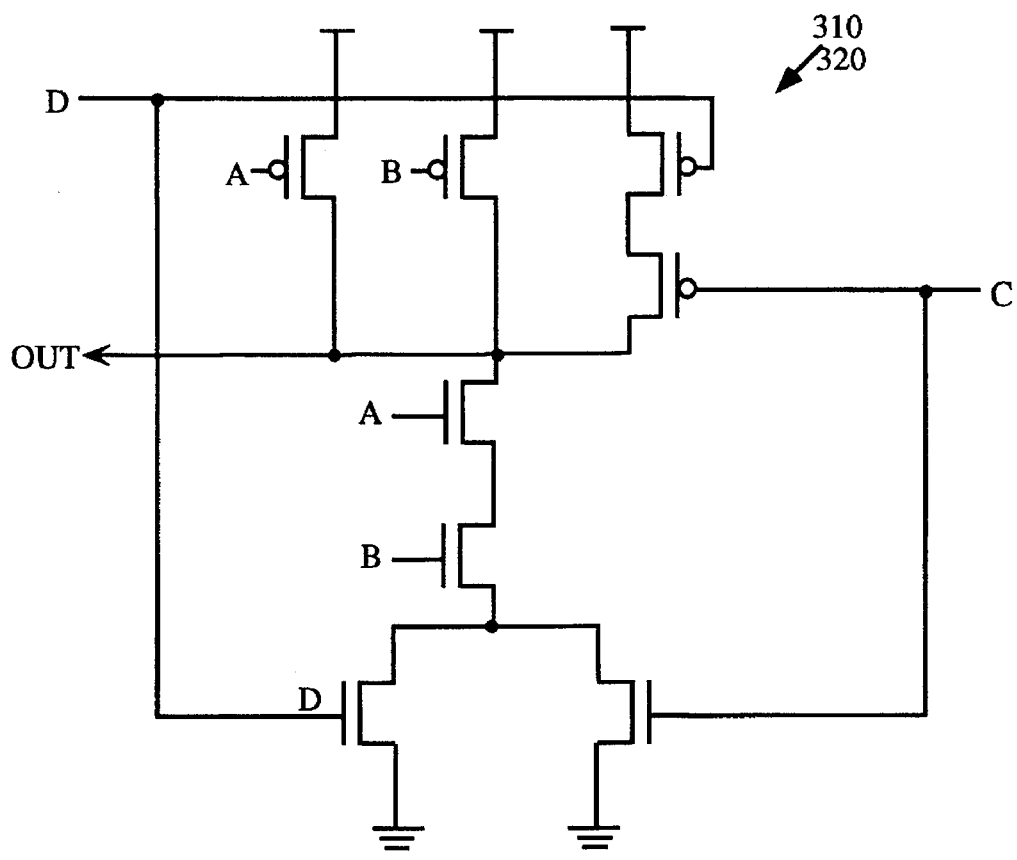
FIG. 16C

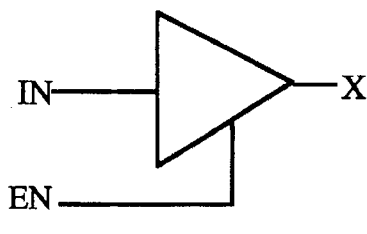
FIG. 20A 3-STATE BUFFER
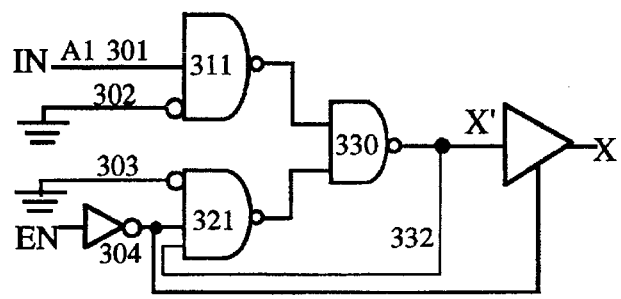
FIG. 20C
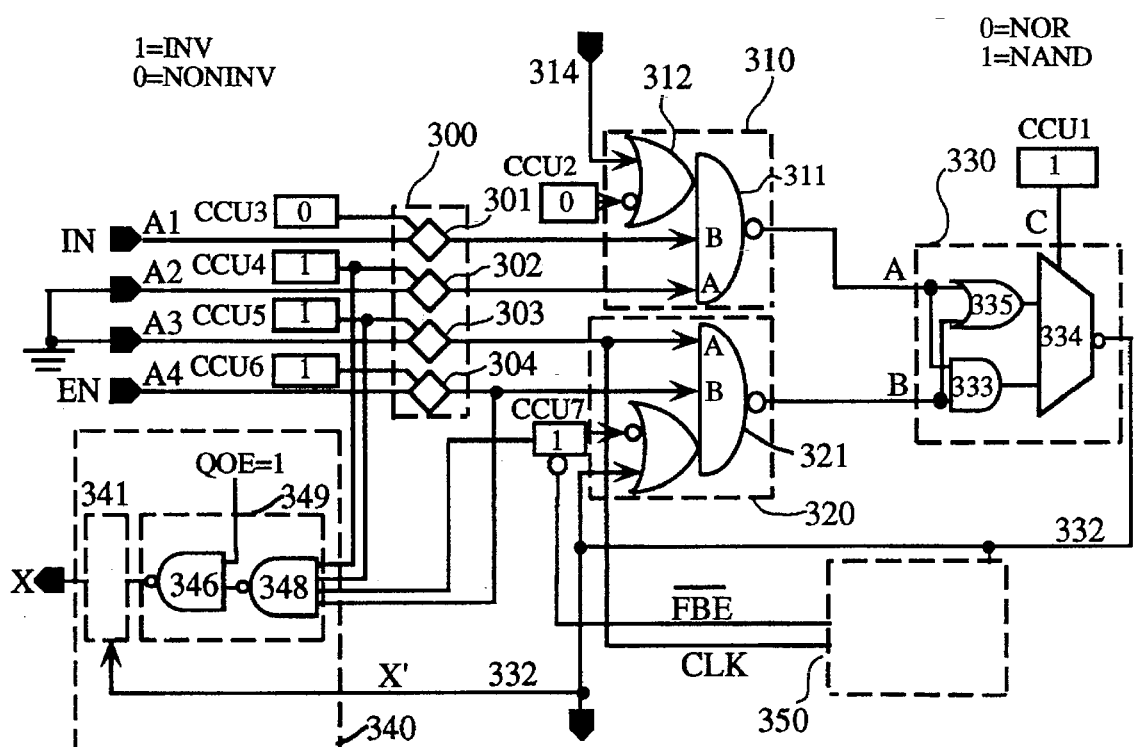
FIG. 20B 3-STATE BUFFER

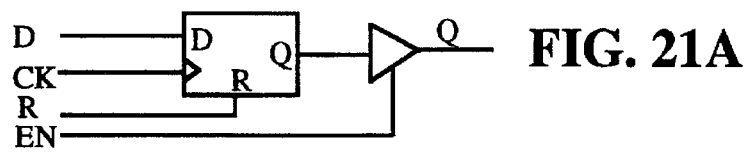
FIG. 21A
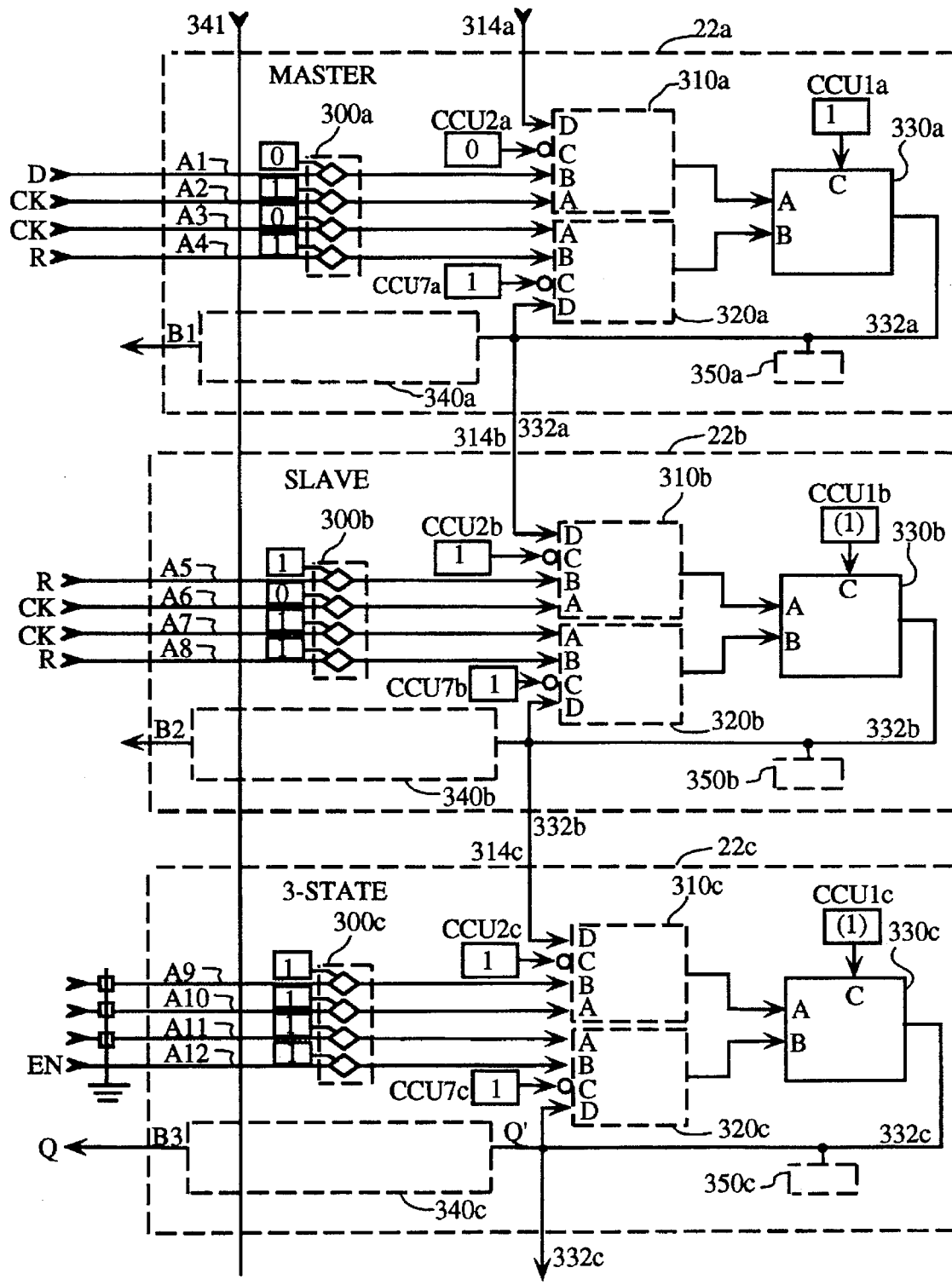
FIG. 21B     D FLIP FLOP WITH 3-STATE

CAPTURE TIMING

| 27A | 27B | 27C | 27D | 27E |
|-----|-----|-----|-----|-----|
| 27F | 27G | 27H | 27I | 27J |

LOGIC CELL WHICH CAN BE CONFIGURED AS A LATCH WITHOUT STATIC ONE'S PROBLEM

This application is a continuation of application Ser. No. 08/234,764, filed Apr. 28, 1994, now abandoned.

RELATED APPLICATION INFORMATION

This application relates to commonly owned concurrently filed U.S. Patent applications:

1. Ser. No. 07/919,332, entitled "COMPACT LOGIC CELL FOR FIELD PROGRAMMABLE GATE ARRAY CHIP" invented by F. Erich Goetting, David B. Parlour, and Stephen M. Trimberger [docket number M-1743-0]

2. Ser. No. 07/919,658, entitled "LOGIC CELL FOR FIELD PROGRAMMABLE GATE ARRAY HAVING OPTIONAL INTERNAL FEEDBACK AND OPTIONAL CASCADE" invented by F. Erich Goetting and Stephen M. Trimberger, [docket number M-1743-1]

3. Ser. No. 07/919,812, entitled "LOGIC CELL FOR FIELD PROGRAMMABLE GATE ARRAY HAVING OPTIONAL INPUT INVERTERS", invented by F. Erich Goetting, [docket number M-1743-2]

4. Ser. No. 07/919,407, entitled "CONTROL UNIT FOR PROGRAMMING A FIELD PROGRAMMABLE GATE ARRAY AND READING ARRAY STATUS", invented by F. Erich Goetting, [docket number M-1743-3] and

FIELD OF THE INVENTION

The invention relates to programmable logic devices formed in integrated circuit semiconductor chips. More particularly, the invention relates to logic cells which are part of field programmable gate array chips.

BACKGROUND OF THE INVENTION

Programmable devices are currently available in several different architectures. Earliest of the programmable devices are the programmable logic array (PLA) devices which comprise a plurality of AND gates programmably connected to a second plurality of OR gates. These devices can generate any combinational logic function, because any combinational logic function can be written as a sum of products, the products being generated in the AND array and the sums being generated in the OR array. These two level logic devices (one AND level and one OR level) are simple to program, and it is easy to predict the time delay for generating an output. However, the silicon area needed to calculate a complex logic function can be undesirably large.

More recently, programmable logic devices called field programmable gate arrays or FPGAs have been developed. These devices comprise an array of programmable logic cells which can be interconnected by programmable interconnect lines to generate complex logic functions. In an FPGA device, a function need not be calculated as a two-level sum of products because it is possible to feed the output of any one logic cell to an input of any other logic cell, and thereby form a chain, generating a function which has multiple levels of logic. Thus it is possible to implement complex logic in a smaller physical area.

Several architectures of these field programmable logic devices are available today. The various devices differ in the complexity of a single logic cell. Some manufacturers offer devices having logic cells such as shown in FIG. 1 which are quite small (fine grained architecture). Others offer devices having logic cells such as shown in FIG. 2 which are considerably larger and which handle larger functions within a single logic block (coarse grained architecture).

A small logic cell such as shown in FIG. 1 has the advantage of being able to be completely filled by the logic of a user, and thereby not leave unused logic resources within the cell. It may be possible to generate either combinational or sequential functions from a plurality of small logic cells. However, with fine grained architectures made up of small logic cells, it requires many logic cells to generate a complex logic function. A function which must make use of more than one logic cell must use programmable interconnect line to generate the function. When the signal path passes through resistive programmable elements, the time delay associated with capacitive and resistive interconnect line considerably slows down the response of the sequential function.

The larger celled (coarse grained) logic devices can generate complex functions quickly within a single logic block. However, if the user specifies a set of functions which do not make full use of the rather large logic cell, portions of the logic cell will be unused. Also, some of the fairly large logic cells include separate resources for generating combinational functions and for generating sequential functions. The cell of FIG. 2 is such a cell. If a user wants a circuit which uses many combinational functions and few sequential functions, many sequential resources will be unused. Likewise, if the user wants many sequential functions and few combinational functions, many combinational functions will go unused.

Another significant consumer of silicon faced by designers is that signals must be inverted, and using a configurable cell to generate an inverter consumes resources otherwise available for more powerful functions. Prior efforts have been made to provide dedicated hardware for the invert function. A structure described by Quicklogic in a publication entitled pASIC™ 1 Family ViaLink™ Technology Very High Speed CMOS FPGAs published May 1991 shows a programmable structure using two-input AND gates which have one inverted input and one non-inverted input. This structure thus gives a choice of applying a signal to the inverted or the non-inverted input. Though this solution allows for applying signals to both the inverted and noninverted inputs, when used simply to offer an optional inversion, this solution doubles the number of input lines needed. Thus using the above structure to achieve optional inverters adds considerable silicon area and complexity to a cell.

Sequential functions are typically formed from latches. A latch may be formed as a two-part structure, one part for data input and one part for feeding back the data to form the latch. A clock signal controls whether data from a data input terminal will be forwarded to the output or whether the output signal will be provided as input and forwarded, thus forming the latch. A problem called the static ones hazard, namely registering a logical 0 when data input is logical 1, can occur with a latch of this logic structure when the circuit is entering the latch mode.

SUMMARY OF THE INVENTION

According to the present invention, a logic cell is provided in which sequential functions may be generated. Under control of a clock signal, an output signal can be fed back as input and thereby latched into the feedback path, or a data signal can be forwarded to the output and not latched. The latch includes an input section which receives a data input signal and a feedback section. When the cell is in a latching mode, the circuit feeds back the output signal. To switch between the transparent mode in which an input data signal is forwarded to the output terminal and the latching mode in which the output signal is fed back as an input signal, a clock signal enables one section and disables the other.

Depending upon the particular transistors used to implement the gates of the cell, a transition of a latch enable signal from the transparent mode to the latched mode may cause a logical zero to be latched when a logical one was present on the data input line. This is called the static ones hazard and occurs because a switching latch enable signal can cause a logical 0 signal to appear at the output of the data input section before the logical 1 data has been captured into the feedback section. Thus a logical 0 is erroneously captured. Such an error must be avoided of course.

In accordance with the invention, this static ones hazard is avoided by controlling trip points in the gates of the cell so that the cell implements a make-before-break transition. A trip point may be defined for an inverter as that voltage at which the input voltage is equal to the output voltage.

If the inverters have relatively low trip points and logic gates have relatively high trip points, a static ones' error is found to occur. If the inverters have a higher trip point and the logic gates have a lower trip point, the Q output signal is found to properly follow the D input signal through the positive and negative shifts of the clock signal. By manufacturing inverters at the cell input to have higher trip points than trip points of the logic gates which forward the input data or the feedback data, the static one's problem is avoided. This combination of trip points produces correct results for both a fast-changing clock signal and a slow-changing clock signal.

BRIEF DESCRIPTION OF THE DRAWINGS

FIGS. 5A–5C show a two-input multiplexer and its implementation using the cell of FIG. 3.

FIGS. 6A and 6B show an exclusive-OR gate and its implementation using the cell of FIG. 3.

FIGS. 8A and 8B show a sum-of-products circuit and its implementation using the cell of FIG. 3.

FIGS. 9A and 9E show a latch with clear having the opposite clock polarity from that of FIGS. 9A–9C.

FIG. 9H shows a timing diagram which avoids the static ones problem of FIG. 9G by properly controlling the trip points of the inverters and NAND gates of FIG. 3.

FIGS. 10A and 10B show a set-reset latch and its implementation using the cell of FIG. 3.

FIGS. 13A–13C show a D flip flop and its implementation using two of the cells of FIG. 3 interconnected using the cascade feature, and latching using the feedback feature of the cells.

FIGS. 14A–14C show a JK flip flop and its implementation in three cells of FIG. 3, using the cascade and feedback functions to form the master-slave portions of the flip flop and a third cell connected through general interconnect to form the J and K functions of the flip flop.

FIGS. 16A and 16B show combinational stages 310 and 320 of FIG. 3.

FIG. 16C shows one way of forming the combinational stages 310 and 320 of FIG. 3.

FIGS. 20A–20C show a 3-state buffer, its implementation in the cell of FIGS. 18A and 18B or the cell of FIG. 19, and the equivalent circuit.

FIGS. 21A and 21B show a commonly used D-flipflop with a 3-state buffer on its output, and its implementation using the present invention.

FIG. 27, which comprises

DETAILED DESCRIPTION OF THE PREFERRED EMBODIMENT

Figure 1:
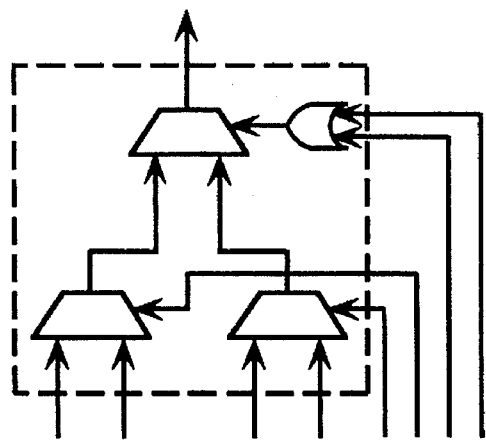
FIG. 1 shows a prior art logic cell having a small cell size.
Figure 2:
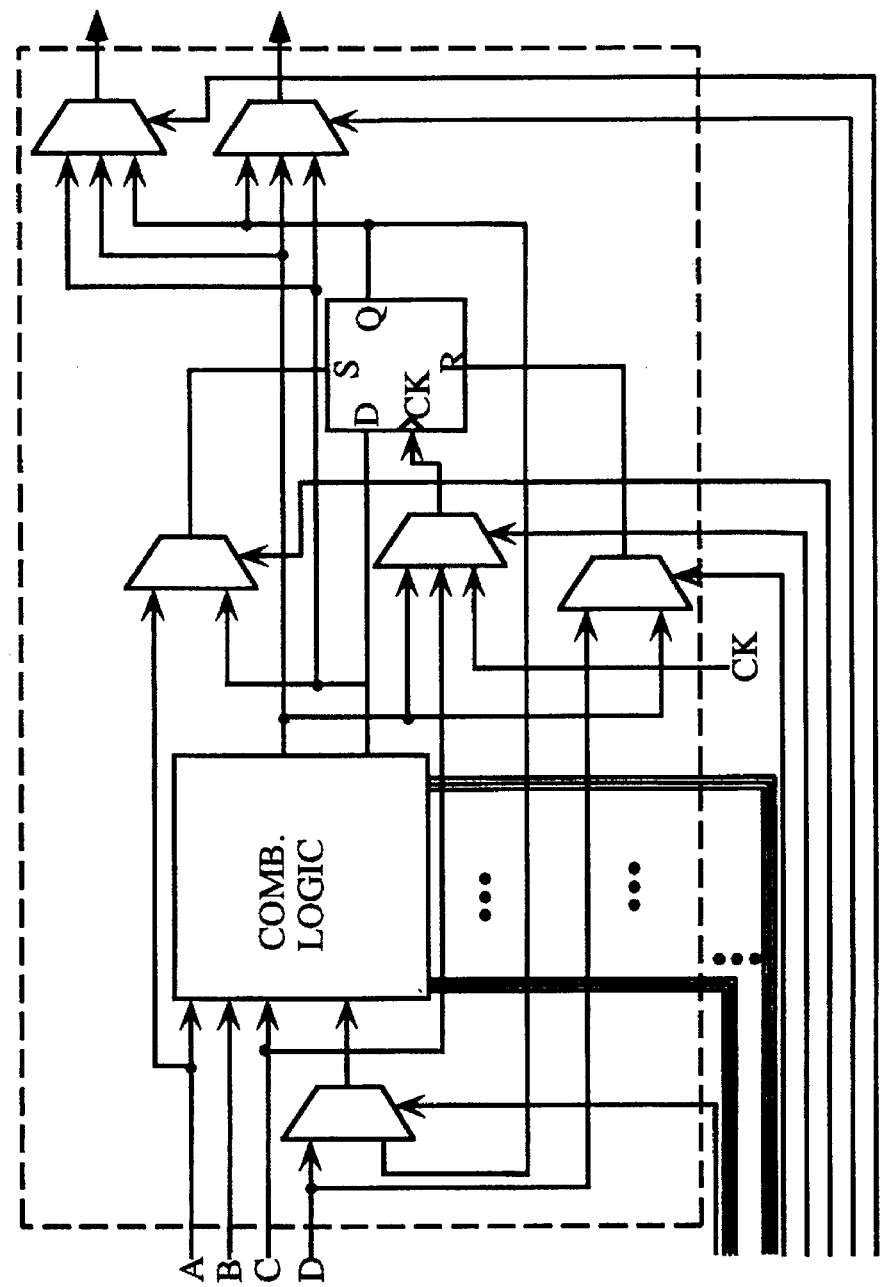
FIG. 2 shows a prior art logic cell having a large cell size as used in the Xilinx 3000 series parts.
Figure 3:
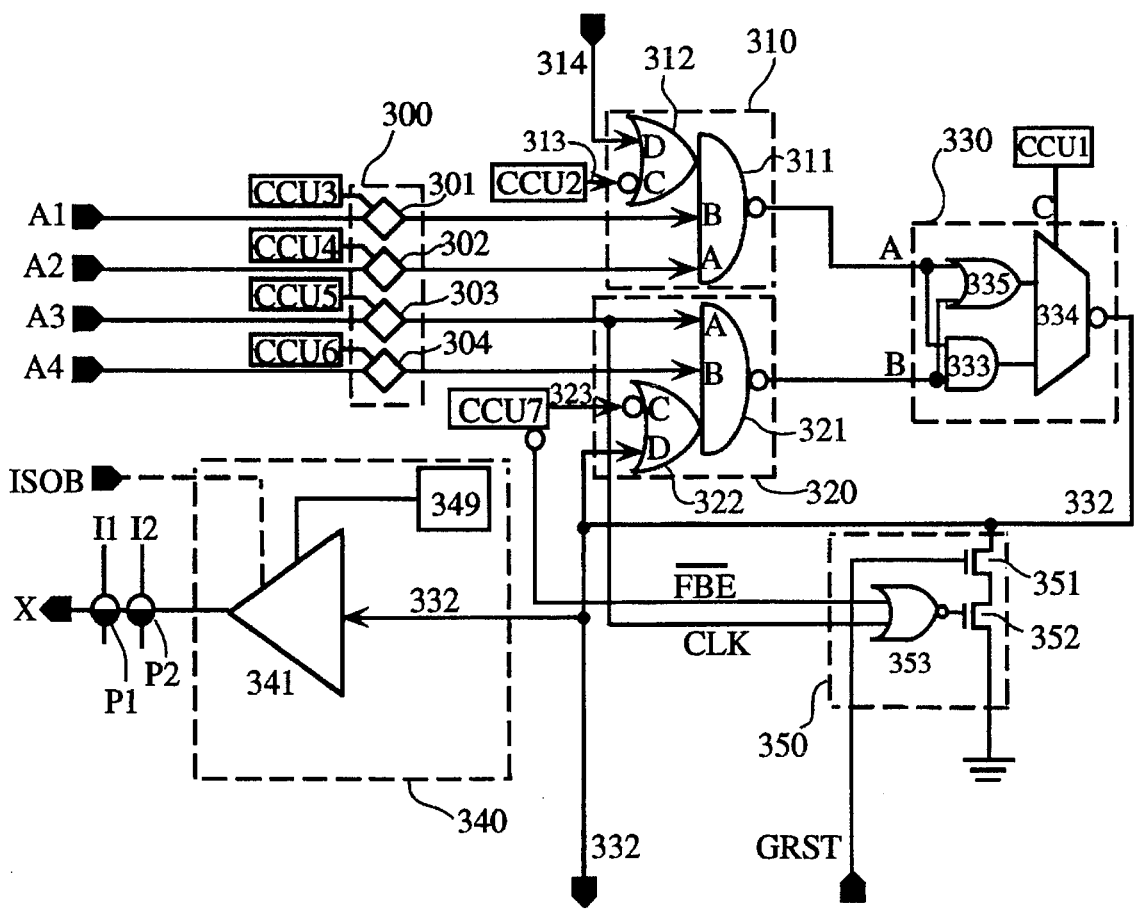
FIG. 3 shows a logic cell according to the present invention.

The logic cell of FIG. 3 comprises seven major sections:

(1) a programmable input inverter stage 300, (2) a cascade-in first combinational stage 310, (3) a feedback first combinational stage 320, (4) a second combinational stage 330, (5) an output driver stage 340, (6) a selective global reset circuit 350, and (7) a set of configuration control units CCU1 through CCU7 for controlling the configuration of the cell.

Overview of the Seven Sections of FIG. 3

Input buffer stage 300 comprises four input buffers 301 through 304, each of which can be inverting or non-inverting as selected by the user. Providing optional inverters at every input allows the elimination of inverters at the outputs, thus combinational logic resources never need be used simply for the purpose of inverting a signal.

Cascade-in first combinational stage 310 comprises a 3-input NAND gate 311 and a 2-input OR gate 312. OR gate 312 receives a cascade enable control input 313 and a cascade input 314 from an adjacent cell. OR gate 312 provides input to NAND gate 311. Also provided as input to NAND gate 311 are outputs from selectively inverting input buffers 301 and 302.

Feedback first combinational stage 320 also comprises a three-input NAND gate 321 fed by output signals from selectively inverting input buffers 303 and 304. NAND gate 321 further receives input from OR gate 322 which receives on one of its input terminals a feedback signal 332 and on another input terminal a feedback enable control input 323.

Second combinational stage 330 can be programmed to provide a NAND or a NOR function of outputs from the cascade combinational stages 310 and 320. Second combinational stage 330 provides an output signal 332 which can be fed back by OR gate 322 to AND gate 321, can further be provided as a cascade OUT signal which becomes a cascade IN signal to an adjacent cell, and which is provided to output driver stage 340, where it can be driven onto the interconnect structure and used as input to other cells.

Output driver stage 340 includes a buffer 341 of sufficient strength to drive the output signal onto an interconnect structure represented in FIG. 3 by interconnect lines I1 and I2. The connection from a cell output to an interconnect line includes means 349 for providing a high impedance to the interconnect line. That way, an interconnect line can serve as a bus, receiving signals alternately from a plurality of sources, which is a common structure in large circuits. In one embodiment a second means ISOB provides a high impedance to the interconnect line.

Global reset circuit 350 allows the cell to be reset when used as a latch or flip flop. Circuit 350 includes means for pulling low the output 332 of second combinational stage 330 in response to a global reset signal. It is necessary to reset only the cells which are used as latches or flip flops in the array. Thus circuit 350 provides a reset voltage only when feedback stage 320 is configured as a latch, and only at the part of a clock cycle when the cell is latching and is not in the data receive mode. The circuit adds minimum capacitance when inactive and draws minimum power when resetting the array.

Configuration control units CCU1 through CCU7 are used for three purposes: first for applying programming voltages to antifuses in the interconnect structure, second for storing configuration information which configures the cell during normal operation, and third for allowing a user to capture the status of all signals on interconnect lines and shift these out of the chip to be examined by the user.

Figure 4:
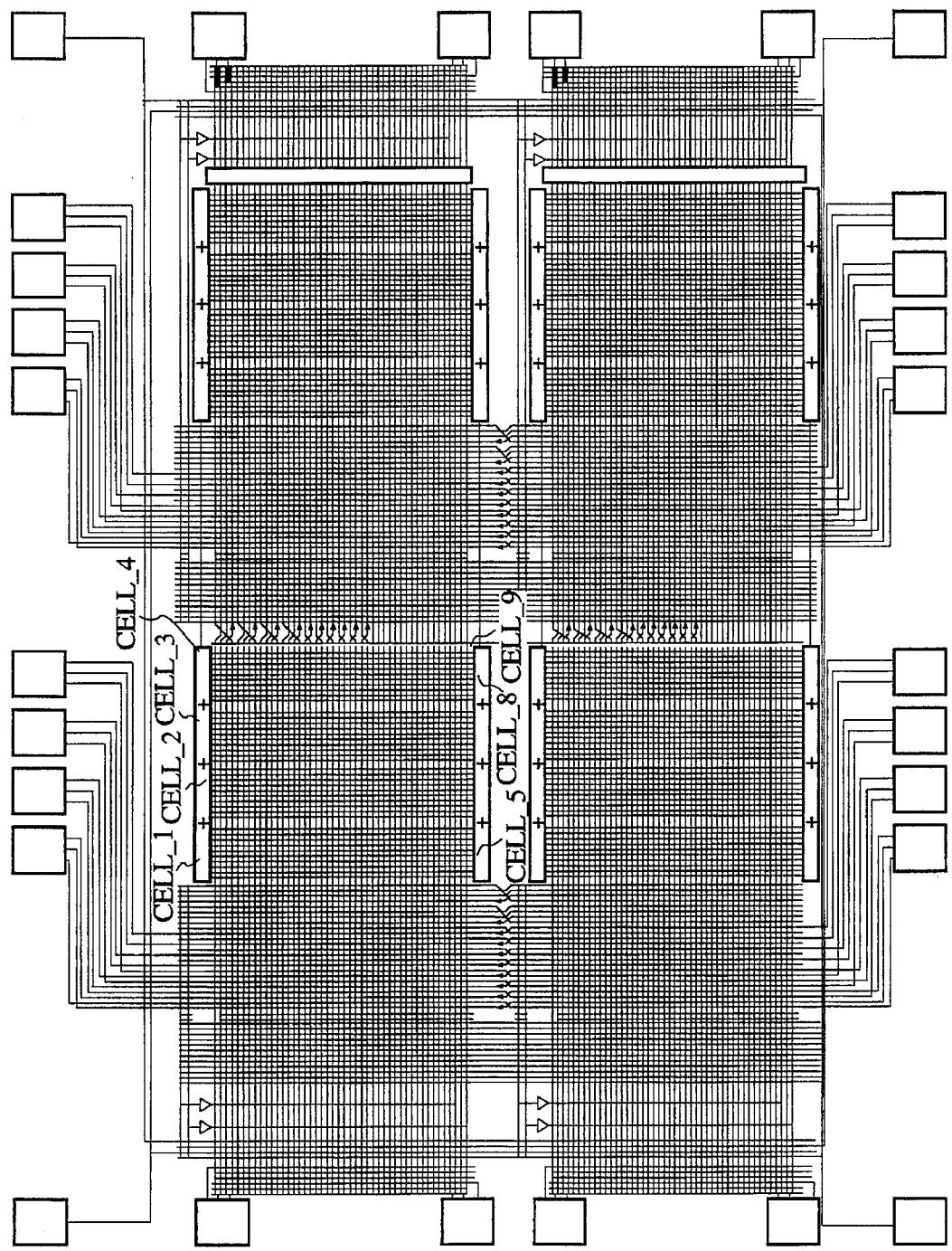
FIG 4 shows a very small field programmable integrated circuit device made up of the cells of FIG. 3.

As shown in FIG. 4, the cells of FIG. 3 are preferably grouped into blocks of eight cells CELL_1 through CELL_8 with a ninth cell CELL_9 comprising a plurality of CCUs. The nine cells of a block combine with an antifuse interconnect structure (antifuses are represented by black dots) which can be programmed to interconnect the cells to each other to implement a circuit design desired by a user. Four cell blocks are shown in FIG. 4. A typical integrated circuit array will comprise 100 to 1000 of these cell blocks such as shown in FIG. 4, plus peripheral I/O circuitry, clock oscillators, and other overhead circuitry usually positioned along the perimeter of the cell. Logic implemented in each cell CELL_1 through CELL_8 is controlled by the CCUs, as discussed below.

Example Implementations of the Circuits of FIGS. 5A through 14A Shown in FIGS. 5B through 14B Respectively FIGS. 5A through 11A show some of the functions which can be implemented in a single cell of FIG. 3. FIGS. 5B through 11B show the configuration control bits which are applied to the cell of FIG. 3 to implement the respective functions. It can be seen by tracing the signal path through the cell of FIG. 3 that none of the functions implemented in the cell of FIG. 3 use a signal path through an antifuse or other interconnect configuration means. Thus the cell offers fast implementation of these functions.

For example, FIG. 5A shows a two-input multiplexer having two inputs IN0 and IN1, and a select input SEL. FIG. 5B shows an implementation of this two-input multiplexer. Input IN0 is applied to line A1 and input IN1 is applied to line A4. Select input SEL is applied to lines A2 and A3. A logical 0 stored in the memory cell which controls configuration control unit CCU3 causes optional inverter 301 to be noninverting. (The configuration control units are discussed in more detail below.) Thus the value of IN0 is provided by optional inverter 301 to the B input of NAND gate 311. A logical 1 stored in the memory cell which controls configuration control unit CCU4 causes optional inverter 302 to invert the SEL select signal on line A2 and apply the inverted signal to the A input of NAND gate 311. The logical 0 controlling optional inverter 303 allows the SEL signal to be applied to the A input of NAND gate 321. Finally, the logical 0 controlling inverter 304 allows input IN1 to be passed noninverted to the B input of NAND gate 321.

Three more memory cells control the cell of the invention, as represented by CCU1, CCU2, and CCU7. A logical 0 in CCU2 is inverted at the input to OR gate 312, causing OR gate 312 to apply a high signal to NAND gate 311 regardless of the signal on line 314. Thus NAND gate 311 is configured as the logical equivalent of a two-input NAND gate, as shown in FIG. 5A. A logical 0 in CCU7, inverted at the input to NAND gate 321 disables the feedback loop, so that NAND gate 321 operates as a two-input NAND gate as shown in FIG. 5A. Finally, a logical 1 in CCU1 causes second combinational stage 330 to operate as a NAND gate. Recall that by deMorgan's theorem a NAND gate with inverted inputs is equivalent to an OR gate, thus NAND gates 311 and 321 in combination with NAND gate 330 form the AND gates and OR gate shown in FIG. 5A. Thus the circuit of FIG. 3 configured as shown in FIG. 5B implements the multiplexer of FIG. 5A.

Figure 7A:
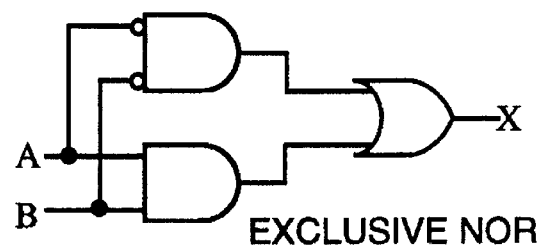
FIGS. 7A and 7B show an exclusive-NOR gate and its implementation using the cell of FIG. 3.
Figure 7B:
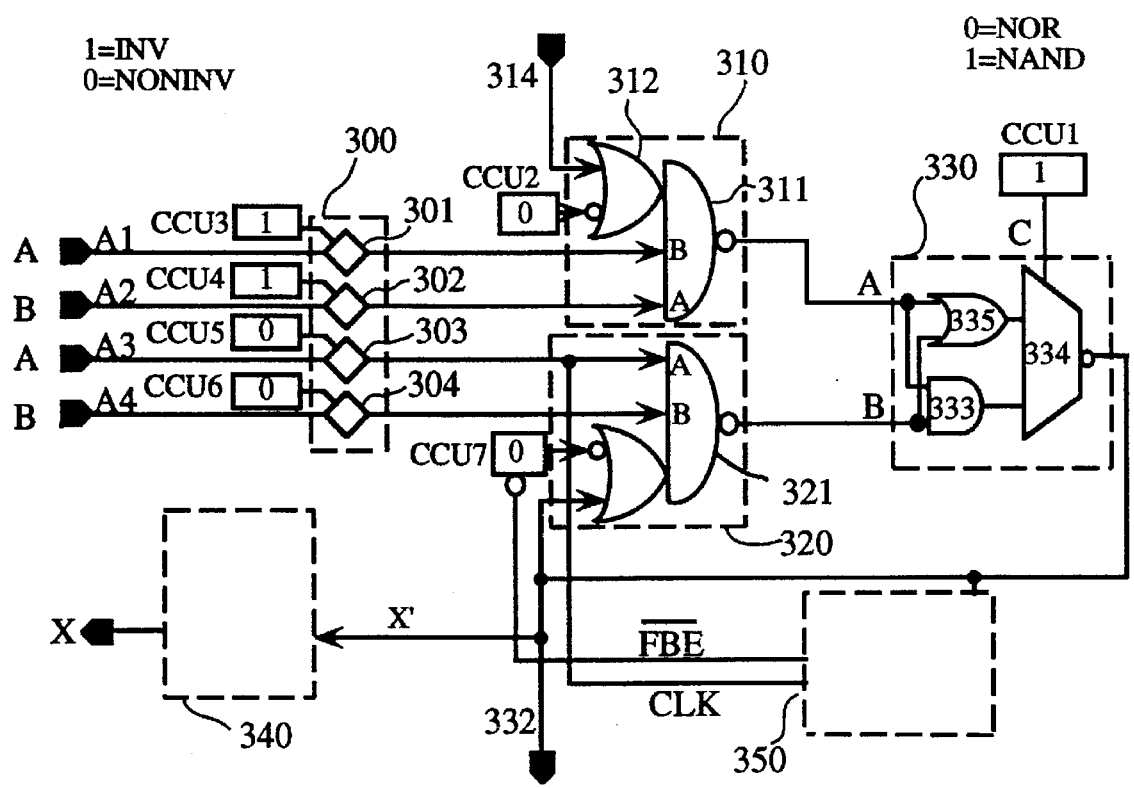

Implementation of XOR, XNOR, Sum-of-Products of FIGS. 6A, 7A, and 8A Shown in FIGS. 6B, 7B, and 8B, Respectively FIGS. 6B, 7B, and 8B show the arrangement of logical 0's and 1's in the seven CCUs of the cell of FIG. 3 to implement the functions shown in FIGS. 6A, 7A, and 8A respectively. An understanding of these implementations can be understood from the detailed multiplexer description above.

Figure 9A:
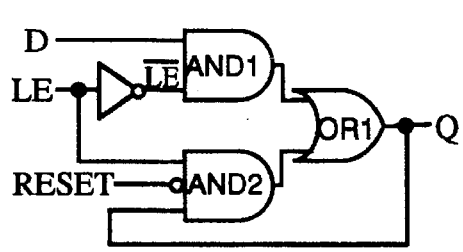
FIGS. 9A and 9B show a latch with clear and its implementation using the cell of FIG. 3.
Figure 9C:
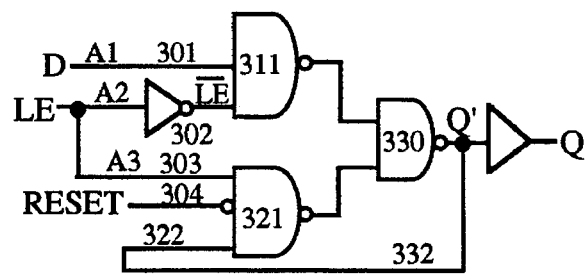
FIGS. 9C shows the equivalent circuit formed by the circuit of FIG. 9B.
Figure 9B:
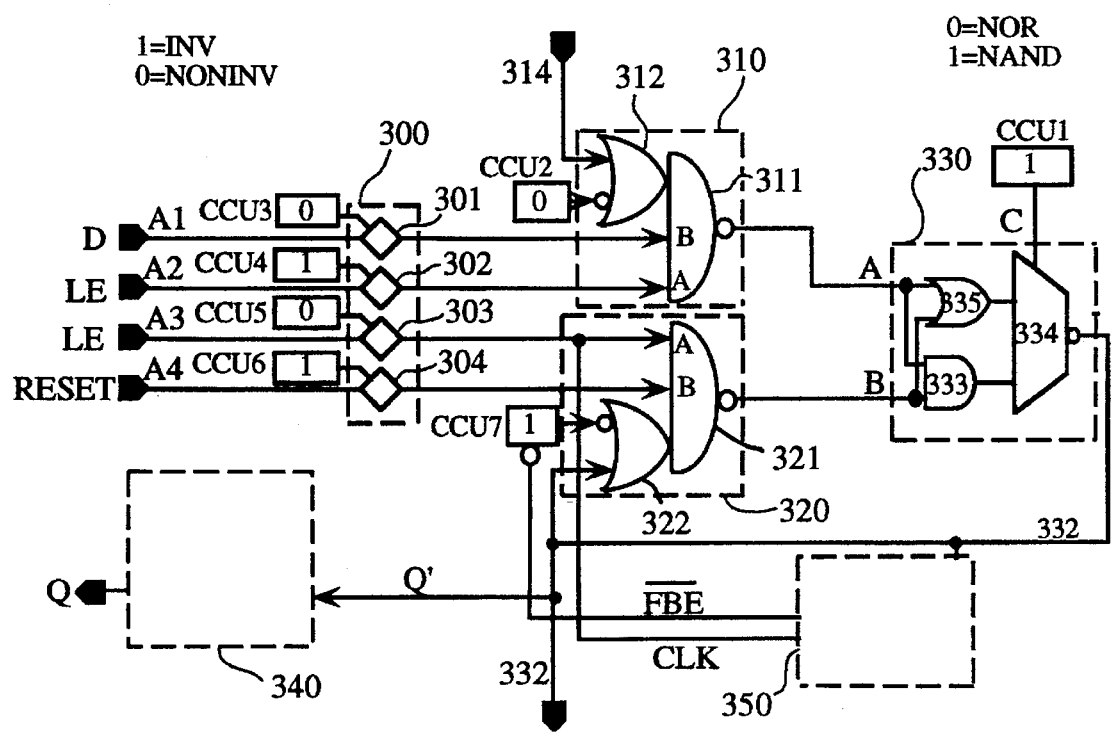

FIGS. 9A through 9H: Latch with Clear and Solution to Static Ones Problem in Sequential Function Feedback Path FIG. 9A shows a latch with clear which can be implemented by the circuit of FIG. 3. FIG. 3 can be configured several ways to implement the static latch, however only one method will be described. As shown in FIG. 9B, the D (data) input of FIG. 9A is provided on line A1 of FIG. 3. Latch enable signal LE of FIG. 9A is applied to lines A2 and A3. Optional inverter 302 is set to be inverting and optional inverter 303 is set to be noninverting. The Reset input of FIG. 9A is provided to line A4. Feedback control unit CCU7 stores a logical 1 which enables the feedback path by applying a logical 0 to the C input of OR gate 322. The Q output signal is thus fed back through the D input of OR gate 322 to NAND gate 321. AND gates AND1 and AND2 and OR gate OR1 of FIG. 9A are achieved (according to DeMorgan's theorem) by configuring second combinational stage 330 as a NAND gate.

A problem called the static ones hazard can occur with a latch of this logic structure when the circuit is entering the latch mode. The problem can be understood more clearly in conjunction with FIGS. 9A through 9C, 9G, and 9H. Depending upon the particular transistors used to implement the gates of FIG. 9B, a transition of latch enable signal LE from low to high may cause a logical zero to be latched when a logical one was present on the data input line. This occurs because a rising LE signal can cause logical zero signals to appear simultaneously (albeit only momentarily) on inputs to both of NAND gates 311 and 321. If these logical 0 signals appear simultaneously at NAND gate 330, a logical 1 data signal will be latched as a logical 0, causing an error. Such an error must be avoided of course, and this can be assured in the circuit of FIG. 3 (FIG. 9B) by controlling trip points in optional inverters 301–304 and the trip points of NAND gates 311 and 321.

Figure 9F:
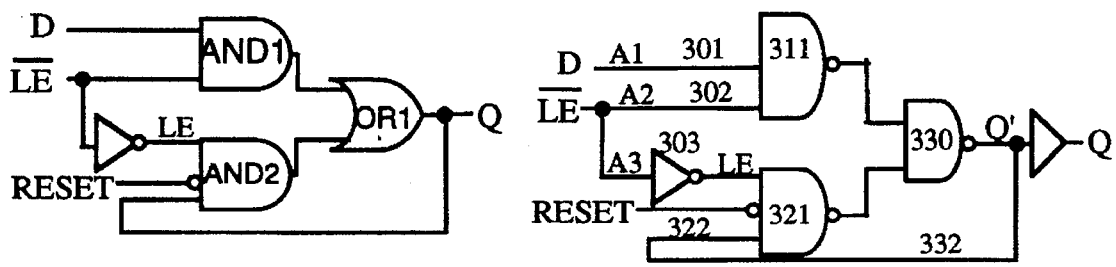
FIG. 9F shows the equivalent circuit formed by the circuit of FIG. 9E.
Figure 9E:
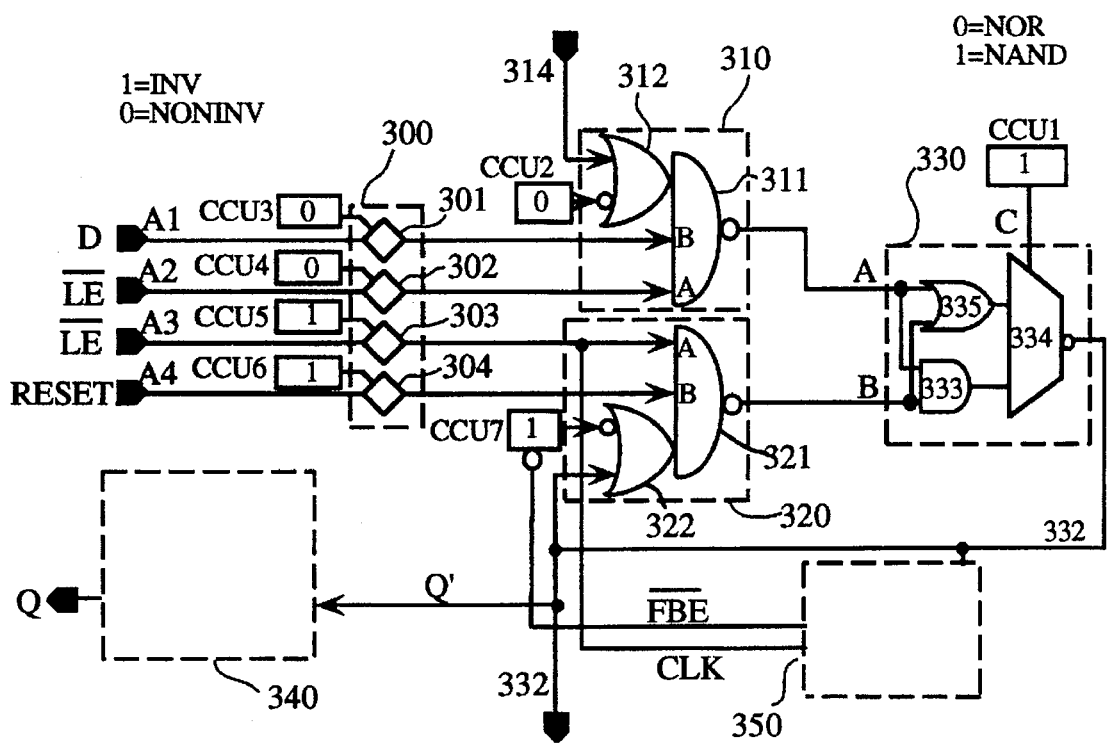

FIG. 9D illustrates a latch with clear in which the latch enable signal LE has the opposite polarity of that in FIG. 9A. Both polarities are needed when sequential latches are needed, for example in a flip flop. FIG. 9E shows the implementation of the latch of FIG. 9D in the FIG. 3 circuit, and FIG. 9F shows the equivalent circuit which results. Optional inverter 302 is configured to pass the LE signal through to the A input of NAND gate 311 and optional inverter 303 is configured as an inverter, passing the complement of A3 to the A input of NAND gate 321.

Figure 9G:
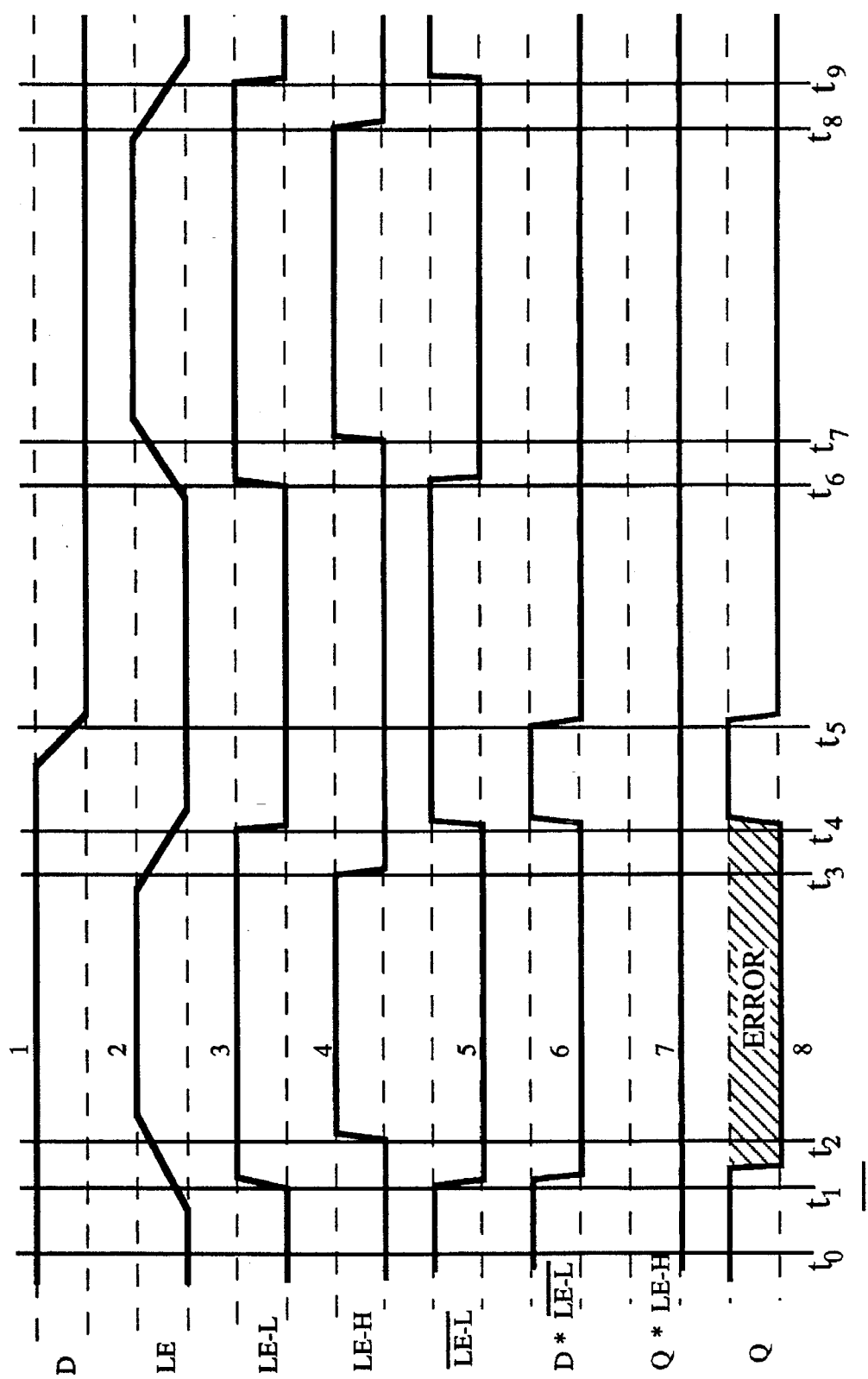
FIG. 9G shows a timing diagram of signals in the circuit of FIGS. 9A–9C, illustrating a static-ones problem.

FIGS. 9G and 9H show two different timing diagrams which can result from the circuit of FIG. 9A. The timing diagram of FIG. 9G has a break-before-make characteristic, which exhibits the static ones problem. The timing diagram of FIG. 9H has a make-before-break characteristic, which avoids the static ones problem. By manufacturing optional inverters 301 through 304 of FIG. 3 to have higher trip points than trip points of NAND gates 311 and 321, the timing diagram of FIG. 9H is achieved and the static one's hazard is avoided. FIGS. 9G and 9H are now explained.

In the circuit of FIGS. 9A through 9C, the input signals are the data input signal D and the latch enable signal LE. (FIGS. 9G and 9H may also represent the timing diagrams for the master portion of a D or JK flip flop to be discussed in connection with FIG. 13A through FIG. 14B). As shown in FIGS. 9G and 9H, at time $t_0$, the D input is logical 1 and the latch enable signal LE is low, so that the D input signal is being passed through to the Q output. Shortly before time $t_1$, latch enable signal LE begins to go high. Because this signal comes from the interconnect structure, which has some capacitance and resistance, latch enable signal LE is shown as having a gradual rise to logical 1. The description which follows also applies to a latch enable signal which switches quickly with respect to the switching time of inverters and NAND gates within the cell. This LE signal is applied to optional inverters 302 and 303. Optional inverter 302 is set to be inverting (see the 1 in CCU4 of FIG. 9B) and thus passes the inverted $\overline{LE}$ signal to input A of NAND gate 311. Optional inverter 303 is set to be noninverting and thus passes the LE signal to NAND gate 321. In FIG. 9G, curve 3, labeled LE-L, shows how the LE signal is interpreted if the element (inverter or NAND gate) receiving the signal has a low trip point, and curve 4, labeled LE-H, shows how the LE signal is interpreted if the element receiving the signal has a high trip point.

In the case of FIG. 9G, the inverters have relatively low trip points and NAND gates 311 and 321 have relatively high trip points. A static ones' error is shown to occur. Curve 5 represents $\overline{LE\text{-}L}$; the output of optional inverter 302 begins going low at time $t_1$ because optional inverter 302 is assumed to have a low trip point. Curve 6 represents the AND1 output of FIG. 9A, the complement of which is calculated in the implementation of FIGS. 9B and 9C by NAND gate 311. Curve 7, which represents the AND2 output signal, the complement of which is generated by NAND gate 321, responds to the signal LE, which was low at time $t_0$. Since NAND gate 321 has a relatively high trip point, the AND2 output doesn't go high at time $t_1$. Since D* $\overline{LE\text{-}L}$ goes low before LE-H goes high, the logical 1 value on D is lost before it is latched as the Q output, and a logical 0 is erroneously latched as Q from a time after $t_1$ to a time after $t_4$.

In the case of FIG. 9H, the inverters have a higher trip point and NAND gates 311 and 321 have a lower trip point. Curve 5 shows the $\overline{LE\text{-}H}$ output signal of optional inverter 302 when manufactured to have a high trip point. Curve 6 shows the AND1 signal D*$\overline{LE\text{-}H}$, the complement of which is generated by NAND gate 311. Curve 7 shows the AND2 output function Q*LE-L, the complement of which is generated by NAND gate 321. Finally, curve 8 shows the Q output function over the time interval $t_0$ through $t_g$. The Q output signal is seen to properly follow the D input signal through the positive and negative shifts of the D and LE signals. This is because the LE-L and $\overline{LE\text{-}H}$ signals are never low at the same time. This ensures one of the two AND gates AND1 or AND2 will be allowed to propagate its input at all times, thereby providing the needed make-before-break characteristic.

Set/Reset Latch

FIG. 10A shows a set/reset latch which can be implemented as shown in FIG. 10B using the cell of FIG. 3.

4-Input AND Gate

Figure 11A:
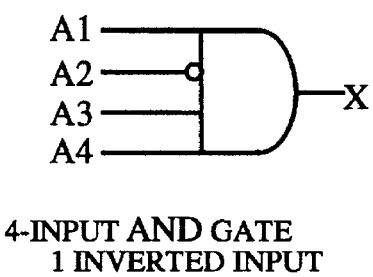
FIGS. 11A–11C show a 4-input AND gate with one inverted input, and its implementation using the cell of FIG. 3.
Figure 11C:
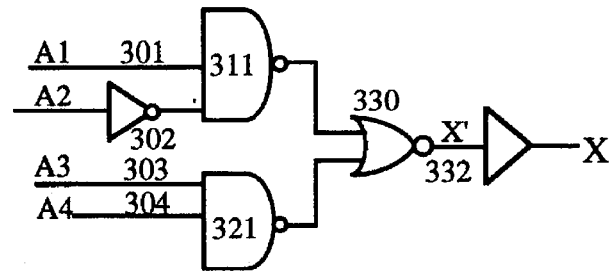
Figure 11B:
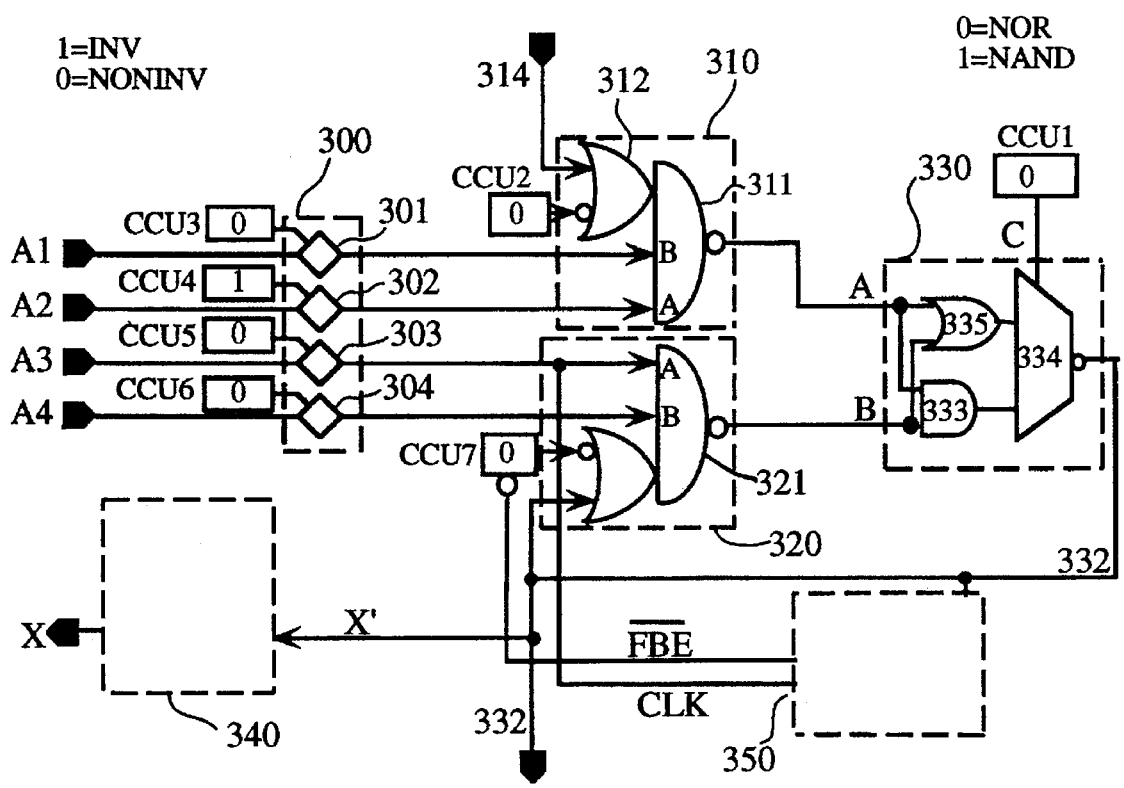

FIGS. 11A and 11B show a 4-input AND gate with one inverted input, and its implementation using the cell of FIG. 3. Note that second combinational stage 330 is configured as a NOR gate by a logical 0 from CCU1. With the two inverted inputs (the inverted outputs of NAND gates 311 and 321) second combinational stage provides the AND function. In the example of FIG. 11A, the A2 input is inverted. Therefore, a logical 1 in CCU4 causes optional inverter 302 to act as an inverter. Clearly any combination of inverted inputs may be selected.

Figure 12A:
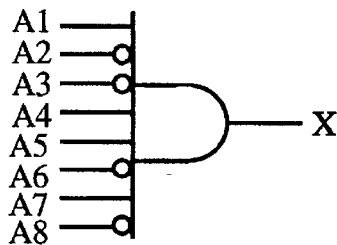
FIGS. 12A–12C show an 8-input AND gate with some inverted inputs, and its implementation using two of the cells of FIG. 3 interconnected using the cascade feature.
Figure 12C:
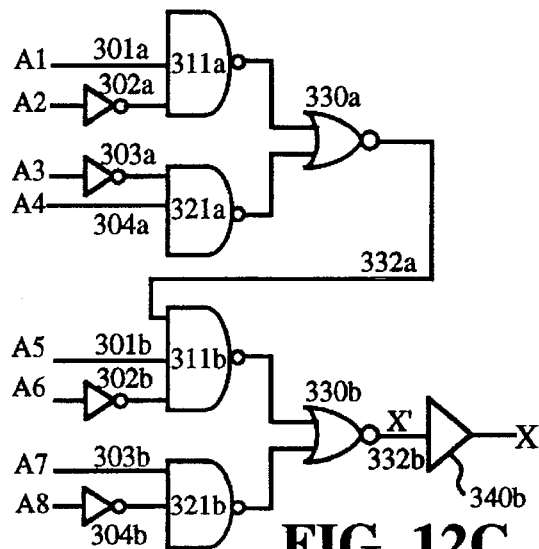
Figure 12B:
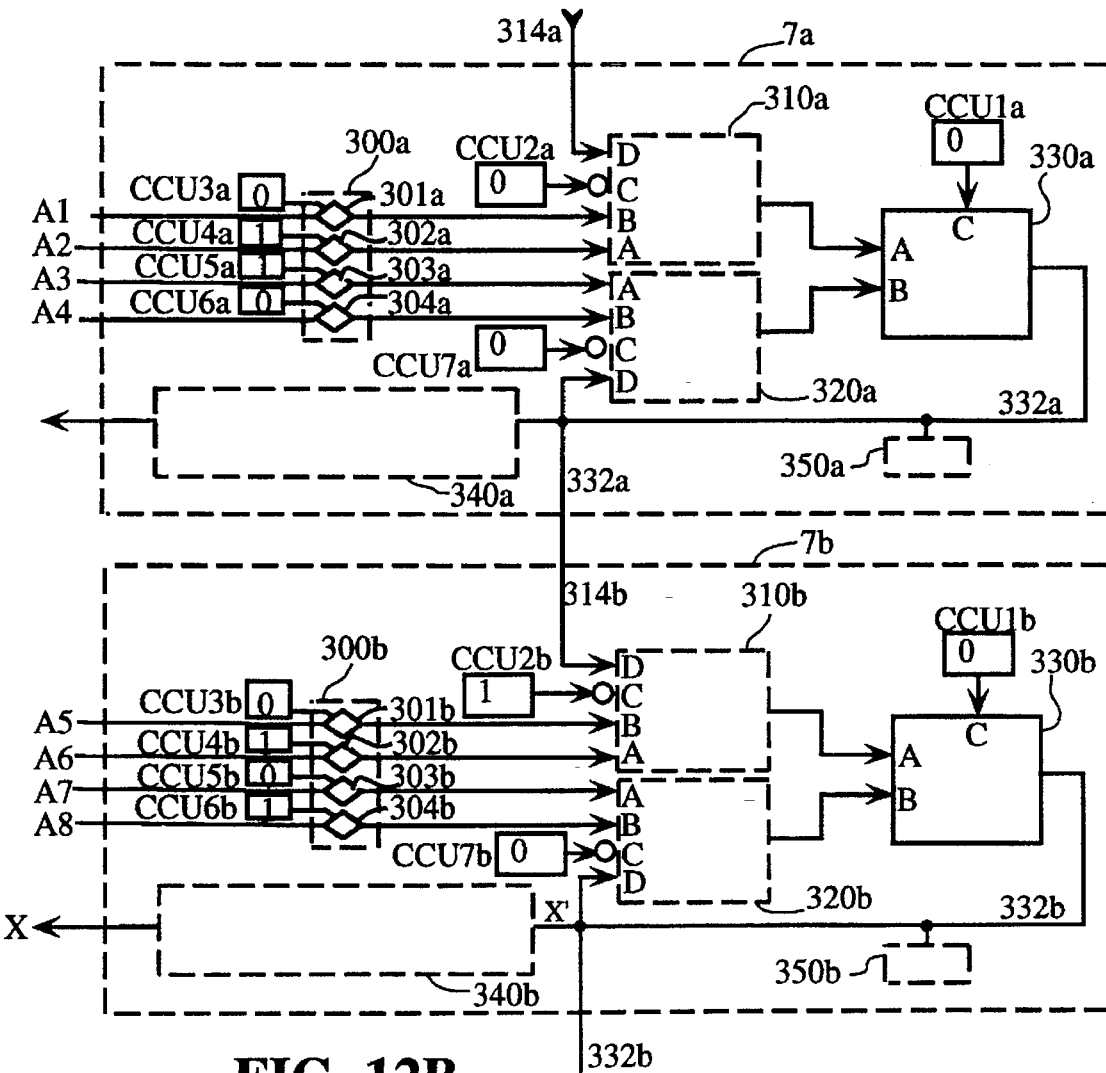

Example Wide AND Function, FIGS. 12A and 12B Using Cascade

FIG. 12A shows an 8-input AND gate with inputs A2, A3, A6, and A8 inverted. As shown in FIG. 12B this 8-input AND gate is implemented using two cells of FIG. 3 connected using the cascade feature. Users may cascade more than two adjacent cells together to form wider or larger functions. Lines A1 through A8 provide the eight inputs, while the AND function is provided as the X output. The logical 0 in cascade-in control unit CCU2a causes cell 7a to ignore the signal on line 314a. Optional inverter 301a is caused by a logical 0 in CCU3 to provide a noninverted version of A1. Optional inverter 302a is caused by the logical 1 in CCU4a to invert the A2 signal. Logical 1's at CCU5a, CCU4b, and CCU6b also cause inversion of A3, A6, and A8. Feedback control unit CCU7a provides a logical 1, which causes 320a to ignore Q output signal 332a. The logical 0 control signal from control unit CCU1a causes second combinational stage 330a to provide the NOR function of stages 310a and 320a. Thus, by deMorgan's theorem, the output signal placed on line 332a is the AND function of A1 through A4. Configuration control unit CCU2b carries a logical 1, which causes the cascade 332a output signal from cell 7a to be provided as input D to cascade unit 310b of cell 7b. Thus cascade unit 310b provides the NAND function of three inputs, A5, A6, and the AND output of cell 7a. Importantly, the AND output of cell 7a arrives at the input of cascade unit 310b without passing through any programmable interconnect. Thus this cascade connection reduces delay as well as saving interconnect resources. Cell 7b also has a logical 0 in CCU1b and CCU7b. The result is that the output B2 of cell 7b is an AND function of eight inputs A1 through A8. In particular, $$B2=A1*\overline{A2}*\overline{A3}*A4*A5*\overline{A6}*A7*\overline{A8}$$

Though the cascade path connecting output line 332a to cascade-in line 314b avoids the delay of output buffer 340a and input buffer 300b, nevertheless for maximum speed of the system using a wide AND gate such as implemented in FIG. 12B it is preferable to apply signals requiring minimum delay to inputs A5–A8 because these signals will not have to be processed through two cells before reaching the output at B2.

Because an extra cascade-in input signal can be used, it is not necessary to use one of the inputs A5–A8 to receive the output from 332a (the AND function of A1–A4) to compute an AND function. Thus two cells having four inputs each can be used to calculate an 8-input AND (or other) function. Without the cascade path, not only would the performance be slower and some of the interconnect resources be used up, but the two cells with together 8 inputs could only calculate a 7-input function because one input would be required for forwarding the output of the first stage.

Example D Flip, Flop FIGS. 13A–13C

FIGS. 13A, 13B, and 13C show a D flip flop and its implementation in FIG. 3. This flip flop uses two of the cells of FIG. 3, each indicated by one of the dotted lines 7a and 7b. The flip flop is formed by cascading two transparent latches; in this case, the latch of FIGS. 9A–9C forms the master while the latch of FIGS. 9D–9F forms the slave. The implementation shown is only one of several ways available with a pair of cells as in FIG. 3. The D input of FIG. 13A is provided on line A1 of FIG. 13B. Clock input CK of FIG. 13A is provided on lines A2, A3, A6 and A7, and is inverted by buffers 302a and 303b but not by buffers 303a or 302b. Reset input R is provided on lines A4, A5, and A8, and inverted by all three of buffers 304a, 301b, and 304b. In both cells, second combinational stages 330a and 330b are configured as NAND gates. Cascade enable unit 312b carries a logical 1, enabling the output signal on line 332a from the master section of the flip flop to be passed by OR gate 312b to NAND gate 311b. Logical 1 signals from feedback control units CCU7a and CCU7b enable the internal feedback paths. Thus the circuit of FIG. 13B formed from two cells of FIG. 3 implements the D flip flop of FIG. 13A. This circuit is formed from two cells connected by a direct connect path without using the general interconnect structure, and therefore the signal path does not pass through any input or output buffers or any programmable interconnect means.

Example JK Flip Flop, FIGS. 14A–14C

FIGS. 14A–14C show a JK flip flop and its implementation. This flip flop uses three of the cells of FIG. 3, each indicated by one of the dotted lines 7a, 7b, and 7c of FIG. 14B. Cells 7b and 7c implement a D flip flop, and are configured similarly to cells 7a and 7b of FIG. 13B. Cell 7a implements a multiplexer as in FIGS. 5A–5C. Connection of the multiplexer to the D flip flop occurs through the cascade connection between cells 7A and 7B as caused by the 1 in CCU2b. However a connection L7 between the first and last cells is also needed to feed the Q output back to cell 7a, and is formed using the general interconnect. Therefore general interconnect line L7 is programmably connected to output line B3 of cell 7c at programmable interconnect I71, and to cell 7a at input lines A2 and A3 at programmable interconnects I72 and I73. As with other examples, the 0's and 1's in each of the CCUs shows the configuration of each part of each cell to achieve the JK flip flop of FIG. 14A.

Detail of Implementation of Stage 300

Figure 15A:
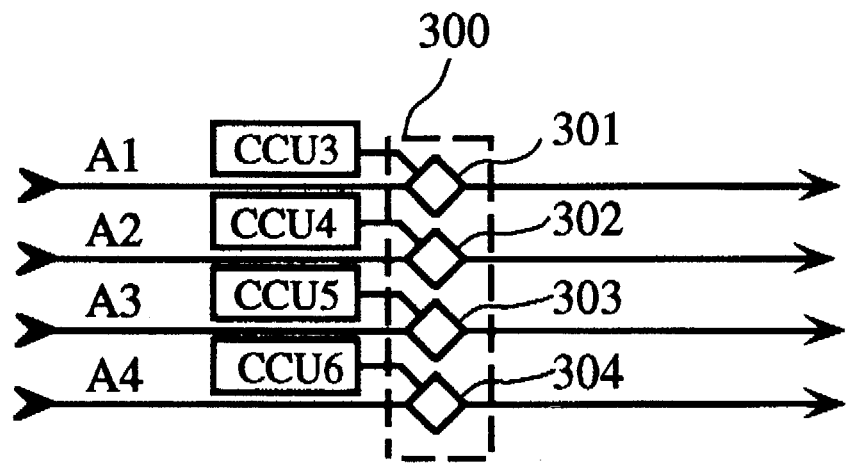
FIGS. 15A and 15B show the optional input inverters 300 of FIG. 3, and one implementation of these optional inverters.
Figure 15B:
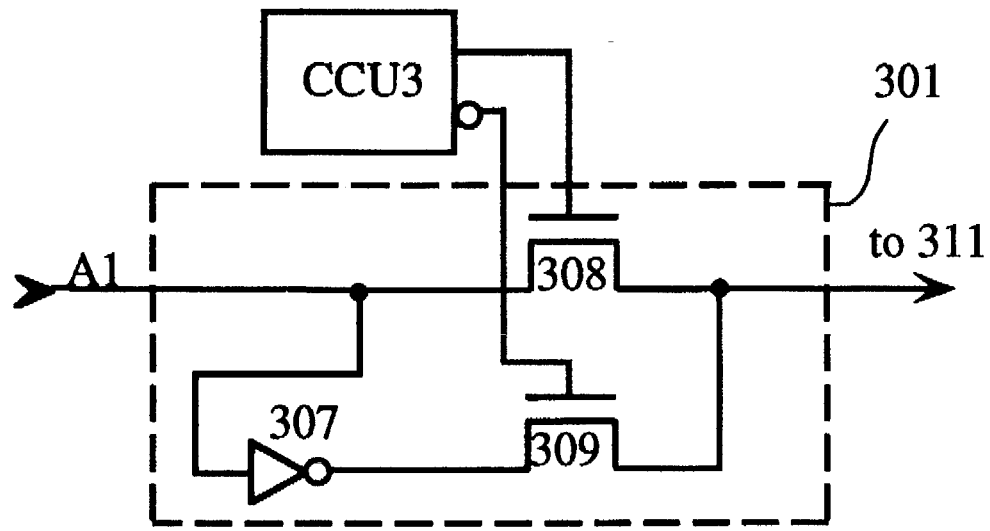

FIG. 15A shows stage 300 of FIG. 3. FIG. 15B shows one implementation of the optional inverters 301 of FIG. 15A. Optional inverter 301 comprises an inverter and a multiplexer. An input signal A1 is provided to optional inverter 301. This signal is input to inverter 307. Control unit CCU3, which may include an SRAM memory cell such as described in U.S. Pat. No. 4,821,233 [docket M-231/1], incorporated herein by reference, provides complementary output signals. Control unit CCU3 determines whether the input signal or the output of inverter 307 is provided to stage 311 of FIG. 3. Since every input includes an optional inverter, it is not necessary to add circuitry to control the polarity of signals on interconnect lines. In order to avoid the static one's hazard discussed in connection with FIG. 9A through FIG. 9H, the embodiment of FIG. 15B is presently preferred in combination with a high inverter trip point of inverter 307 and relatively lower trip point of NAND gates 311 and 321. The embodiment of FIG. 15B is also illustrated in FIG. 4B.

The output signals from control unit CCU3 can be pumped to a higher voltage than the supply voltage so that the on-resistance of transistors 308 and 309 is minimized and further that the full voltage swing of the input signal on line A1 is passed to NAND gate 311. Preferably these output signals from control unit CCU3 are pumped to about 7 volts in a 5 volt system using a circuit described in copending U.S. patent application Ser. No. 07/784,843 [docket M-1755] incorporated herein by reference.

Detail of Implementation of Stages 310 and 320

As discussed above, the cell of FIG. 3 can be configured to cascade the output of an adjacent cell as input to itself. Setting cascade-in control unit CCU2 to provide a low signal to input C of OR gate 312 (which requires a logical 1 in CCU2, inverted at the input of OR gate 312) causes OR gate 312 to feed in the signal on line 314, which is the output signal 332 from an adjacent cell.

The time delay for a signal to propagate from the output of one cell along the cascade path to the next cell is considerably less than the time delay for a signal to propagate from the output of one cell through an output buffer, along an interconnect path, and through an input buffer to the next cell.

As also discussed above, the cell can be configured to generate either combinational or sequential functions. Thus different ratios of sequential to combinational functions can be implemented by different users. By setting feedback enable control unit CCU7 to provide a low signal to input C of OR gate 322, OR gate 322 can be set to feed back the signal on output line 332 to combinational stage 320 without the feedback signal having to pass through any antifuse or other programmable interconnect structure.

FIGS. 16A and 16B show the combinational stages 310 and 320 of FIG. 3. FIG. 16C shows a preferred circuit for implementing combinational stages 310 and 320 of FIG. 3. Input and output signals of FIG. 16C are labeled to correspond to those of both stage 320 and stage 310. As shown in FIG. 16C, the circuit is preferably formed using a combination of P and N channel transistors which provides high performance (high speed) with compact layout.

Detail of Implementation of Second Combinational Stage 330

Figure 17A:
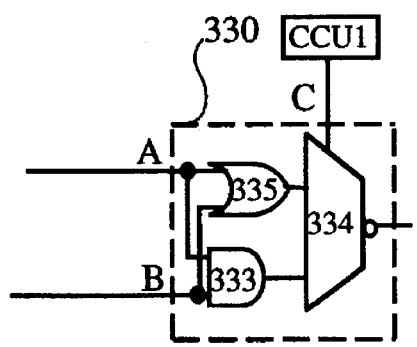
FIGS. 17A and 17B show the NOR/NAND circuit 330 of FIG. 3 and one way of forming that circuit.
Figure 17B:
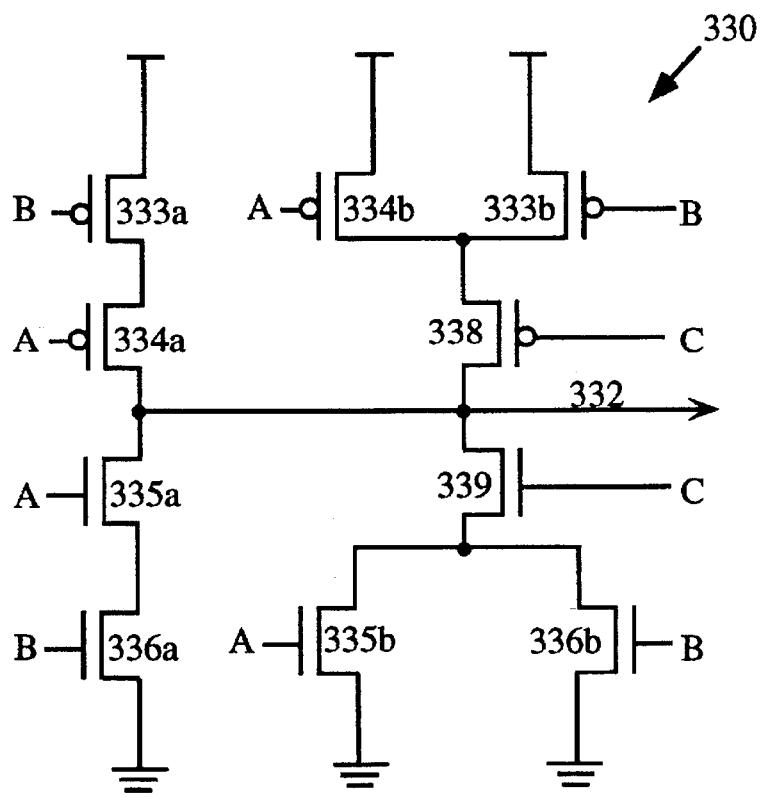

FIG. 17A shows combinational stage 330 as shown in FIG. 3. FIG. 17B shows a preferred implementation of combinational stage 330. As shown in FIG. 17B, when a low C input signal is supplied by control unit CCU1, PMOS transistor 338 is on and NMOS transistor 339 is off. In this configuration of FIG. 17B, high signals on both A and B cause transistors 335a and 336a to pull output line 332 to ground. When both A and B are low, transistors 333a, 333b, 334a, and 334b pull output line 332 high. When one of transistors A or B is high and the other low, one of transistors 334b and 333b pulls output line 332 high. Thus the NAND function is provided.

When control unit CCU1 provides a high C input signal, transistor 338 is off and 339 is on. In this configuration, when both A and B carry the same signal, the situation is as above. When A and B are different, one of transistors 335b and 336b pulls output line 332 to ground. Thus the NOR function is provided.

For forming the functions shown in FIGS. 5A–10A, CCU1 is configured to store a logical 1, thus generating the NAND function. By deMorgan's theorem the resulting function NAND of NAND becomes OR of AND. To form the wide AND function of FIG. 11A, CCU1 stores a logical 0, thus generating the NOR function, which in combination with the NAND inputs generates AND of AND.

Detail of Output Buffer Stage 340

Output buffer stage 340 preferably comprises plural means for providing a high impedance output signal X. Electrical isolation during antifuse programming and logical isolation during cell operation are both provided by output buffer stage 340.

Electrical Isolation, First Embodiment, Using Isolation Transistor

Figure 18:
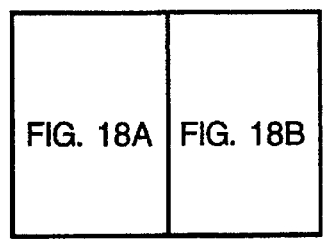
FIG. 18, which comprises
Figure 18A:
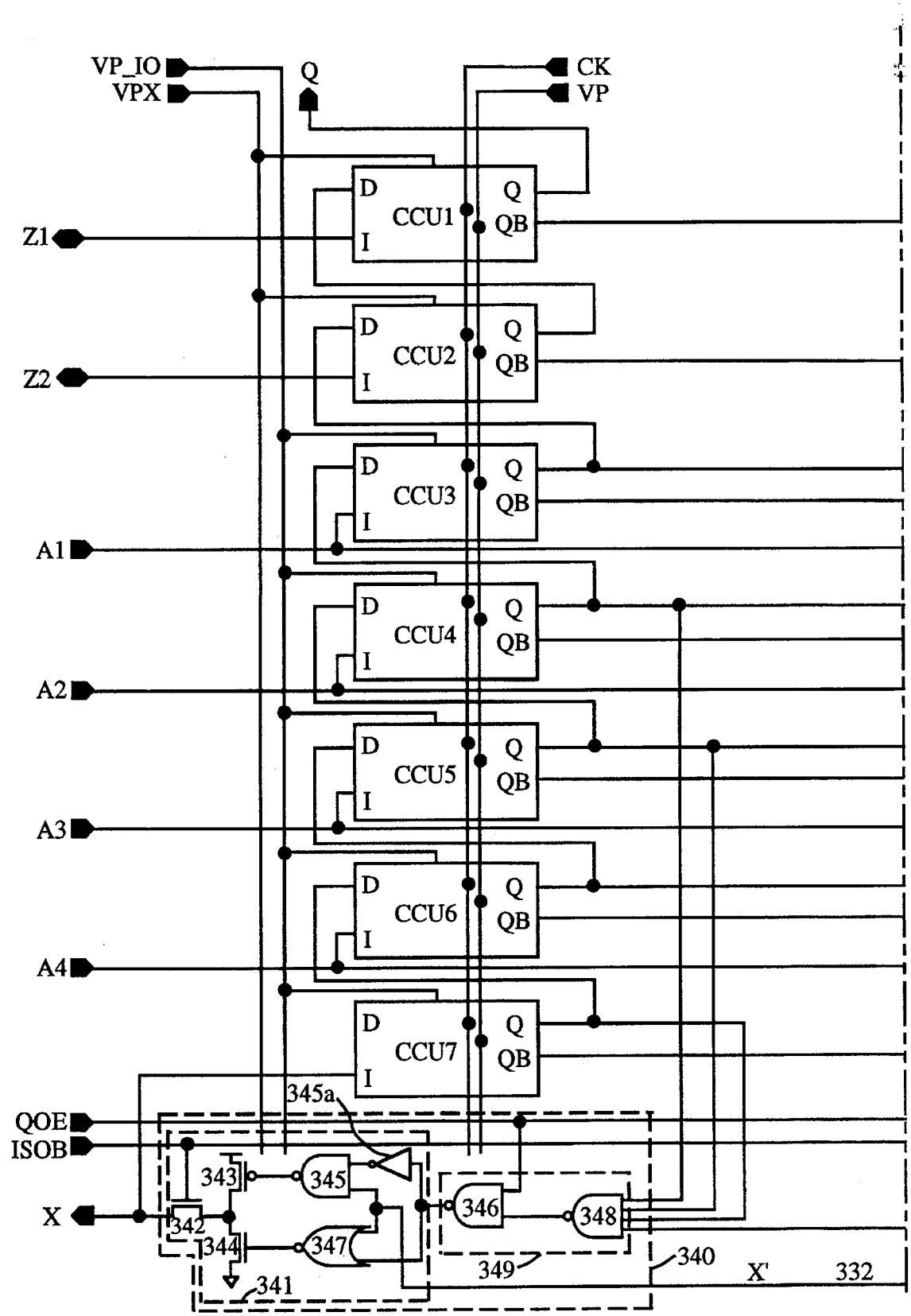
FIGS. 18A and 18B, shows a first embodiment of the cell of FIG. 3 including the configuration control units which configure the cell, and showing a first output buffer circuit.
Figure 18B:
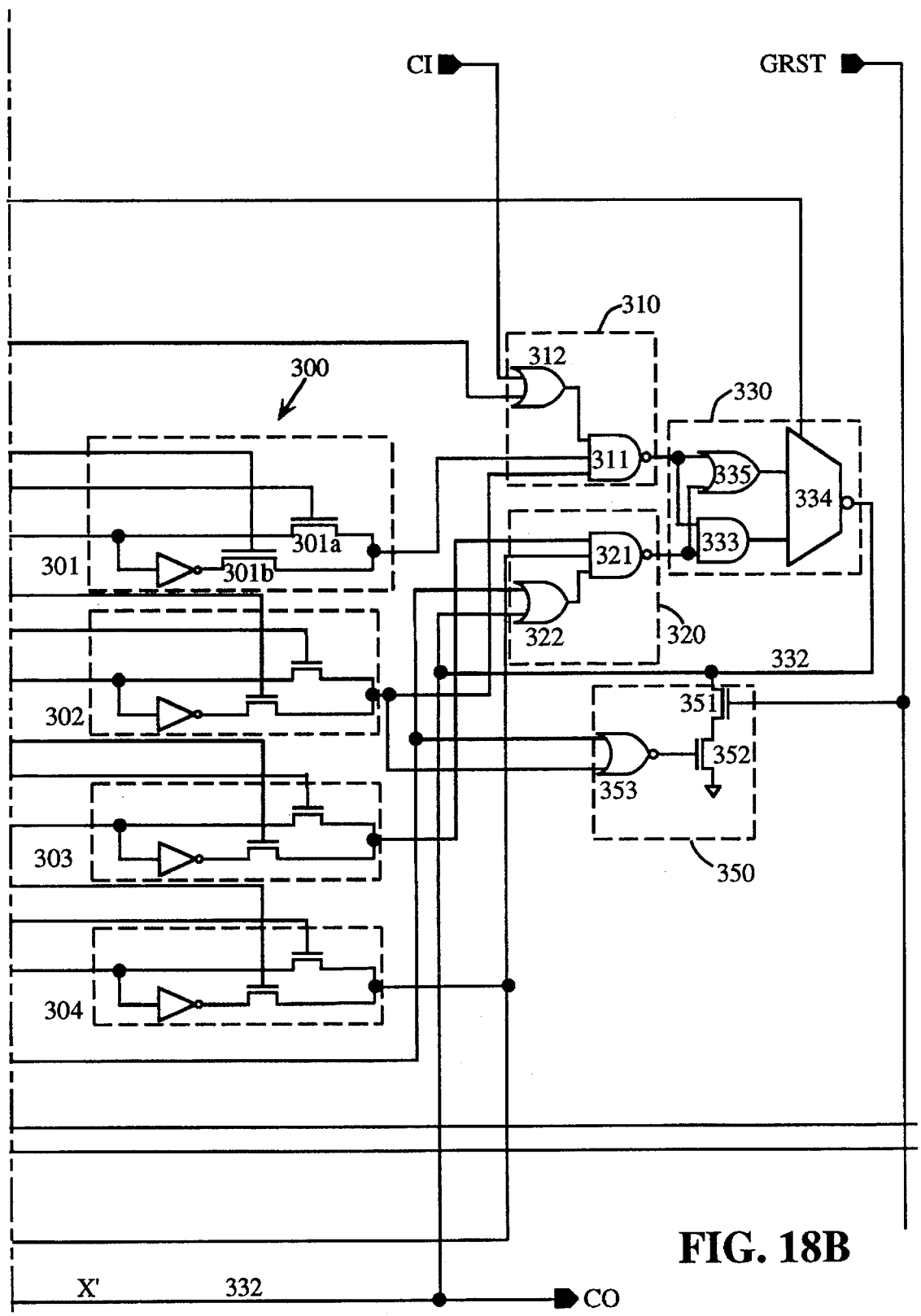

FIG. 18, comprising FIGS. 18A and 18B, shows one embodiment of the cell of the present invention. Elements of FIG. 18 which correspond to elements of FIG. 3 are given the same reference numerals. FIG. 18A, shows the detail of one embodiment of output driver stage 340, which comprises buffer 341 and high impedance control unit 349.

In a first embodiment, shown in FIG. 18A, electrical and logical isolation are controlled separately. An electrical isolation transistor 342 is positioned adjacent the interconnect line for the purpose of isolating transistors 343 and 344 from the high voltages present on the interconnect structure during programming of antifuses in the interconnect structure. Transistor 342 allows transistors 343 and 344 to be of minimum channel length when used with an antifuse interconnect structure programmed at higher voltage. Transistor 343 is a P-channel transistor, thus it must be isolated from the interconnect structure during antifuse programming. This is because the interconnect structure must receive a 10-volt signal (or other programming voltage) during programming, but the P-N junction between the drain and substrate of transistor 343 would create a forward-biased diode which would pull down the interconnect voltage and prevent the programming voltage from being applied. Isolation transistor 342 can be turned off from a global control source ISOB.

Transistor 342 remains on during normal operation of the device. During operation, the voltage on the control terminal of transistor 342 is pumped above the supply voltage so that the full rail-to-rail voltage swing of the logic signal on line 332 propagates through transistor 342. Thus a full rail-to-rail voltage swing is available to the input of a next cell in the logic design.

Electrical Isolation, Second Embodiment, No Isolation Transistor

Figure 19:
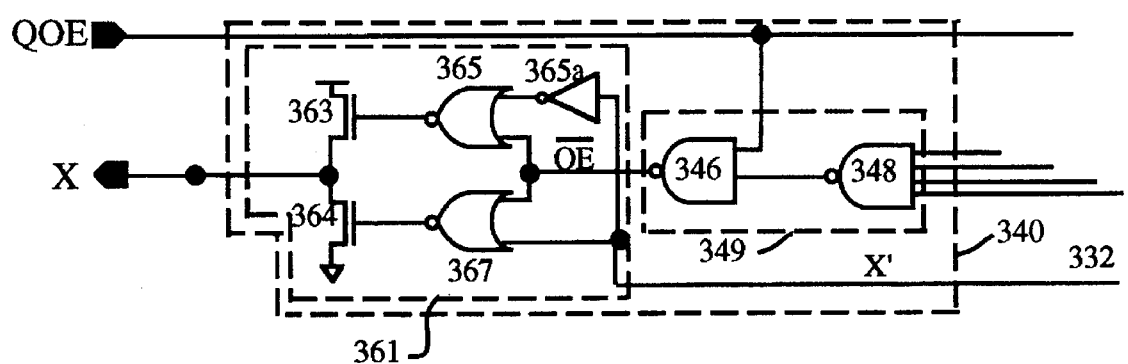
FIG. 19 shows an alternative output buffer for circuit 340 of FIG. 18A.

FIG. 19 shows another embodiment of the output buffer 340 used with an antifuse interconnect structure having reduced interconnect voltage. In the embodiment of FIG. 19, no isolation transistor 342 is provided. Both electrical isolation and logical high impedance are provided by a pair of N-channel pull-up and pull-down transistors 363 and 364. By replacing PMOS transistor 343 with NMOS transistor 363, and manufacturing transistors 363 and 364 to have a longer channel length, it is possible to eliminate isolation transistor 342. A P-N junction (parasitic diode) associated with transistor 363 exists between the P-well and the N-doped source and drain. However, a high programming voltage applied to the source of transistor 363 does not forward bias the P-N junction and cause current to flow into the well of transistor 363. Thus transistor 363 does not draw current from the interconnect structure during antifuse programming. Of course, eliminating transistor 342 saves area.

Transistors 363 and 364 are turned off during antifuse programming so that the full 10-volt programming voltage will be applied across an antifuse and not dissipated through transistor 363 or 364. N-channel transistors 363 and 364 are turned off by low (0 volt) output signals from NOR gates 365 and 367, which results from a high $\overline{OE}$ signal, which in turn is invoked by a low QOE signal. (Generation of the QOE signal is discussed later.) Thus when QOE is low, no current flows from the interconnect structure through transistors 363 and 364, and electrical isolation is provided.

The structure of FIG. 19 applies to the interconnect structure logical 1 voltages of Vcc-Vt, where Vt is the threshold voltage drop of transistor 363, and is on the order of 1.0 volts. The threshold voltage drop produces a logical 1 voltage on an interconnect line of about 4.0 volts in a 5-volt system. Because of leakage which may occur in unprogrammed antifuses in the interconnect structure, the lower interconnect line voltage is preferred. However, the cell of FIG. 3 must respond properly to this reduced voltage. In order to operate properly under a reduced input signal voltage of 4.0 volts, the cell of FIG. 3 is manufactured so that all elements (inverters or NAND gate inputs) driven from the interconnect structure will use P-channel transistors having a threshold voltage on the order of 1.6 volts, higher than the 1.0 volt drop presented by the transistors such as 342 or 343 at the cell output, so the 4.0 volt logical 1 signal will not cause the P-channel transistor to turn on. These include the P-channel transistors in inverter 307 (see FIG. 15B), and the P-channel transistors in NAND gates 311 and 321 (see FIG. 16C). This threshold voltage drop may be achieved by using a P-channel transistor with a special implant for adjusting threshold voltage.

Logical Isolation

In either embodiment (FIGS. 18A and 18B or FIG. 19), for logical control during cell operation, the cell can operate as a 3-state buffer, or the cell can perform a selected function and the high impedance state can be controlled by an enable signal QOE. This QOE enable signal preferably controls multiple cells and can be used for controlling multiple cells connected to a bus.

Referring to FIG. 18A, during operation of the cell, transistors 343 and 344 can simultaneously be turned off by a high signal from high impedance control unit 349. On the other hand, a low output signal from control unit 349 allows the Q output signal on line 332 to determine which of transistors 343 and 344 will be on and therefore which of power and ground will be supplied through transistor 342 as output signal X. The second embodiment operates in an analogous manner.

Configuring the Cell as a 3-State Buffer

NAND gate 348 decodes a particular combination of configuration control signals, preferably a combination not otherwise used to set up a useful configuration, and causes the output buffer (transistors 343 and 344) to provide high impedance output in response to a data signal when this combination of configuration signals is present.

In the embodiment shown in FIG. 18A and 18B, when the logic cell is configured for sequential functions, the output of CCU7 is a logical 1. A pair of input lines, one for each of sections 310 and 320 are used to provide clock signals of opposite polarities. For example, A2 and A3 may be connected to provide a clock signal and opposite values loaded into CCU3 and CCU4 such that one of optional inverters 302 and 303 is inverting and one is noninverting. Since the outputs of CCU4 and CCU5 are always of opposite polarity, the combination decoded by NAND gate 348 is not otherwise used.

NAND gate 348 receives three configuration control signals from configuration control units CCU4, CCU5, and CCU7, and one enable signal from selective inverter 304. NAND gate 348 generates a low output signal (generating a high impedance output) in response to one condition, namely when outputs of CCU4, CCU5, and CCU7 as well as the output of optional inverter 304 are all logical 1. Thus this combination of configuration signals configures the cell to be a 3-state buffer. NAND gate 348 provides high impedance control of the individual cell without requiring a separate input signal to the cell.

In the embodiment of FIG. 18A and 18B, the 3-state buffer configuration is invoked by configuration signals indicating that a sequential function is to be used (CCU7 holds a logical 1) and that both of the signals on lines A2 and A3 (normally used for clock signals) are to be inverted. NAND gate 348 decodes this combination of configuration signals and causes the cell to respond to an input signal on line A4 which enables or disables the high impedance state. Other combinations of configuration signals can alternatively be used to invoke a high impedance output.

Implementation of Logic Cell as 3-State Buffer

FIGS. 20A through 20C show an implementation of the logic cell as a 3-state buffer. FIG. 20A shows the 3-state buffer circuit. FIG. 20B shows its implementation in the circuit of FIG. 18A and 18B or the circuit of FIG. 19. FIG. 20C shows the equivalent circuit formed by the circuit of FIG. 20B. Input signal IN is applied to line A1 and a logical 0 in configuration control unit CCU3 makes optional inverter 301 noninverting so the input signal passes to NAND gate 311. Lines A2 and A3 are tied to ground, and logical 1 in configuration control units CCU4 and CCU5 sets them both to be inverting. The enable signal EN is applied to line A4, and CCU6 is set by a logical 1 to be inverting. (With an active low enable signal, CCU6 would be set by a logical 0 to be noninverting.) The logical 1 in CCU7 in combination with logical 1's in CCU4 and CCU5 enable NAND gate 348 to respond to the EN signal output from inverter 304. Thus when EN is low, the high impedance state is enabled, and when EN is low the signal IN is passed to output line X. The signal to be buffered is a function of an input signal on line A1, and the 3-state control is provided on line A4. Thus the circuit of FIG. 20C performs as shown in FIG. 20A. The feedback of the Q output signal occurs as a side effect of the implementation and has no effect on the 3-state output signal X.

Since the particular combination of configuration states in CCU4, CCU5 and CCU7 does enable the feedback, configuration unit CCU1 must be set to logical 1 (NAND) so that the cell will feed through the IN signal when output is enabled.

The novelty here is the detection of unused CCU configuration patterns to provide a 3-state buffer with minimal additional use of resources.

Example Application of the Cell as 3-State Buffer

FIGS. 21A and 21B show a commonly used circuit and its implementation. FIG. 21A shows a D-flipflop with a 3-state buffer on its output. As shown in FIG. 21B, three adjacent logic cells 22a through 22c are used in this implementation. Cells 22a and 22b form the master and slave portions of the D-flipflop and cell 22c forms the 3-state buffer. Note that the cascade feature is used to connect the flip flop Q output to the 3-state buffer input.

Grouped 3-Stating Capability

In addition to the ability to configure an individual logic cell as a 3-state buffer, the present invention provides the ability to disable groups of logic cells using a single 3-state control line. This allows the cells in the group to be configured to perform any selected function while at the same time allowing 3-state control of the cell outputs without using additional cells for the 3-state control.

Returning to FIG. 18A, NAND gate 346 causes transistors 343 and 344 to provide a high impedance in response to either the low signal from NAND gate 348 or a low output enable signal QOE. The QOE signal allows the cell to be configured to generate a desired logic function, and for the function output to be placed on a bus when selected.

As shown in FIG. 4, the logic cells are grouped into blocks of eight cells, four cells CELL_1 through CELL_4 above and four cells CELL_5 through CELL_8 below. A single QOE signal enables four cells simultaneously. Cells CELL_1 through CELL_4 are enabled by one QOE signal and cells CELL_5 through CELL_8 are enabled by another QOE signal. The QOE signal lines are shown more clearly in FIG. 27, which comprises FIGS. 27A through 27J. The QOE signals are generated in cell CELL_9, which comprises a plurality of configuration control units.

Figure 23:
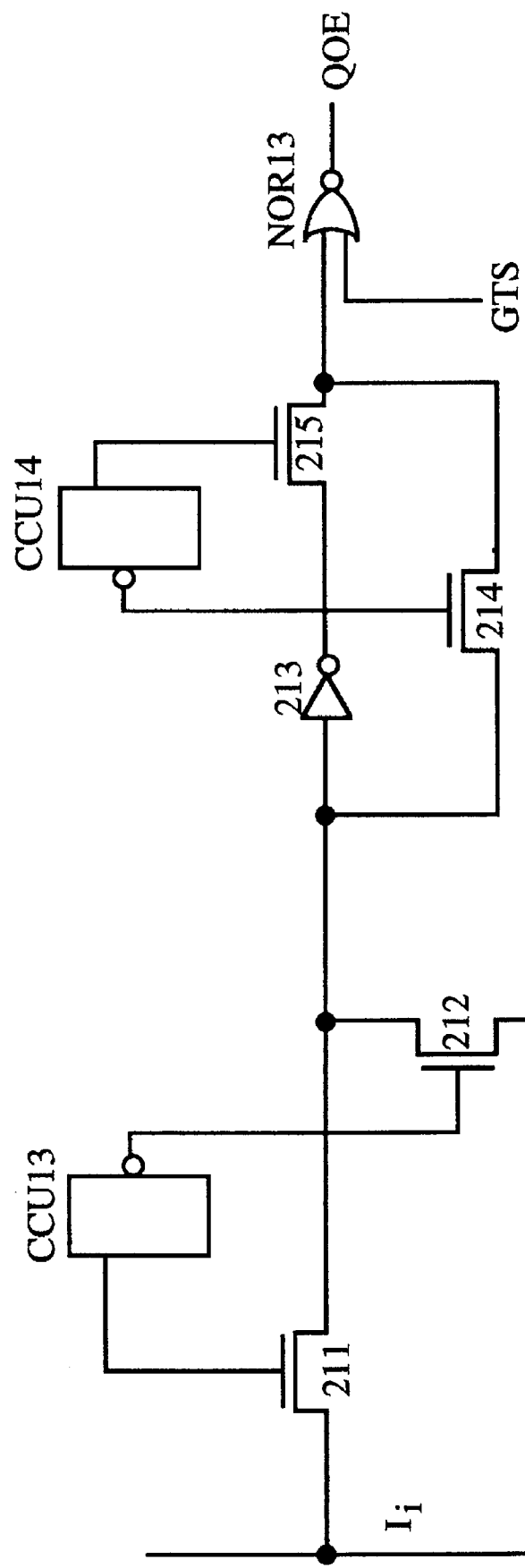
FIG. 23 shows a quad output enable circuit which generates the QOE signal for controlling the output buffer circuit 340 of FIG. 18.

FIG. 23 shows a circuit in cell CELL_9 for generating a QOE signal. NOR gate NOR13 receives a global 3-state signal GTS and a selectable input signal. A high global 3-state signal GTS always causes the QOE signal to place a high impedance on the cell outputs. When GTS is low, the QOE signal is a selectable function. The circuit shown in FIG. 23 selects between a signal on interconnect line $I_i$ and a constant signal, shown as ground, as controlled by configuration control unit CCU13, and selectively inverts the signal, as controlled by configuration control unit CCU14.

Since each QOE line controls four logic cells, logic cells which are controlled by the same QOE line should be used to implement bits of the same word (addressed by the same read and write enable lines).

Use of Grouped 3-Stating Capability for Reading Registers

Figure 22:
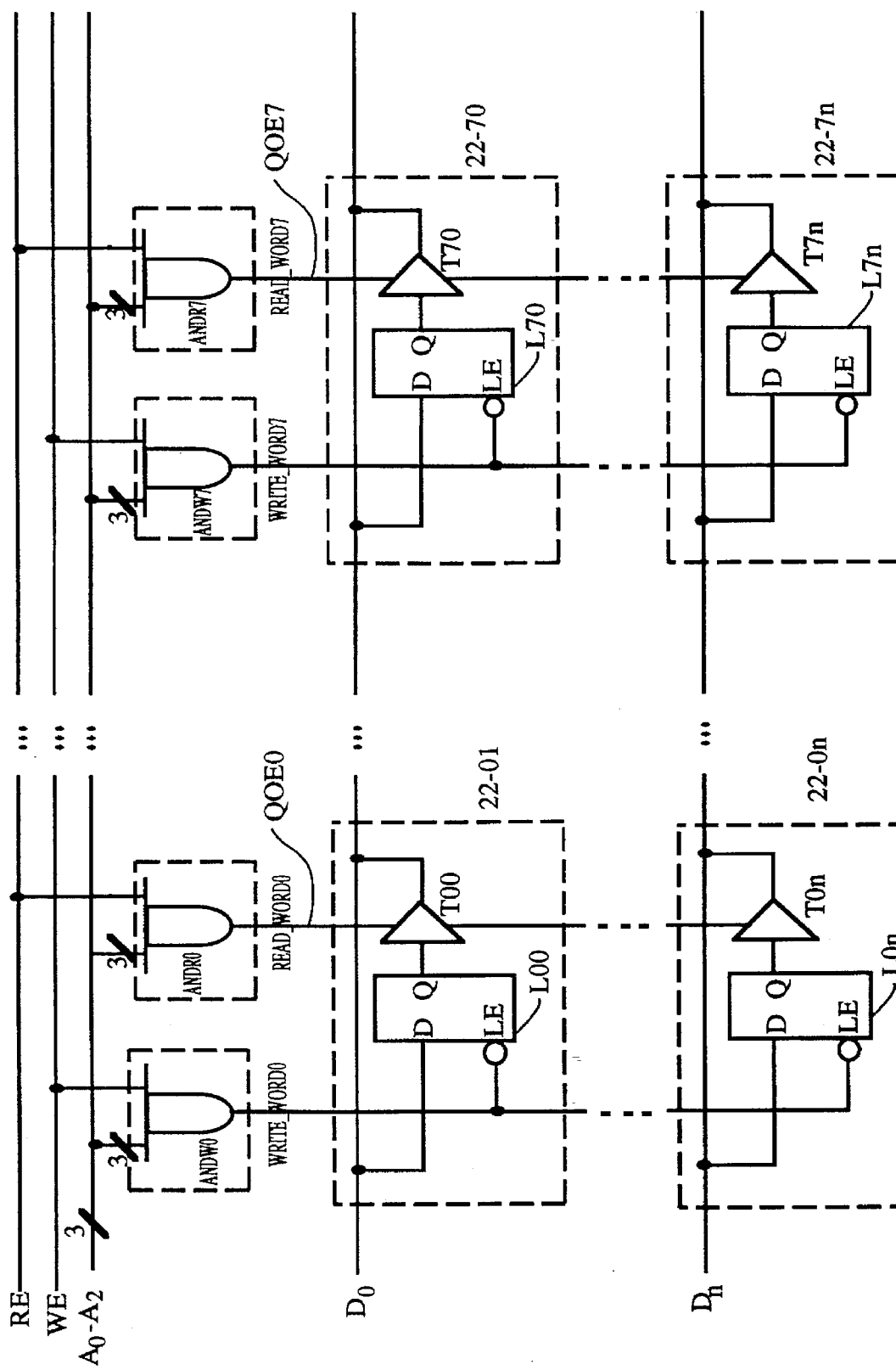
FIG. 22 shows a register file having read and write control lines and data lines constructed using an array of circuits of FIG. 3.

An example of the usefulness of this feature is a register file. FIG. 22 shows a register file having read and write control lines and data lines. One 5-bit bus carries three address lines $A_0$–$A_2$, one write enable line WE, and one read enable line RE. FIG. 22 represents 8 columns of cells, columns 0 through 7 for storing 8 words. In this case three address bits $A_0$–$A_2$ address the eight columns. AND gates ANDW0 through ANDW7 in the eight columns are each programmed to decode different addresses. (See FIGS. 11A–11C and 12A–12C for discussion of configuring a cell as an AND gate and inverting selected inputs.) In response to a high WE signal and an address matching that programmed into AND gate ANDW0, output of AND gate ANDW0 on output line WRITE_WORD0 enables data on lines $D_0$ through $D_n$ to be written into respective latches L00 through L0n. The grouped 3-stating capability is useful for the reading operation. For reading, 3-state buffers T00 through T0n are controlled by the signal READ_WORD0 and, in response to a high READ_WORD0 signal, place data from latches L00 through L0n onto data lines $D_0$ through $D_n$. The QOE feature allows both the latch and the tristate buffer to be implemented in a single logic cell.

The circuit of FIG. 22 can be effectively implemented with the cell of the present invention using the high impedance buffer control unit 349 of FIG. 18A. A cell such as shown in FIG. 18A will be called one logic cell. Each latch and its 3-state output buffer is implemented in one logic cell. Each write enable gate ANDW0 through ANDW7 is implemented in one logic cell and each read enable gate ANDR0 through ANDR7 is implemented in one logic cell.

To implement such a circuit, antifuses in the interconnect structure are programmed to form the lines shown in FIG. 22. The AND gates are formed as discussed above in connection with FIGS. 11A and 11B. The latches are formed as discussed in connection with FIG. 9B.

Making use of one of the 3-state output controls of FIG. 18, namely the QOE signal, 3-state output buffers T00 through T7n of FIG. 23 are implemented.

Detail of Global Reset Stage 350

Stage 350 comprises series transistors including global reset transistor 351, transistor 352, and NOR gate 353. A global reset signal GRST is provided to every cell, and will be received regardless of the configuration of the cell. The selectivity comes from controlling transistor 352 from the same configuration control unit which controls whether feedback will be provided, that is, the control unit which controls whether the latch feature of the cell will be used. Only when the cell is used as a latch will a reset signal be applied to line 332. Further, even if the cell is being used as a latch, the master or slave which is not in the latched mode does need to be reset to override the current value. If a global reset signal were received when the clock signal was causing line 332 to receive the D input signal provided on line A1, and the D input signal were logical 1, a contention between the pull-up provided by combinational stage 330 (a logical 1) and the pull-down provided by reset stage 350 connecting line 332 to ground (the reset signal) would draw high current during the time the reset signal is present. Thus it is not desirable to provide a reset signal when line 332 is forwarding the D input signal. In a D flip-flop comprising two connected D latches (as in FIG. 13B), at a given clock level, one latch will be transparent while the other will be latching. The GRST signal will reset only the latch which is in its latched state (when the output of optional inverter 302 is low). When the master (FIG. 13B, cell 7a) is latched, it will be reset, and this low value will propagate through the transparent slave to the output. When the slave (FIG. 13B, cell 7b) is latched, it will be reset, causing the output to go low. Thus in the cell of FIG. 3, when the cell is in the feedback (latch) configuration, a logical 1 GRST signal to all transistors 351 of the array allows circuit 350 to pull line 332 to ground in those cases where reset is necessary and not when unnecessary or when power drain would be high. NOR gate 353 assures that transistor 352 turns on only when necessary, and thus a selective reset for latch and flip flop configurations is achieved.

The global reset signal is preferably applied to transistor 351 adjacent line 332 because during most of the operation of the circuit, the global reset signal is off (logical low), and the capacitance added by circuit 350 is only that of one source/drain region of transistor 351.

Configuration Control Unit, First Embodiment

Figure 24A:
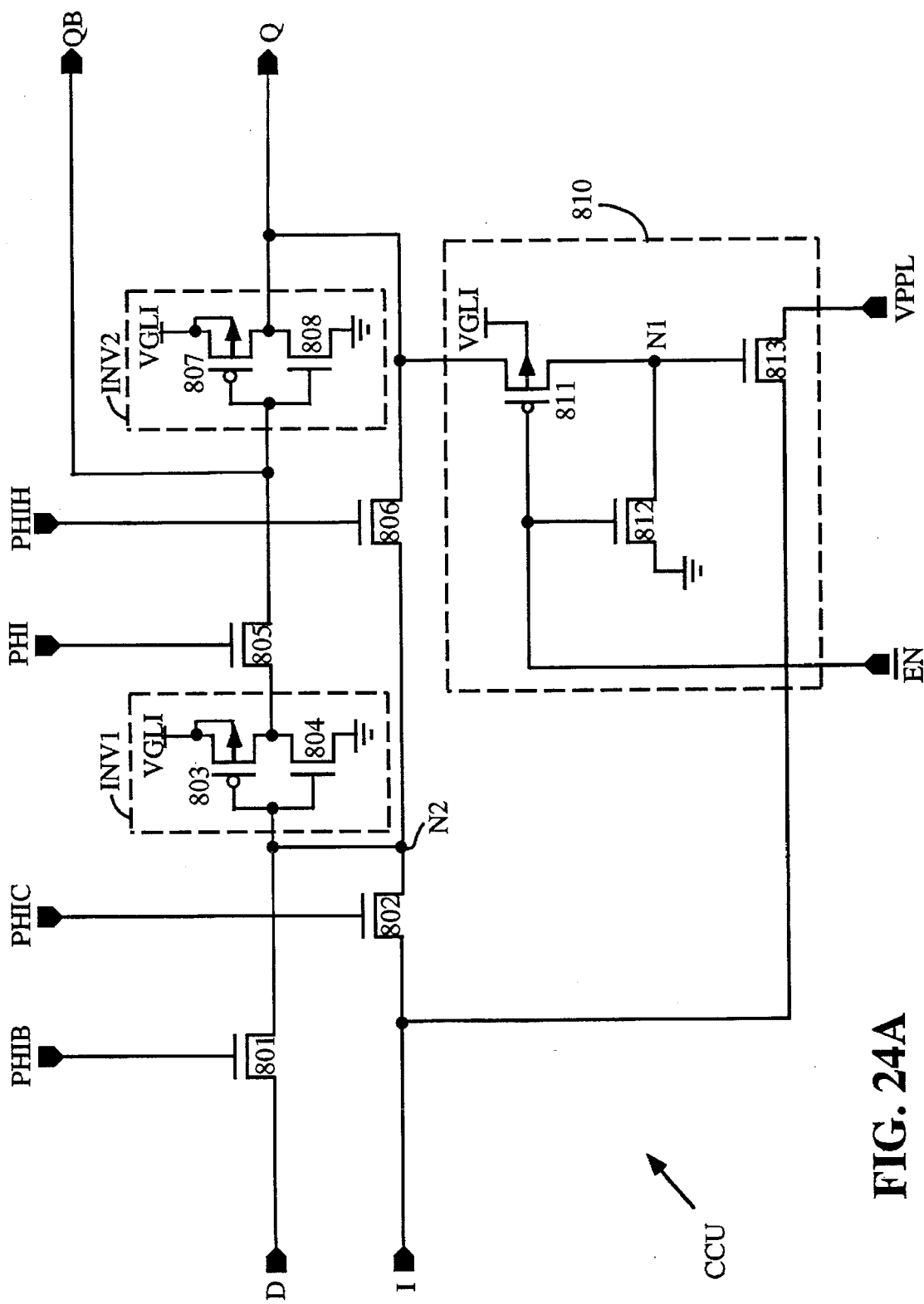
FIGS. 24A and 24B show two implementations of the configuration control units such as CCU1 through CCU7 of FIGS. 3 and 4.

FIG. 24A shows a configuration control unit CCU such as CCU1 through CCU7 used with the cell of FIG. 3 or FIG. 18. In a preferred embodiment these configuration control units serve three purposes:

(1) holding configuration information for configuring the logic cell, (2) capturing data on status of interconnect lines for testing purposes, and (3) applying programming voltages for programming antifuses in the interconnect structure.

These three uses of the CCU of FIG. 24A will now be explained.

Holding Configuration Information

This first function, holding information for configuring a cell, was discussed above in connection with FIGS. 5A–11B. Many different cell configurations can be achieved by simply placing appropriate 1's and 0's into particular CCUs shown in FIG. 3 of FIGS. 18A and 18B.

In a first embodiment, the CCUs of FIG. 3 or FIGS. 18A and 18B are each formed as shown in FIG. 24A. Each CCU comprises a pair of inverters INV1 and INV2, which can be connected together as a latch by turning on transistors 805 and 806 with high PHI and PHIH signals, and turning off transistors 801 and 802 with low PHIB and PHIC signals. A long string of CCUs, each as shown in FIG. 24A, are connected into a shift register by connecting the D input of one CCU to the Q output of another CCU. In addition to the Q output of one CCU being connected to the D input of another CCU, the Q and $\overline{Q}$ outputs of the CCU drive other parts of the cell, as particularly shown in FIGS. 18A and 18B.

Shifting Configuration Information into Device

To shift configuration information into an integrated circuit chip of which the cell of FIGS. 18A and 18B is a part, the chip is first flushed to assure that all CCUs hold logical 0. By applying high signals PHI and PHIB to all transistors 801 and 805 in the shift register, and applying logical 0 to the first D input of the first cell in the shift register, the entire shift register is set so that all Q outputs are logical 0 and all $\overline{Q}$ outputs are logical 1. Next, a sequence of configuration bits is shifted through the register by alternately turning on transistors 801 and 805 with non-overlapping high signals PHIB and PHI, with a new configuration bit entered at the D input of the first cell each time PHIB is high. During this shifting operation, low signals on PHIC and PHIH maintain transistors 802 and 806 off. When configuration data have been shifted into position, a low signal PHIB holds transistors 801 off, while high signals PHI and PHIH latch each configuration bit into its respective CCU in a static latch configuration, inverters INV1 and INV2 being connected together through transistors 805 and 806 into a static RAM cell. Each configuration bit is then available to drive appropriate nodes in the respective cell of FIG. 3 or FIGS. 18A and 18B. Seven configuration bits in the seven CCUs of one cell establish the selected configuration of the cell. The above shift register operation is also discussed in U.S. Pat. No. 4,870,302, incorporated herein by reference.

Circuit 810 of FIG. 24A comprising transistors 811, 812, and 813 and signals Q, $\overline{EN}$ and VPPL is discussed below in the section on programming antifuses. Signal I is discussed below under the section on interconnect signal capture.

Interconnect Signal Capture

It may be desirable, especially for testing and diagnosis, to examine the signals present in portions of the chip after the chip has been configured and operating for some time. The second function of the CCU of FIG. 24A is to capture the signal present on that piece of interconnect to which the CCU is connected. As discussed above, collectively the CCUs of an array are formed as one or a few shift registers. In addition to shifting in configuration information, the CCUs can shift out information which has been captured from the interconnect line. Thus the CCUs can allow a user to examine the signal on each line which is connected to a CCU. And every signal line which provides input to one of the logic cells in the array or receives output from one of the cells of the array is in fact connected to a CCU.

Looking at FIGS. 18A and 18B, for example, signals Z1, Z2, and A1 through A4 are all input signals to the cell depicted in FIGS. 18A and 18B. A sequence of steps allows the interconnect line data to be transferred into the CCUs. The sequence of steps allows the value on line I to be substituted for the value which has been stored by INV1 and INV2 in the CCU. During capture, signal $\overline{EN}$ is high, so all programming transistors 813 are off, regardless of the states of INV1 and INV2.

Timing Diagram

Figure 25:
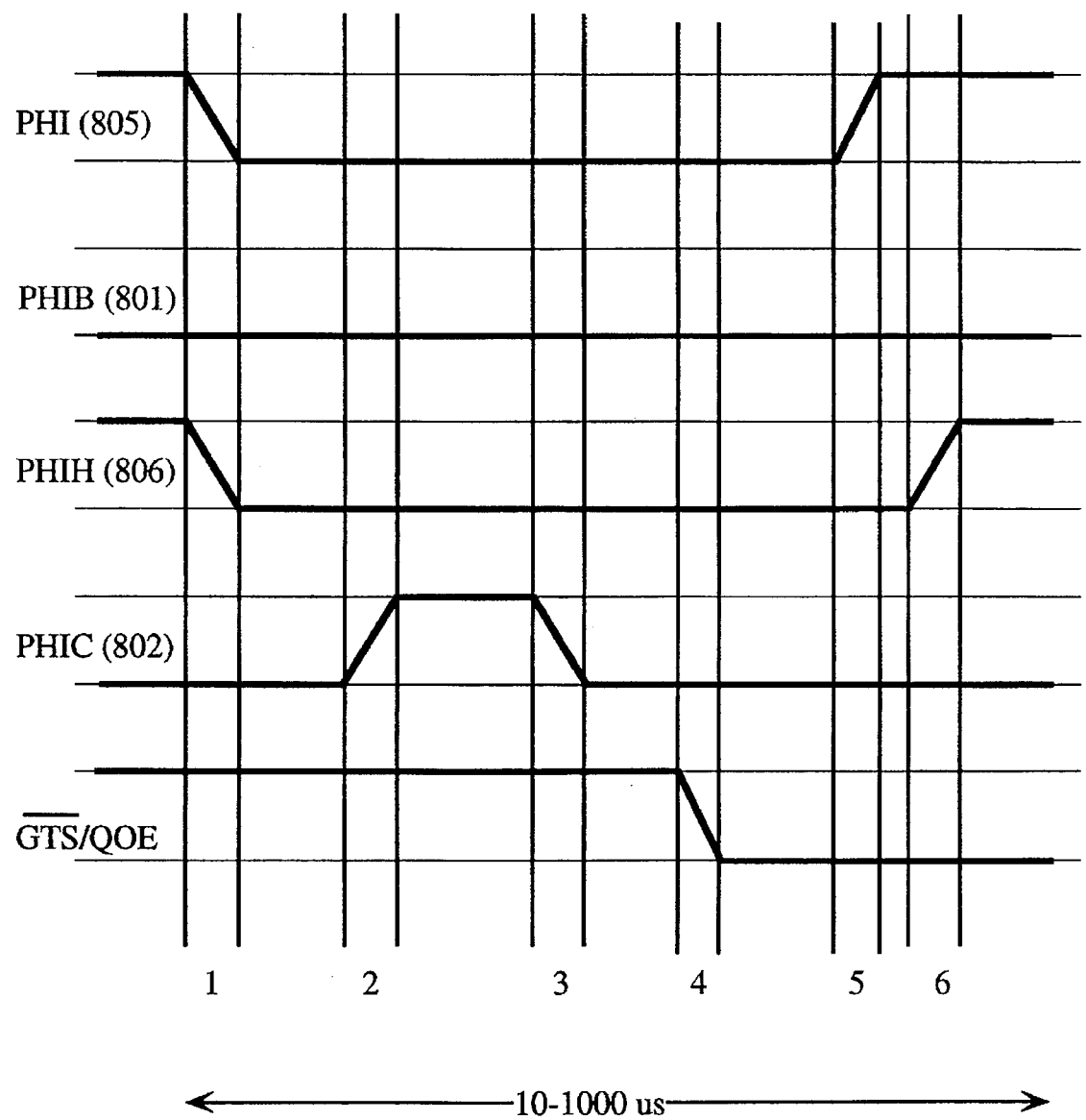
FIG. 25 shows a timing diagram when the circuit of FIG. 24A or 24B is used to capture data present on the interconnect structure for shifting out to an external device.

FIG. 25 shows a timing diagram of a preferred order of controlling signals PHI, PHIH, PHIB, PHIC and GTS (The GTS signal appears in FIG. 23 and a high GTS signal can be seen to force QOE low) in order to reliably capture the signal from an interconnect line I into a CCU without causing loss of data or contention in any parts of the array. The capture steps are as follows:

1. Bring down PHI and PHIH, turning off transistors 805 and 806, so the CCU is temporarily put into a dynamic memory state (that is, a state in which the values will only be retained temporarily). Capacitance is such that the value can be retained on the order of a millisecond, and the preferred timing is such that the cell will be held in its dynamic state on the order of 1 microsecond.

2. Next, transistor 802 is turned on with a high PHIC signal, so that the signal on interconnect line I (which can represent interconnect segments A1 through A4, Q, Z1, Z2 in FIG. 27) is applied to inverter INV1. Since transistor 806 is off, there is no contention between the dynamic signal on I being applied to inverter INV1 and the signal Q which is still (temporarily) stored in the CCU.

3. Once the signal is captured, PHIC may be brought low, turning off transistor 802. The state of signal I is now stored dynamically on node N2.

4. Since the cell configuration will soon be overwritten by the captured data, and contention between certain cell outputs could occur, all outputs of the cells of FIG. 3 or FIG. 4 are brought to a high impedance condition. In one embodiment this is accomplished by applying globally a low QOE signal via assertion of GTS in the circuit of FIG. 23, which causes NAND gate 346 to output a high signal, which turns off transistors 343 and 344, as discussed earlier. This action disconnects all interconnect lines from the signals which have been driving the lines, so that these lines are now in a dynamic state, with signals which will last only briefly. High impedance of output signals must occur before transistor 805 is next turned on by a high signal PHI.

5. After the corresponding interconnect signal has been applied to INV1 and cell outputs have been brought to high impedance, a high signal PHI is applied and transistor 805 is turned on, and thus the captured I signal (inverted) is applied to INV2.

If not done earlier, transistor 802 is turned off by bringing PHIC low, isolating the CCU from the interconnect I.

6. PHIH is then brought high, turning on transistor 806, and latching the signal which was on I into the static memory cell formed by INV1, 805, INV2 and 806.

At this point, the CCUs of the array no longer contain configuration information, but instead contain the signals present on their respective interconnect line segments. Since the CCUs are connected into a shift register, the signals may be shifted out using the same sequence as described above for shifting the configuration signals in. As interconnect data are being shifted out, configuration data are simultaneously shifted into position to again reconfigure the cell. Alternately, the shifting out of interconnect information and shifting in of configuration information may be done in separate steps.

Programing Antifuses

Figure 27:
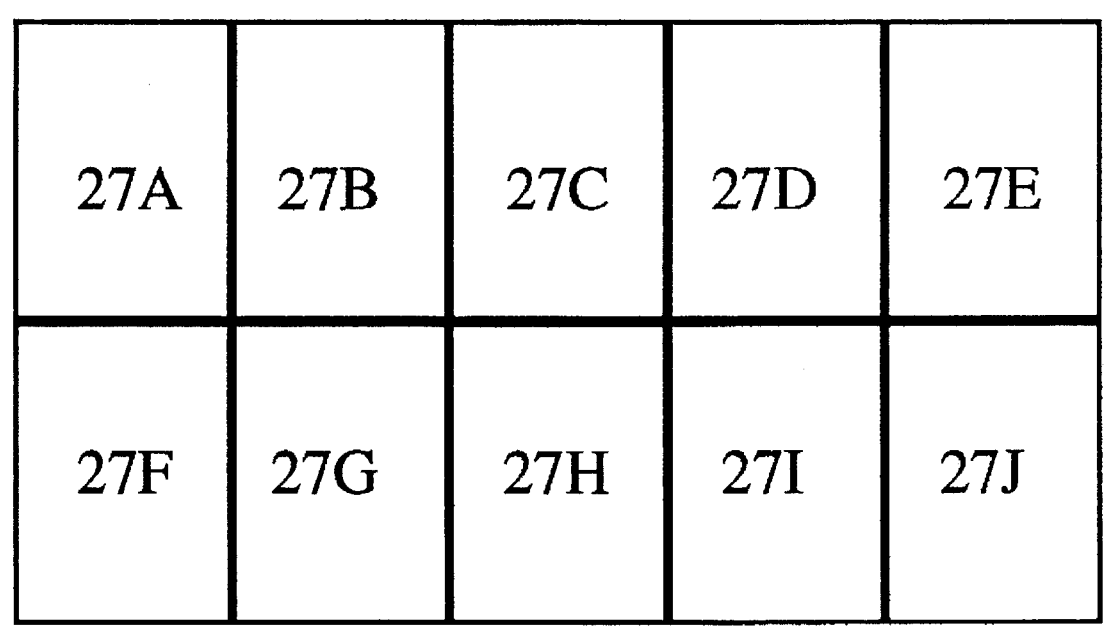

Configuration of a chip requires that not only are the cells configured to perform the desired function, but that the interconnect structure is also programmed to interconnect the cells to each other as desired. In the embodiment of FIG. 27, the interconnect structure is interconnected by programming (making conductive) selected antifuses to connect selected horizontal lines to selected vertical lines.

Figure 24B:
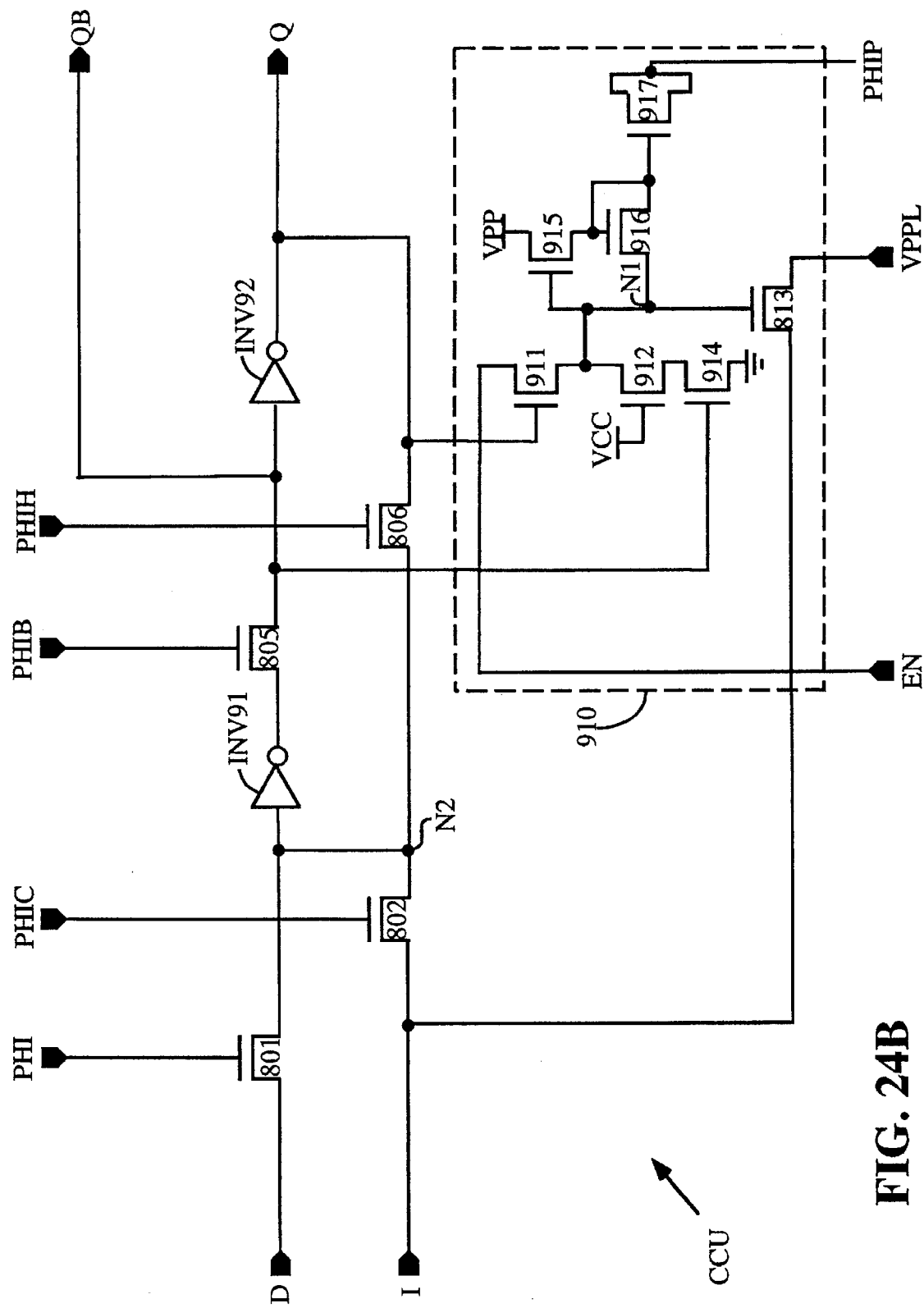
Figure 24C:
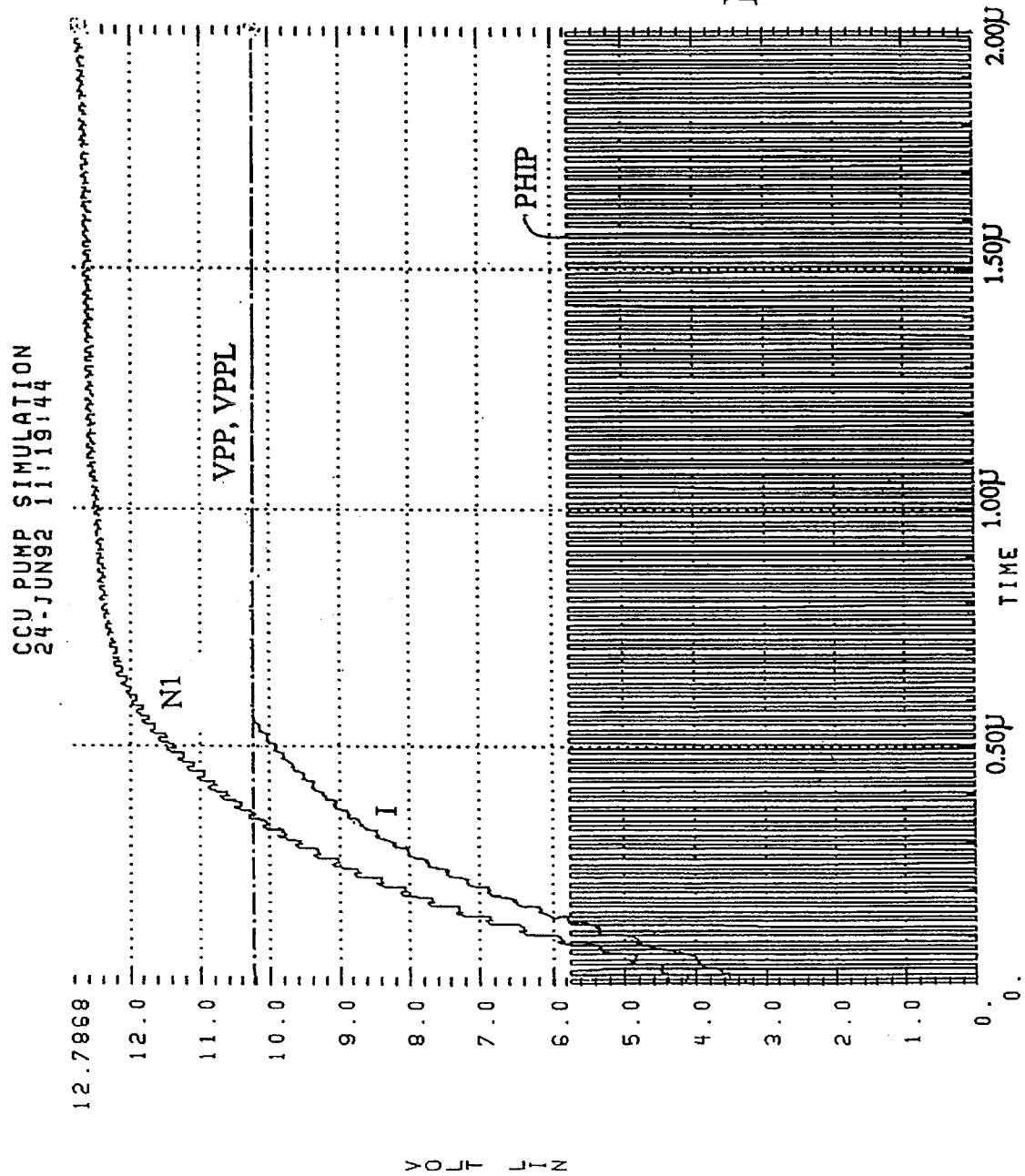
FIG. 24C shows a simulation of the circuit of FIG. 24B.

The context of antifuse programming will first be explained. FIG. 27, which comprises FIGS. 27A through 27J, represents one cell block, comprising 4 cells CELL__1 through CELL__4 positioned at the top of the block, 4 cells CELL__5 through CELL__8 positioned at the bottom of the block, and a ninth cell CELL__9 positioned along the right margin of the block. Cells CELL__1 through CELL__8 are as shown in FIG. 3 or FIGS. 18A and 18B. The ninth cell CELL__9 comprises 14 CCU cells such as shown in FIG. 24A or 24B. Additional horizontal lines extending through cell CELL__9 are horizontal interconnect lines of various lengths available for forming paths between logic cells of the array. FIG. 4 represents such an array. In FIG. 27, at intersections of horizontal and vertical lines are antifuses, represented in FIGS. 27A through 27J by half-darkened circles.

Note that certain intersections do not include an antifuse. This occurs in the embodiment of FIG. 27 because the preferred embodiment includes antifuses formed between metal 2 and metal 3 layers, and these antifuses are therefore positioned above other structures in metal 1, polycrystalline silicon, and the semiconductive substrate. The intersections which do not show antifuses are located above positions where a via is formed between metal 2 and metal 1, where the resulting irregularity prevents the proper and reliable formation of an antifuse.

Figure 26:
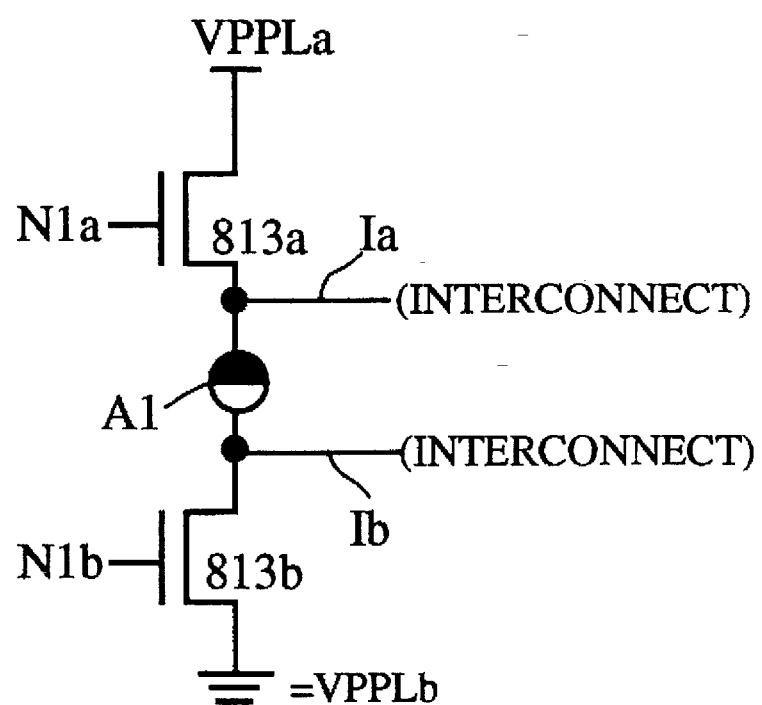
FIG. 26 represents an antifuse programming structure used in an array such as shown in FIG. 4, which uses logic cells such as shown in FIG. 3.

An antifuse is programmed by applying two sufficiently different programming voltages to one horizontal line and one vertical line intersecting at the antifuse. FIG. 26 shows a simplified representation of the antifuse programming path created by two circuits shown in FIG. 24A. When two different CCU units (see FIGS. 24A and 24B) apply sufficiently different values of VPPL to their respective interconnect lines I, the voltage difference applied across an antifuse in the interconnect structure is sufficient to program the antifuse. FIG. 26 shows antifuse A1 which is programmed by applying a first programming voltage VPPLa through transistor 813a as controlled by a voltage on node N1a (equivalent to node N1 in FIGS. 24A or 24B) to interconnect line segment Ia which contacts one terminal of antifuse A1. A second programming voltage VPPLb, shown as ground, is applied through transistor 813b to interconnect line Ib, which contacts the other terminal of antifuse A1. The voltage difference, for example 10 volts, is sufficient to program antifuse A1. A high impedance or an intermediate voltage applied to all other horizontal and vertical lines assures that at one time only a single antifuse receives sufficient voltage for programming.

First Embodiment Antifuse Programming Unit 810

Application of the programming voltages to the two terminals of an antifuse is controlled from circuit 810 of FIG. 24A. By shifting a pair of logical 1's through the shift register including inverters INV1 and INV2 only to the two CCUs which contact the interconnect lines I which cross and therefore contact the antifuse to be programmed, then applying different voltages to the two lines VPPL which connect to the two interconnect lines I, and then applying a low enable voltage $\overline{EN}$, the programming voltage will be applied across the addressed antifuse.

Thus the first step in programming an antifuse is to shift a pair of logical 1's into their respective CCUs.

In order to program the selected antifuse, transistor 813 connects a programming voltage source VPPL to an interconnect line. Two different programming voltage sources must be connected to the two different terminals of the antifuse. Therefore two different VPPL lines are connected to the CCU's which contact the horizontal and vertical interconnect lines. Different programming voltages are applied to these two different VPPL lines. In one embodiment, the two programming voltages differ by about 10 volts.

After the two logical 1's representing the two terminals of the antifuse to be programmed have been loaded through the shift register into their respective CCUs, the global signal $\overline{EN}$ is brought low, which turns off N-channel transistor 812 and turns on transistor 811, a P-channel transistor with a well at the VGLI voltage. The VGLI voltage should be at least one threshold drop $V_t$ above the higher programming voltage VPPL so that transistor 813 will not cause a voltage drop for this high programming voltage. The low $\overline{EN}$ voltage is applied to all CCUs in the chip, turning on transistor 811 and turning off transistor 812. All CCUs except those related to the antifuse to be programmed carry a logical 0, or low voltage, so most transistors 813 will remain off when the Q output voltage is applied to the gate of transistor 813. For the two CCUs storing a logical 1, the high voltage provided by transistor 811 to the gate of 813 turns on 813, causing the VPPL voltage to be applied to interconnect I. For these two CCUs, one of the VPPL signals is a high programming voltage and one is low, so that the related antifuse experiences the high voltage difference, and becomes permanently conductive. After a short programming period, on the order of several milliseconds, $\overline{EN}$ is again brought high, turning off transistor 811, turning on transistor 812, and therefore turning off programming transistor 813.

The above process of loading the shift register and applying the programming voltage difference is repeated for every antifuse to be programmed.

External Voltage Supply

As a novel feature, in the embodiment of FIG. 24A, during antifuse programming, inverters INV1 and INV2 can be powered with a programming supply voltage on VGLI, preferably greater than an antifuse programming voltage by one threshold voltage. This higher VGLI voltage level is applied to transistor 811 if a logical 1 is provided on the Q output of inverter INV2. If signal $\overline{EN}$ is a low voltage, transistor 811 is on, and voltage VGLI turns on transistor 813, and allows transistor 813 to pass the high programming voltage VPPL to interconnect line I without a threshold voltage drop.

Configuration Control Unit, Second Embodiment

FIG. 24B shows a second embodiment of a configuration control unit employing a charge pump. In this embodiment, circuit 910 conditionally applies the programming voltage VPPL to the gate of transistor 813, as determined by the states of the Q and $\overline{Q}$ signals and the EN signal.

Circuit 910 includes a well known charge pump consisting of transistors 915, 916, and 917 (configured as a capacitor). An oscillating waveform on signal PHIP serves to inject charge onto node N1. The voltage on node N1 reacts to this charge injection and to the states of transistors 911, 912, and 914, which are controlled by the EN, Q and $\overline{Q}$ signals. As outlined in Table I, only when Q and EN are both logical 1 is N1 allowed to charge up.

TABLE I

| Q/Q̄ | EN | 911 | 912 | 914 | N1 | 813 |
| --- | --- | --- | --- | --- | --- | --- |
| 0/1 | 0 | off | on | on | held to ground by 914, 912 | off |
| 1/0 | 0 | on | on | off | held to ground by 911 | off |
| 0/1 | 1 | off | on | on | held to ground by 914, 912 | off |
| 1/0 | 1 | off | on | off | allowed to charge to VPPL + Vt | on |

Use of the circuit in FIG. 24B for programming interconnect is achieved by holding EN low while shifting a data pattern through the CCUs. With EN low, transistor 813 is off regardless of the state of Q/Q̄. A low EN signal provides a means to shift data without inadvertently turning on transistor 813. The data pattern typically consists of all 0's except for two 1's corresponding to the two interconnect segments to be connected through an antifuse. Once the data pattern is in place, EN is brought high, allowing the CCUs (typically two) with a high Q state to charge up node N1 and turn on transistor 813. This transfers the programming voltage VPPL to the selected interconnect line connected to node I of FIG. 24B. When programming is completed, EN is again brought low, discharging node N1. This process is repeated for each antifuse to be programmed.

Transistor 912 is included for electrical, not logical considerations. This transistor works in conjunction with transistor 914 to provide a pull-down of node N1 and avoids subjecting any transistor in circuit 910 to a condition known as grounded-gate breakdown. Grounded-gate breakdown occurs when the gate and source of a transistor are held at ground, and the drain voltage is increased to the point of breakdown. Due to the electric field around the gate, the drain-to-substrate junction begins to break down at a voltage less that an identical junction without the gate field. By including transistor 912 with its gate tied to VCC (5 volts) rather than ground, this effect is decreased, and a higher voltage can be tolerated on node N1. This increased N1 voltage applied to the gate of transistor 813 eliminates any threshold drop between nodes VPPL and I. It also facilitates decreased channel resistance of transistor 813, which increases the programming current, translating into decreased antifuse resistance and interconnect delays.

The Cell Block of FIG. 27

FIGS. 27A through 27J include certain features not previously discussed.

QOE Signal $I_i$ of FIG. 23

It was previously stated in connection with FIG. 23 that signal $I_i$ was taken from an interconnect line. The particular pieces of interconnect line to which circuits such as shown in FIG. 23 are connected are shown in FIG. 27. Line TOPDBL in FIG. 27E and line BOTDBL in FIG. 27J supply signals which are labeled $I_i$ in FIG. 23. The corresponding QOE output signals are placed on lines TOPQOE and BOTQOE respectively.

CCUs of Cell_9

Figure 27A:
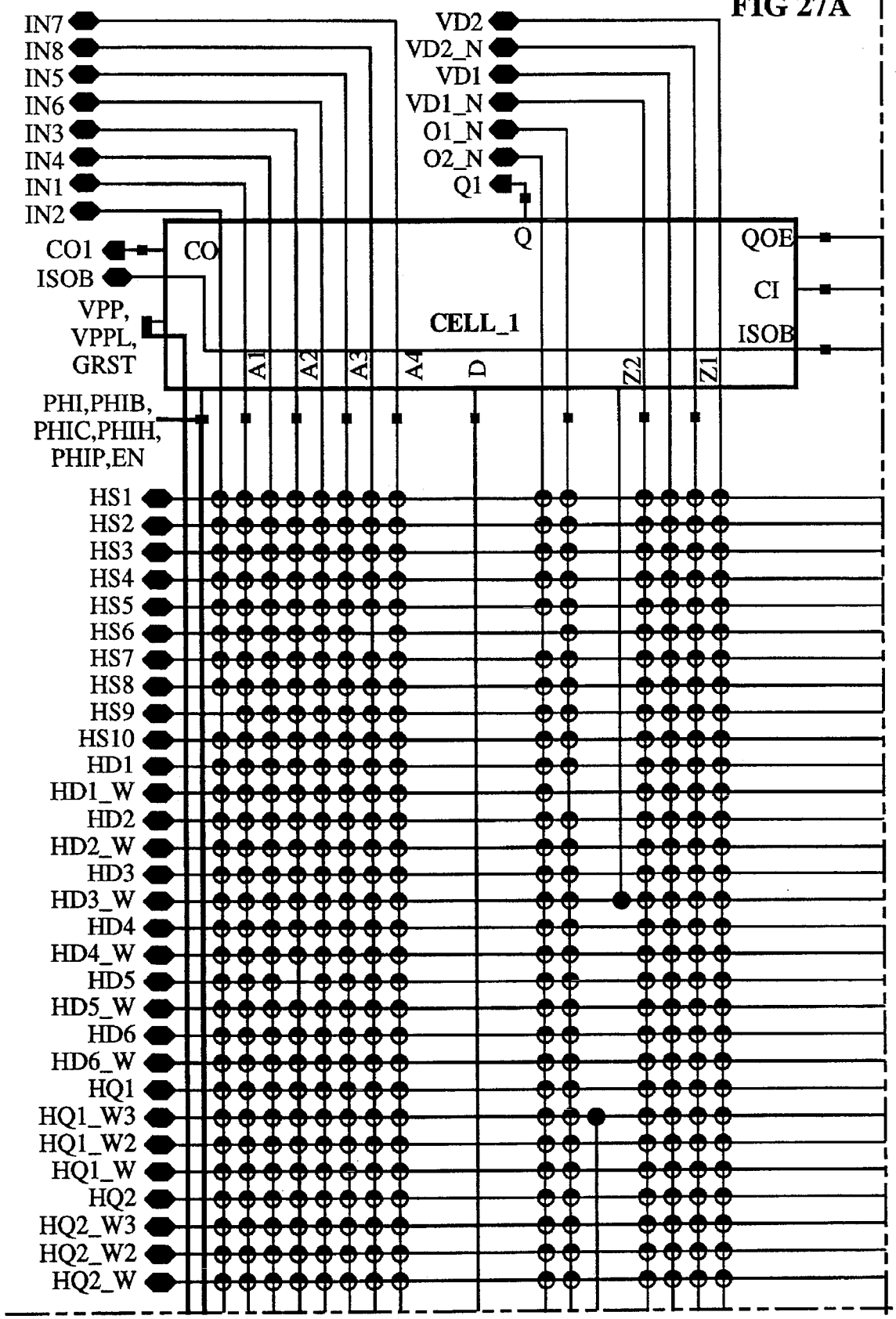
FIGS. 27A through 27J, shows a logic block using eight cells of the present invention in combination with an antifuse interconnect structure.
Figure 27B:
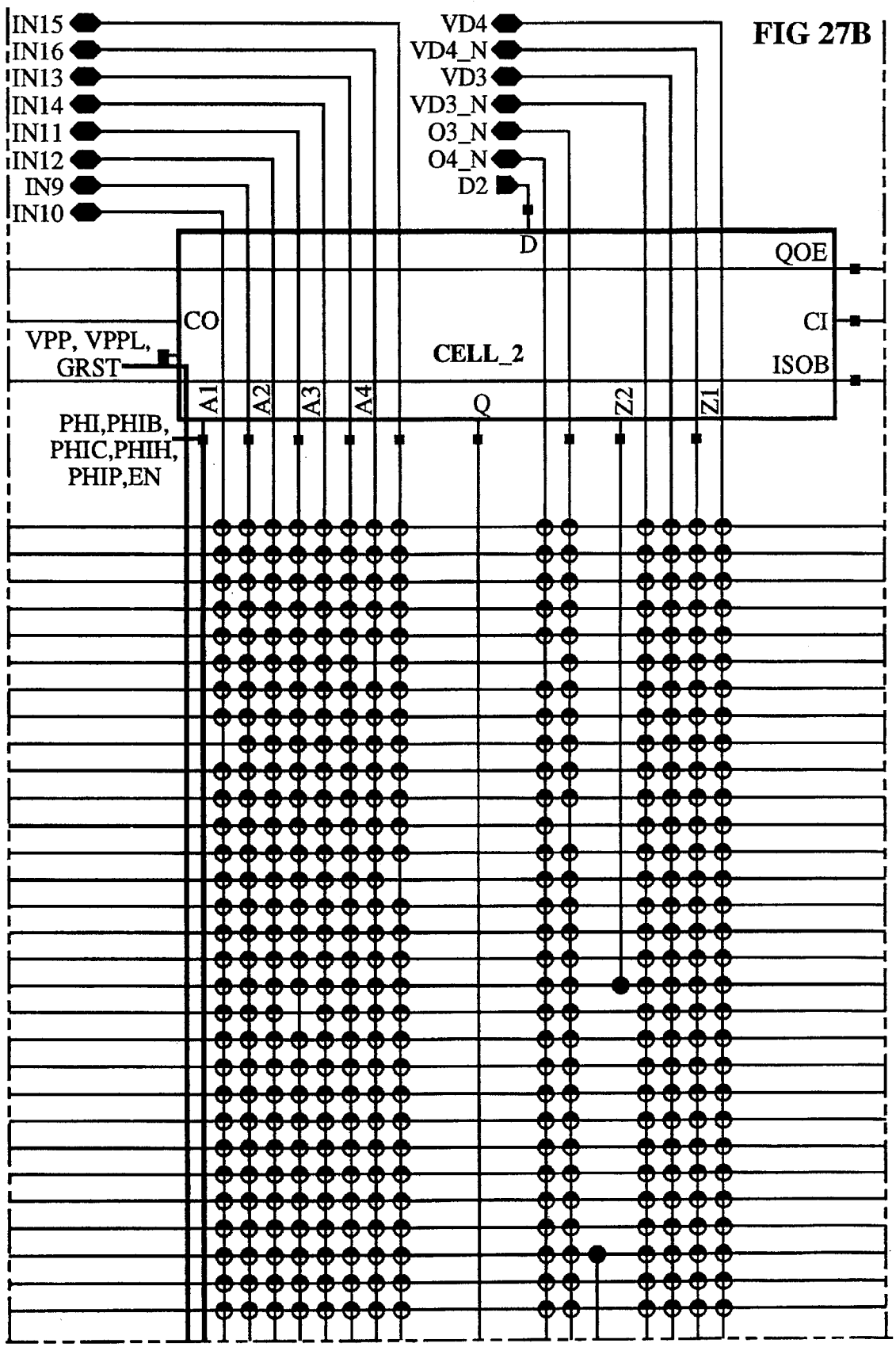
Figure 27C:
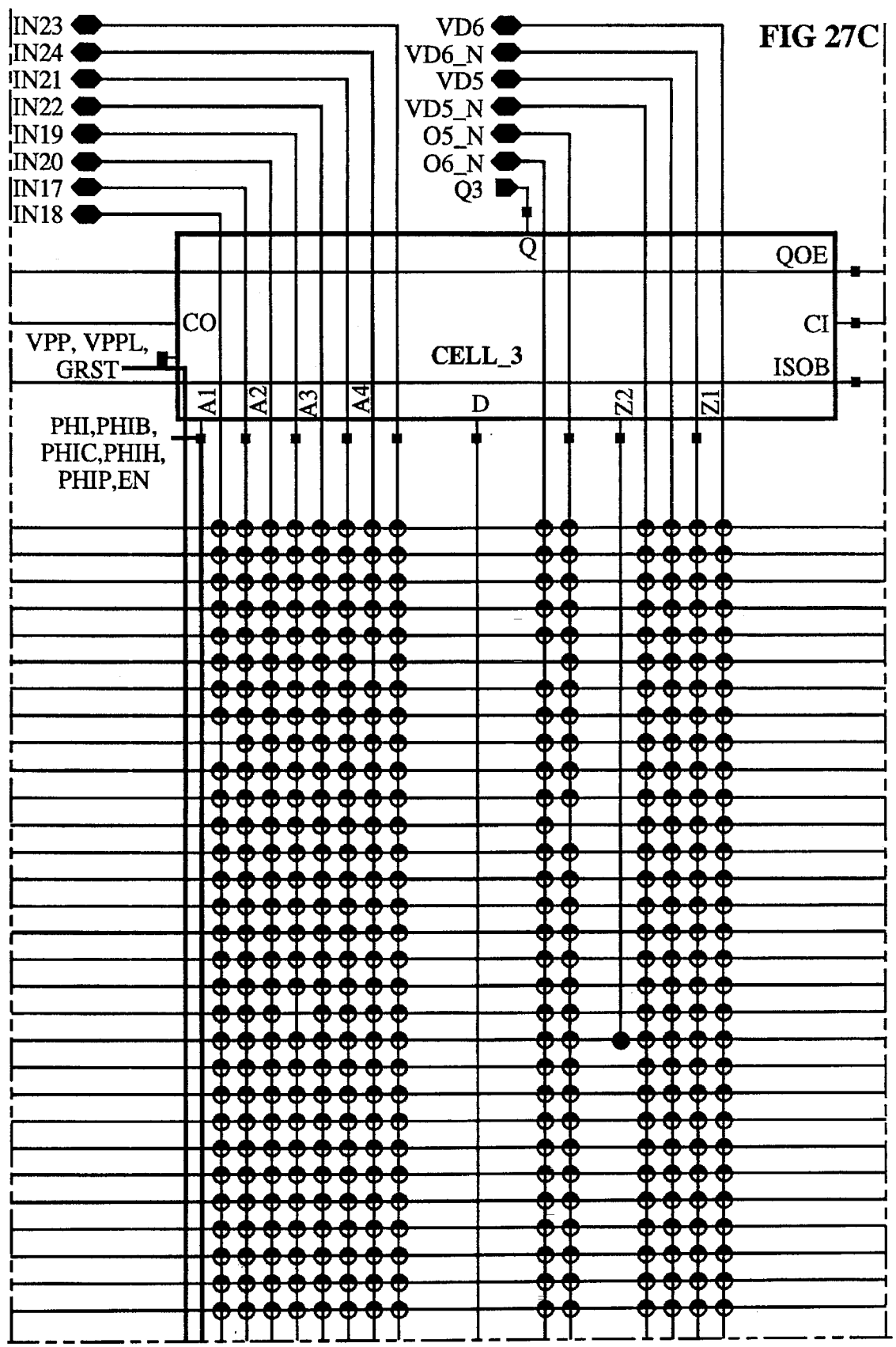
Figure 27D:
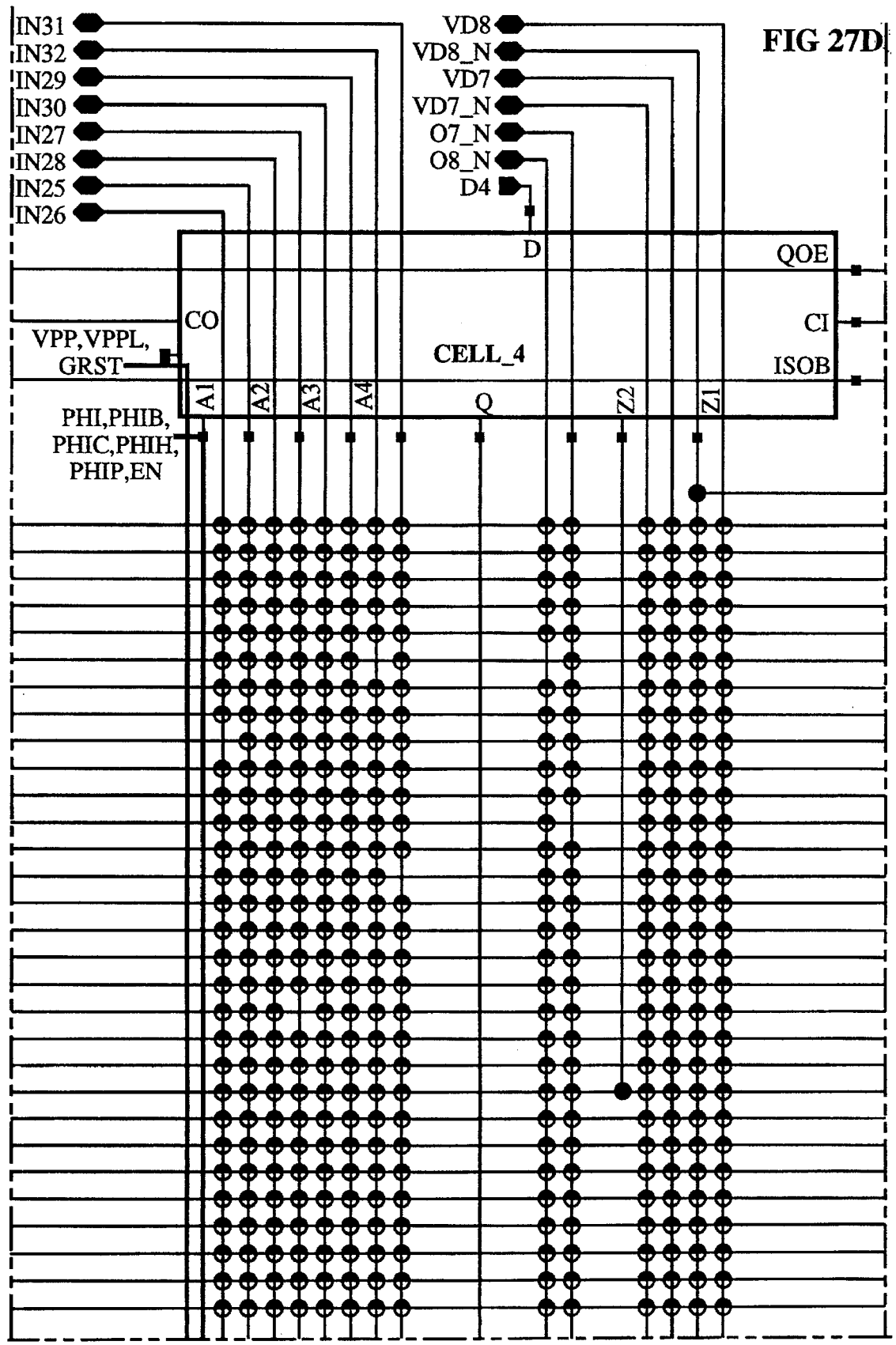
Figure 27E:
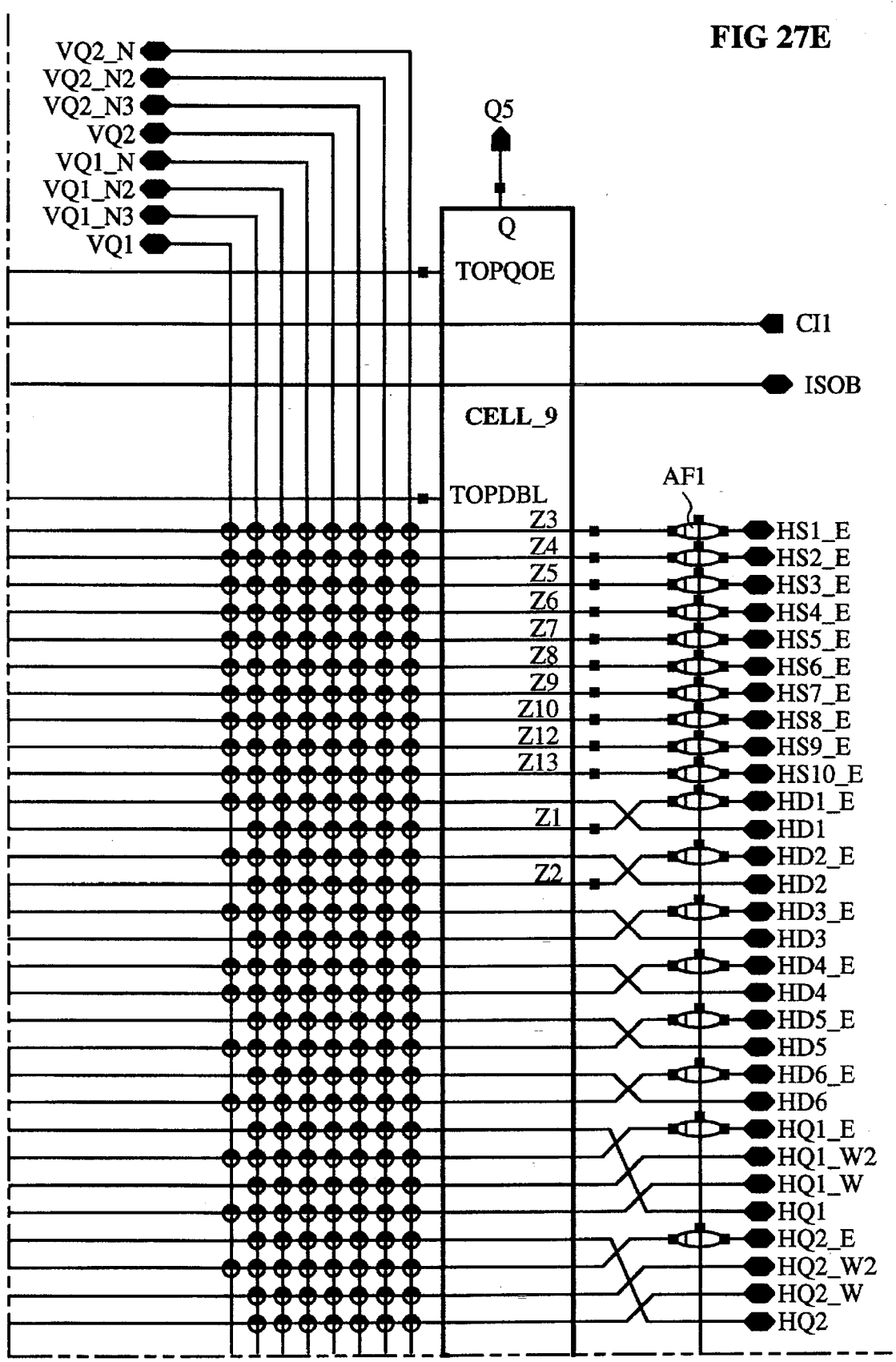
Figure 27F:
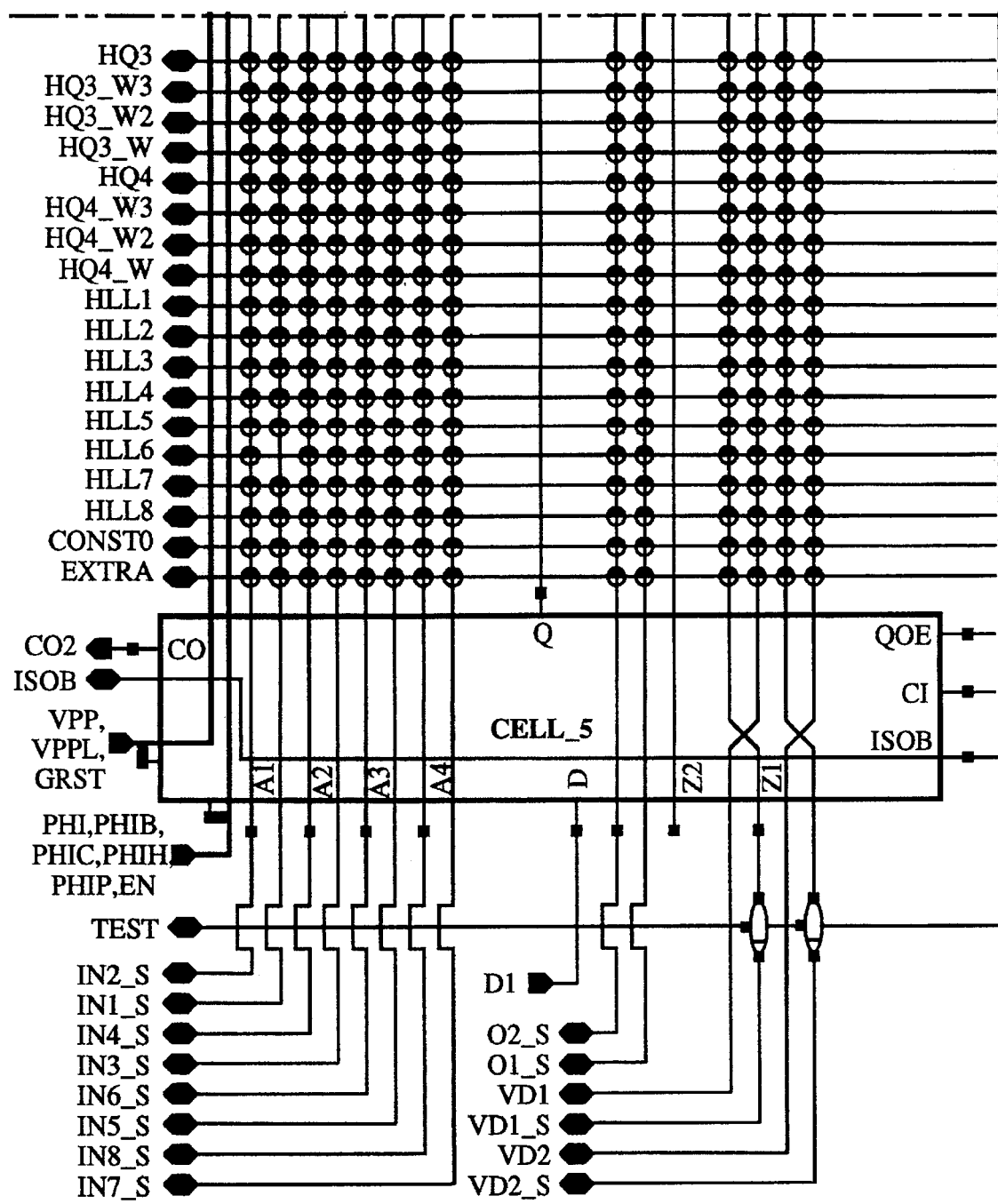
Figure 27G:
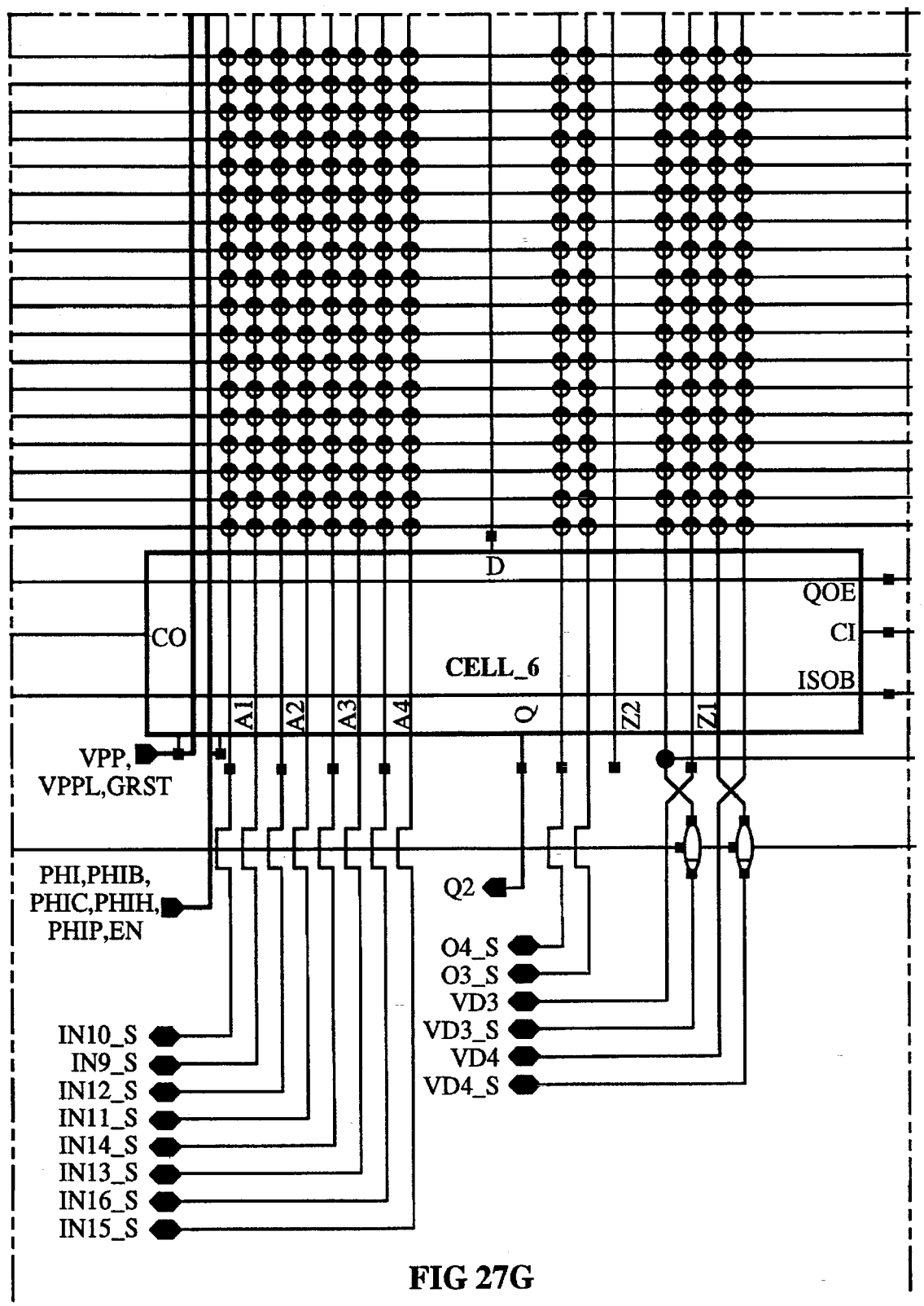
Figure 27H:
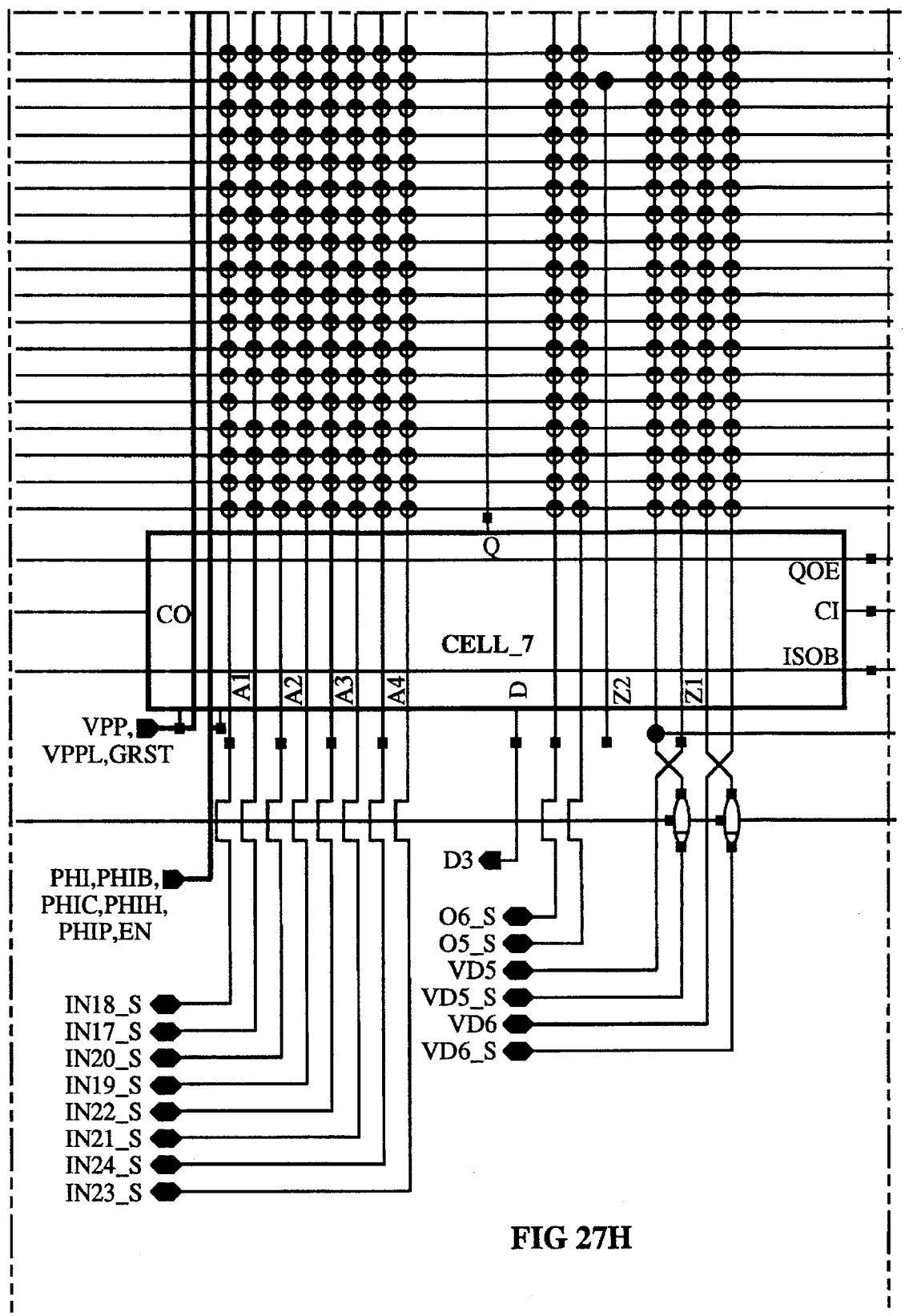
Figure 27I:
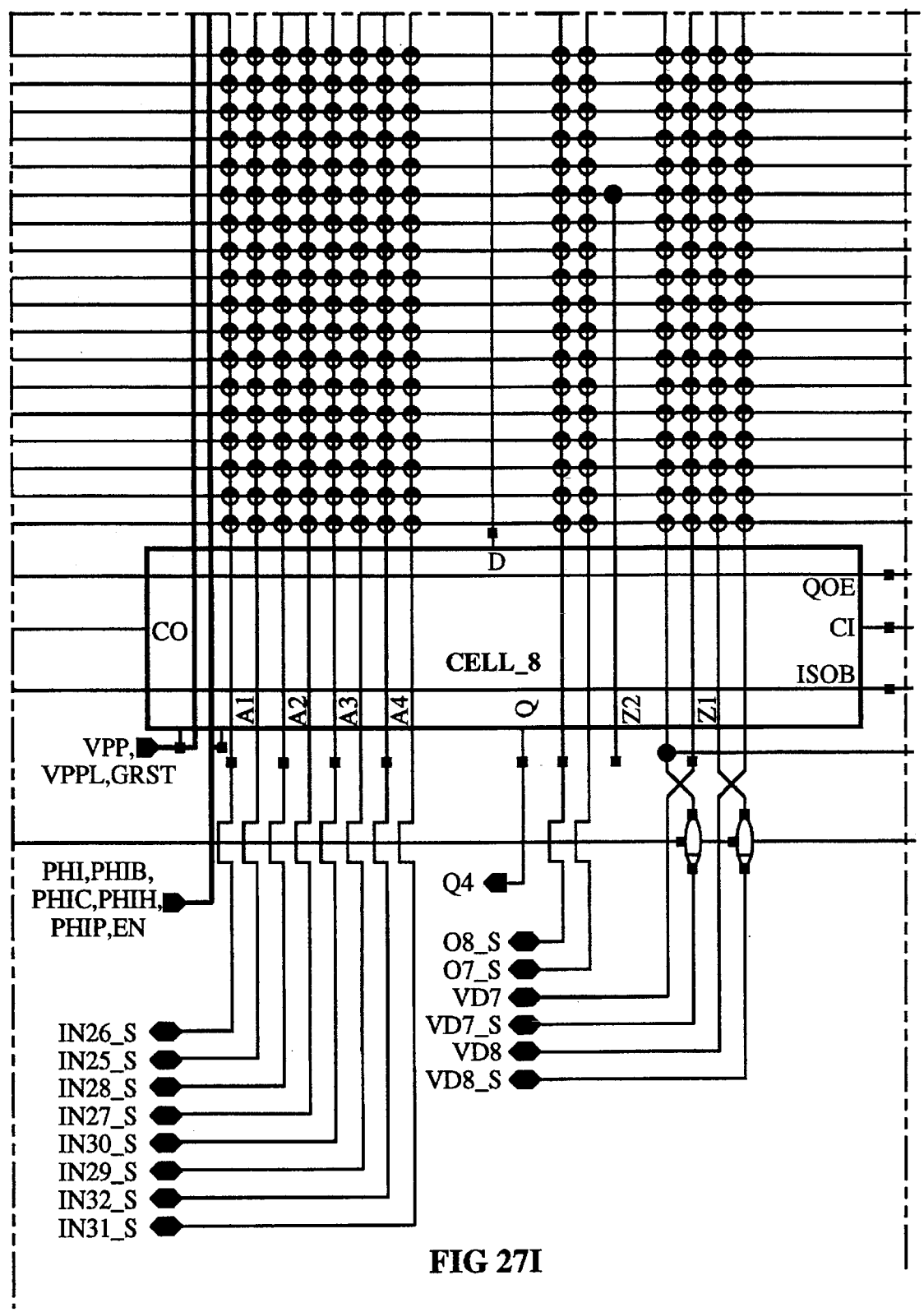

As mentioned earlier, CELL_9 of each cell block includes a plurality of CCUs. These CCUs are used for applying voltage to and reading voltage from corresponding pieces of interconnect line. FIG. 27E shows a portion of CELL_9 which includes connections Z1 through Z10, Z12, and Z13 to 12 horizontal interconnect line segments. Line segments HS1_E through HS10_E are horizontal single length line segments extending horizontally through one cell block and being separated from a corresponding line segment for the next cell block at test structures such as AF1. Line segments HD1_E, HD1, through HD6_E, and HD6 are horizontal double length line segments extending two cell blocks. Line segments HD3_E through HD6E are contacted by line Z2 extending from one of cells CELL_1 through CELL_4. Alternating double-length line segments, for example HD3_E and HD3 are contacted by corresponding Z2 lines in adjacent cell blocks. The lines are laid out to cross over as shown in the region to the right of CELL_9 so that an identical layout of the adjacent cell block contacts alternate lines. Similar contact and layout arrangements apply to other lines. Long lines HLL1 through HLL8, CONST0 and EXTRA extend the full (or half) length of the chip and are contacted only once through a structure which does not repeat like that of FIG. 27.

Vertical interconnect lines are contacted by lines extending through the logic cells, shown in detail in FIGS. 18A and 18B, and correspondingly labeled.

Metal Testing

When a device such as discussed above is being manufactured, it is necessary to test all components of the device for proper operation. For example all transistors must be tested. All antifuses must be tested for non-conductivity in their original state (antifuses can not be tested in their programmed state because the programming is one-time-only and must be left to the user). All metal lines must also be tested, both for continuity throughout their length and for shorts to adjacent metal lines. A simple means for applying test vectors to the metal lines is preferred in order to facilitate testing. Testing transistors in each of the structures such as AF1 shown in FIG. 27E, which can be very small transistors, connect the metal lines into a serpentine structure for testing. When connected into this serpentine structure a single signal applied to one end of the serpentine structure can be picked up at the other end if there is electrical continuity.

Figure 28:
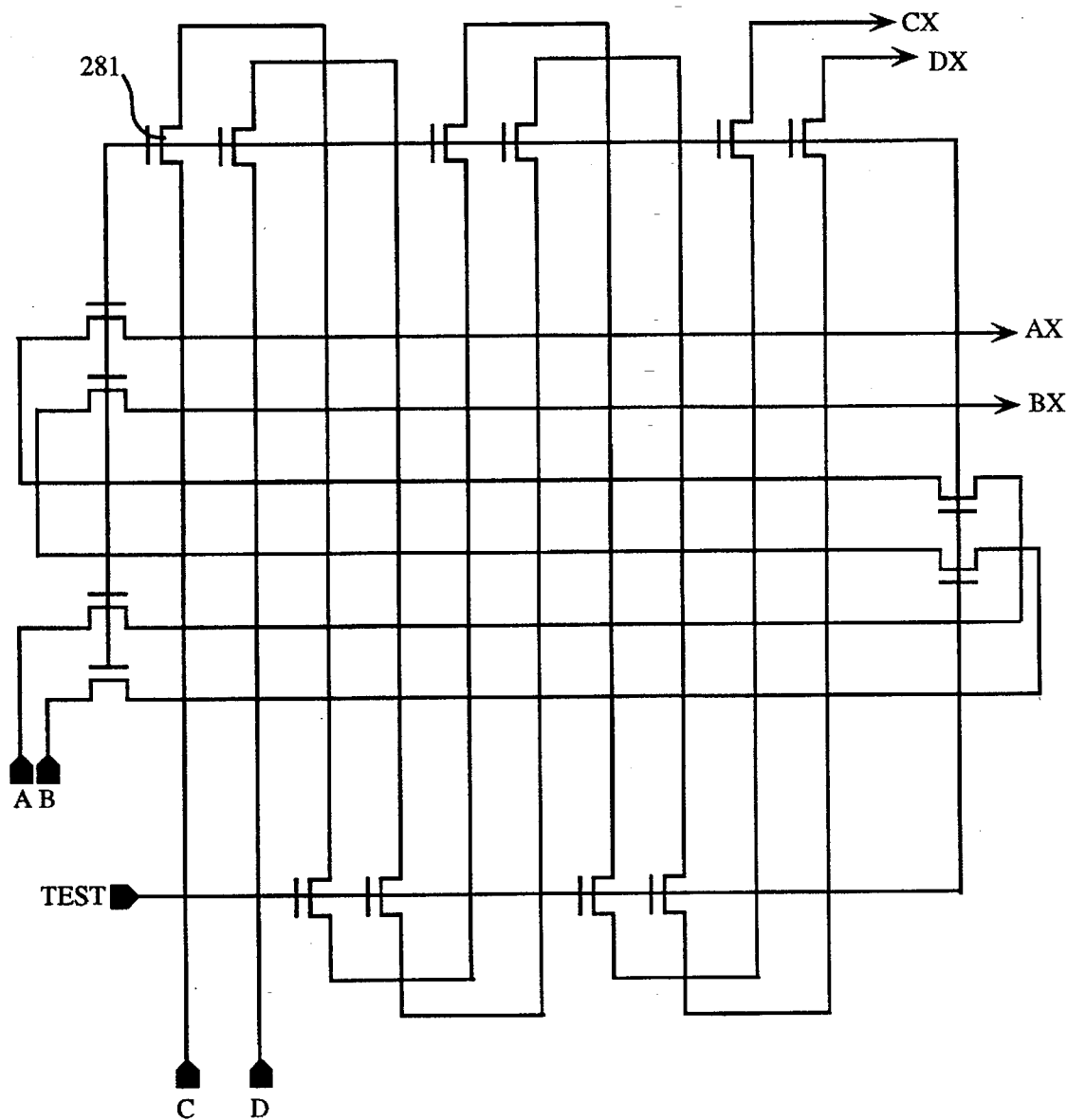
FIG. 28 shows a serpentine interconnect method used with the circuit of FIG. 27 for testing metal lines for both continuity and adjacent wire shorting.

In a preferred embodiment, there are two serpentine structures connected as shown in FIG. 28. Physically adjacent metal lines are connected alternately into two different serpentine chains A and B. By electrically isolating alternate metal lines into two different chains, the structure can be tested both for shorts between adjacent metal lines and for continuity of each metal line. Although this double serpentine test structure has been described in connection with a particular field programmable device having a particular cell structure, the single or double serpentine interconnection method may be used for testing any kind of architecture in which multiple conductive lines must be tested.

Figure 27J:
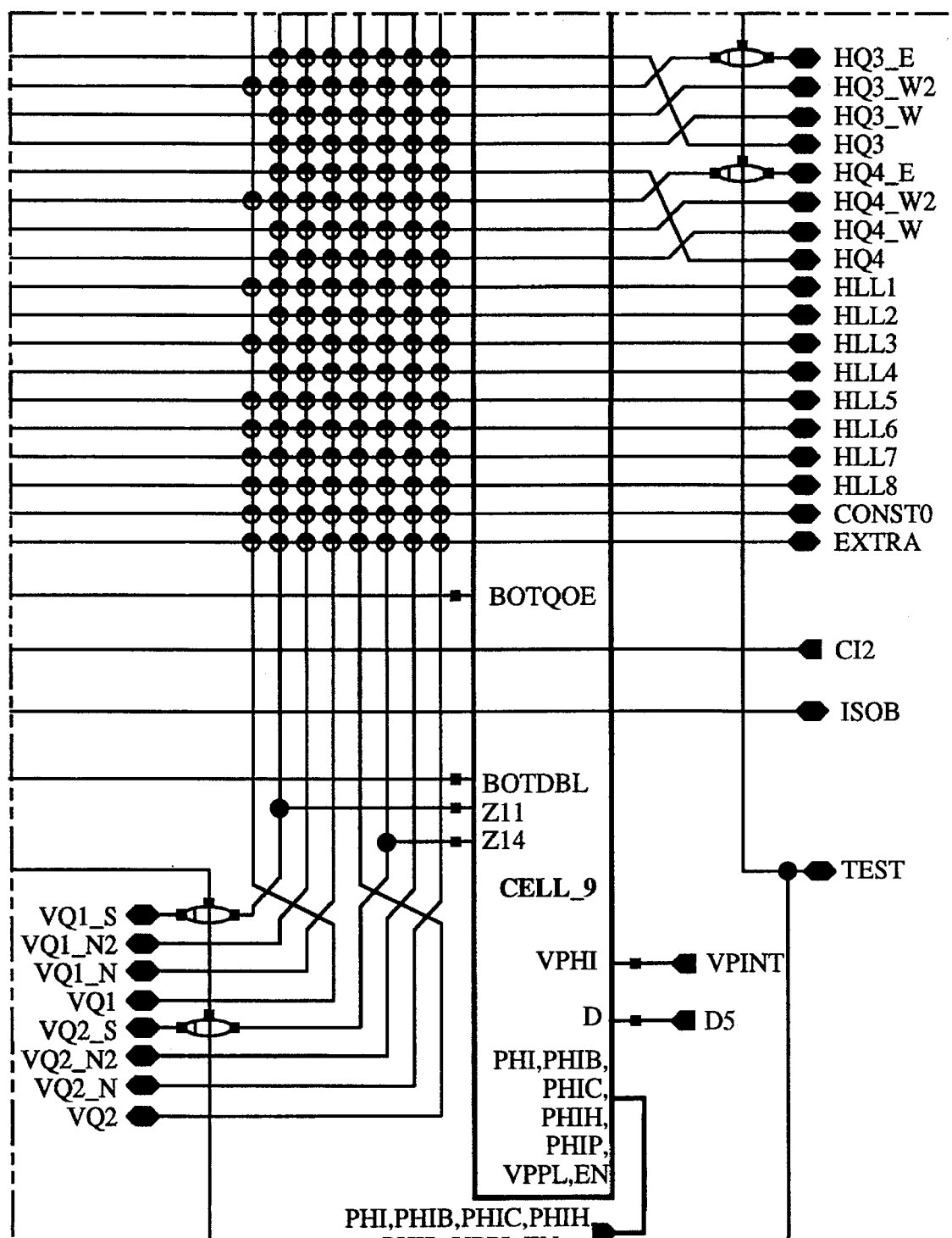

A single control signal, labeled in FIG. 27J as TEST turns on all transistors simultaneously for testing metal continuity.

In parallel with the test transistors are antifuses, which can connect segments for operation of the circuit. Thus the symbol labeled AF1 is actually one antifuse in parallel with one small transistor, the transistor being turned on for testing only during the manufacturing of the device and remaining permanently off, and invisible to a user during programming and use of the device.

Other embodiments of the invention will become obvious to those skilled in the art in light of the above description. These other embodiments are intended to fall within the scope of the present invention.

I claim:

1. A transparent latch comprising:

a data input section which receives a data input signal and a first internal clock signal, and generates a data output signal;

a feedback section which receives a feedback input signal and a second internal clock signal, and generates a feedback output signal;

a first selectively inverting input buffer for receiving an external clock signal and providing one of said external clock signal and the complement of said external clock signal as said first internal clock signal;

a second selectively inverting input buffer for receiving said external clock signal and providing one of said external clock signal and the complement of said external clock signal as said second internal clock signal;

means for causing one of said first and second selectively inverting input buffers to provide said external clock signal and the other of said first and second selectively inverting input buffers to provide the complement of said external clock signal;

a second section which generates an output signal from signals provided by said data input section and said feedback section, said output signal serving as said feedback input signal;

said first and second selectively inverting input buffers having a first trip point, and said data input section and said feedback section comprising logic gates having a second trip point lower than said first trip point.

2. A transparent latch as in claim 1 in which:

said data input section comprises a two-input AND gate, one input receiving said data input signal and the other input receiving said clock signal; and said feedback section comprises a two-input AND gate, one input receiving said feedback input signal and the other receiving said complement of said clock signal.

3. A transparent latch as in claim 2 in which said second section comprises a programmable AND/OR gate programmable to provide one of an AND function and an OR function, said programmable AND/OR gate being programmed to provide said OR function.

* * * * *

UNITED STATES PATENT AND TRADEMARK OFFICE
CERTIFICATE OF CORRECTION

PATENT NO. : 5,646,547
DATED : July 8, 1997
INVENTOR(S) : F. Erich Goetting It is certified that error appears in the above-identified patent and that said Letters Patent is hereby corrected as shown below:

On the Cover Page, In the Notice Section, "Pat. No. 5,219,254" should read --Pat. No. 5,319,254--.

On the Cover Page, Applicant brings to the attention of the Patent Office that the two Foreign Patent Documents listed are in fact the same patent document.

Col. 8, line 37, "$t_0$ through $t_g$" should read --$t_0$ through $t_9$--.

Signed and Sealed this

Nineteenth Day of May, 1998

*Attest:*

BRUCE LEHMAN

*Attesting Officer*     *Commissioner of Patents and Trademarks*